United States Patent

(12) United States Patent
Ogino et al.

(10) Patent No.: US 6,677,089 B2
(45) Date of Patent: Jan. 13, 2004

(54) RECTANGLE/LATTICE DATA CONVERSION METHOD FOR CHARGED PARTICLE BEAM EXPOSURE MASK PATTERN AND CHARGED PARTICLE BEAM EXPOSURE METHOD

(75) Inventors: Kozo Ogino, Kawasaki (JP); Morimi Osawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 52 days.

(21) Appl. No.: 10/120,171

(22) Filed: Apr. 11, 2002

(65) Prior Publication Data

US 2002/0177056 A1 Nov. 28, 2002

(30) Foreign Application Priority Data

Apr. 11, 2001 (JP) ........................................ 2001-112787
May 22, 2001 (JP) ........................................ 2001-153233
Oct. 30, 2001 (JP) ........................................ 2001-333361

(51) Int. Cl.⁷ .............................. G03F 9/00; G03C 5/00
(52) U.S. Cl. .............................. 430/30; 430/5; 430/296; 430/942
(58) Field of Search ............................. 430/5, 30, 296, 430/942

(56) References Cited

FOREIGN PATENT DOCUMENTS

| JP | 25 02418 | * | 5/1996 |
| JP | 11-151330 A | * | 6/1999 |
| JP | 11-329948 A | * | 11/1999 |
| JP | 2001-052999 | * | 2/2001 |

OTHER PUBLICATIONS

Journal of Vacuum Science Technology, vol. B10, No. 6, pp. 3072–3076, 1992.*

* cited by examiner

Primary Examiner—Christopher G. Young
(74) Attorney, Agent, or Firm—Arent Fox Kintner Plotkin & Kahn, PLLC

(57) ABSTRACT (S12) A reference forward scattering intensity $\epsilon_p$ is determined as equal to such a slice level that by adjusting the width of a pattern having the minimum width included in a block pattern repeatedly used and collectively exposed, the slice level that is in the range of 30 to 70% of the peak value of a forward scattering intensity distribution of the pattern becomes equal to the design width of the pattern. (S15) in each pattern in the block pattern a pattern width is adjusted such that the width of a forward scattering intensity distribution at $\epsilon_p$ becomes equal to the design width of the pattern. Further, a collected exposure dose Qcp is determined such that $Qcp(\epsilon_p + \alpha_p'\eta) = Eth$ holds, where Eth is a threshold value for pattern developing, q is a backscattering coefficient and $\alpha_p'$ is an effective pattern area density. In an electron projection method, Eth is determined in $\epsilon_p + \alpha_p'\eta = Eth$, then $\alpha_p'$ is determined, and a pattern width is determined from a function $\epsilon_p$ of a design width and a pattern width.

47 Claims, 53 Drawing Sheets

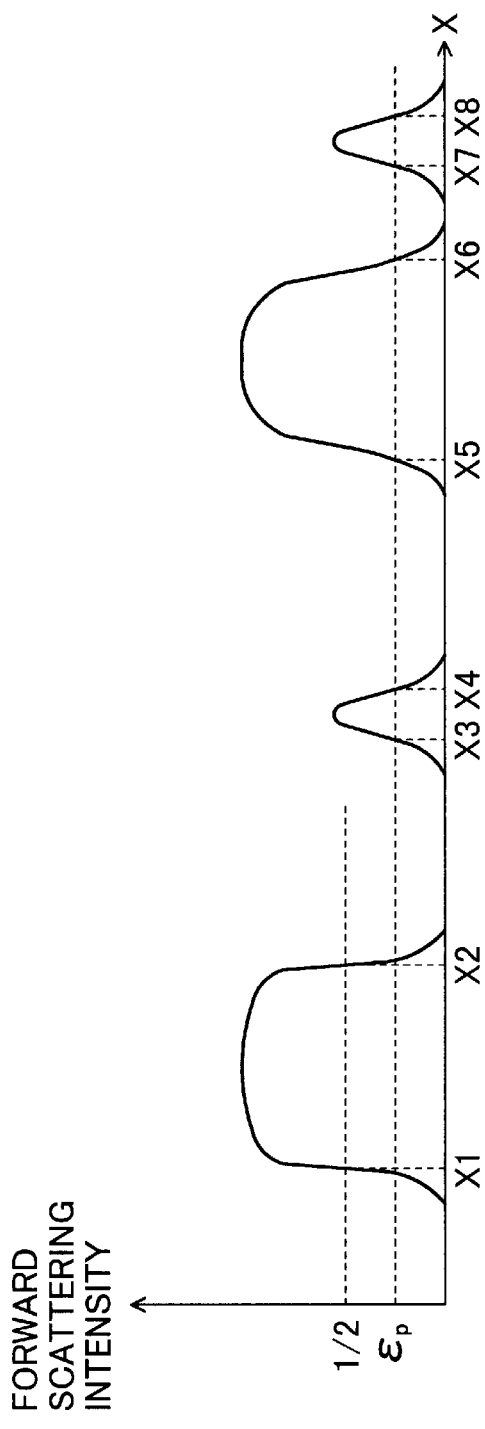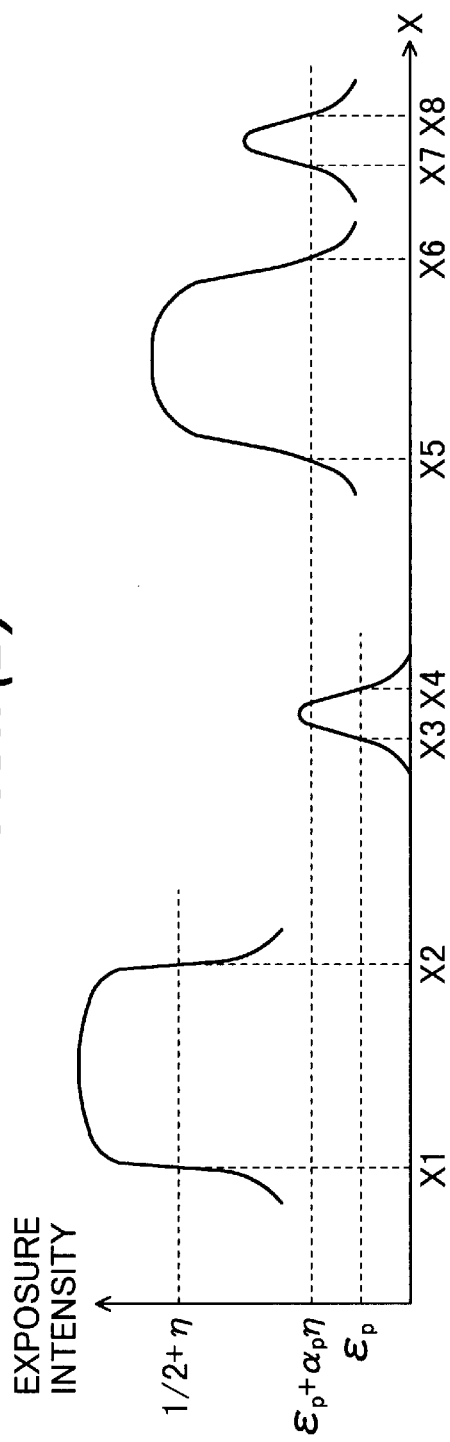

● FIXED SAMPLE POINT

----- BEFORE SIZE SHIFT
—— AFTER SIZE SHIFT

------- BEFORE SIZE SHIFT
——— AFTER SIZE SHIFT

FIG.14
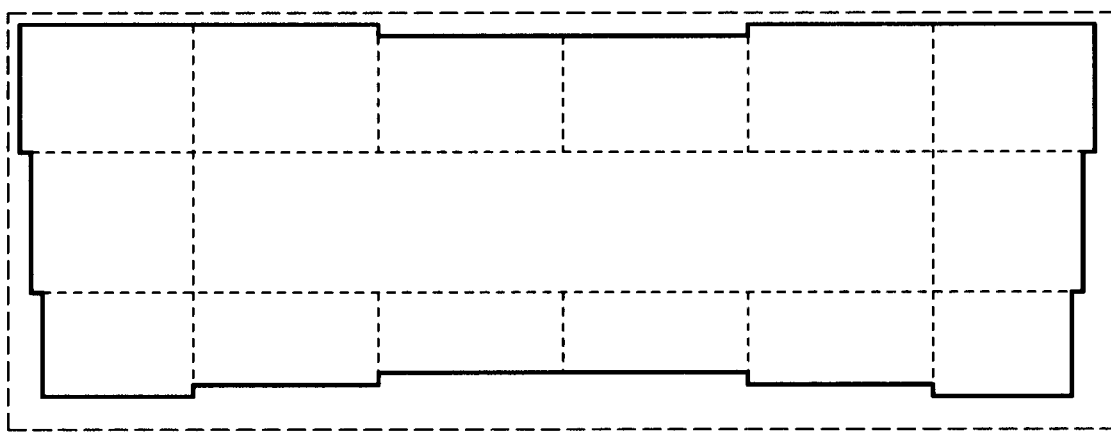
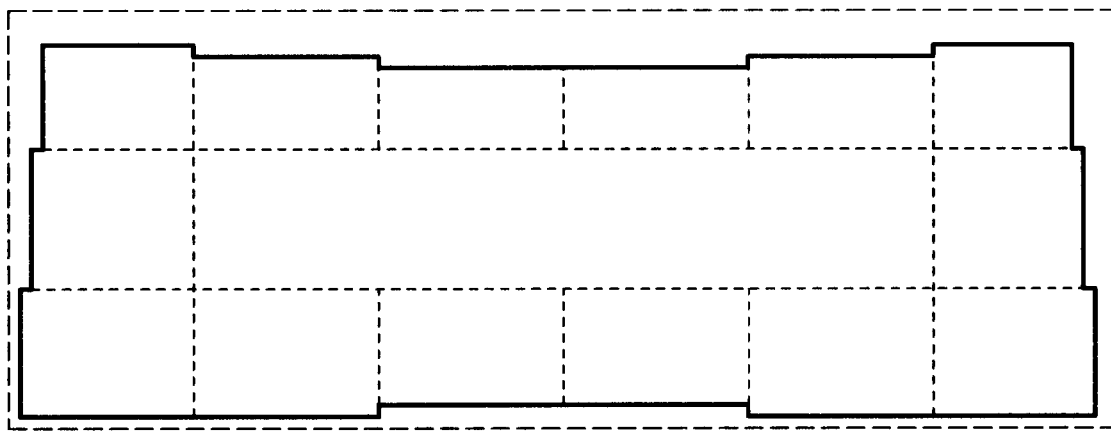

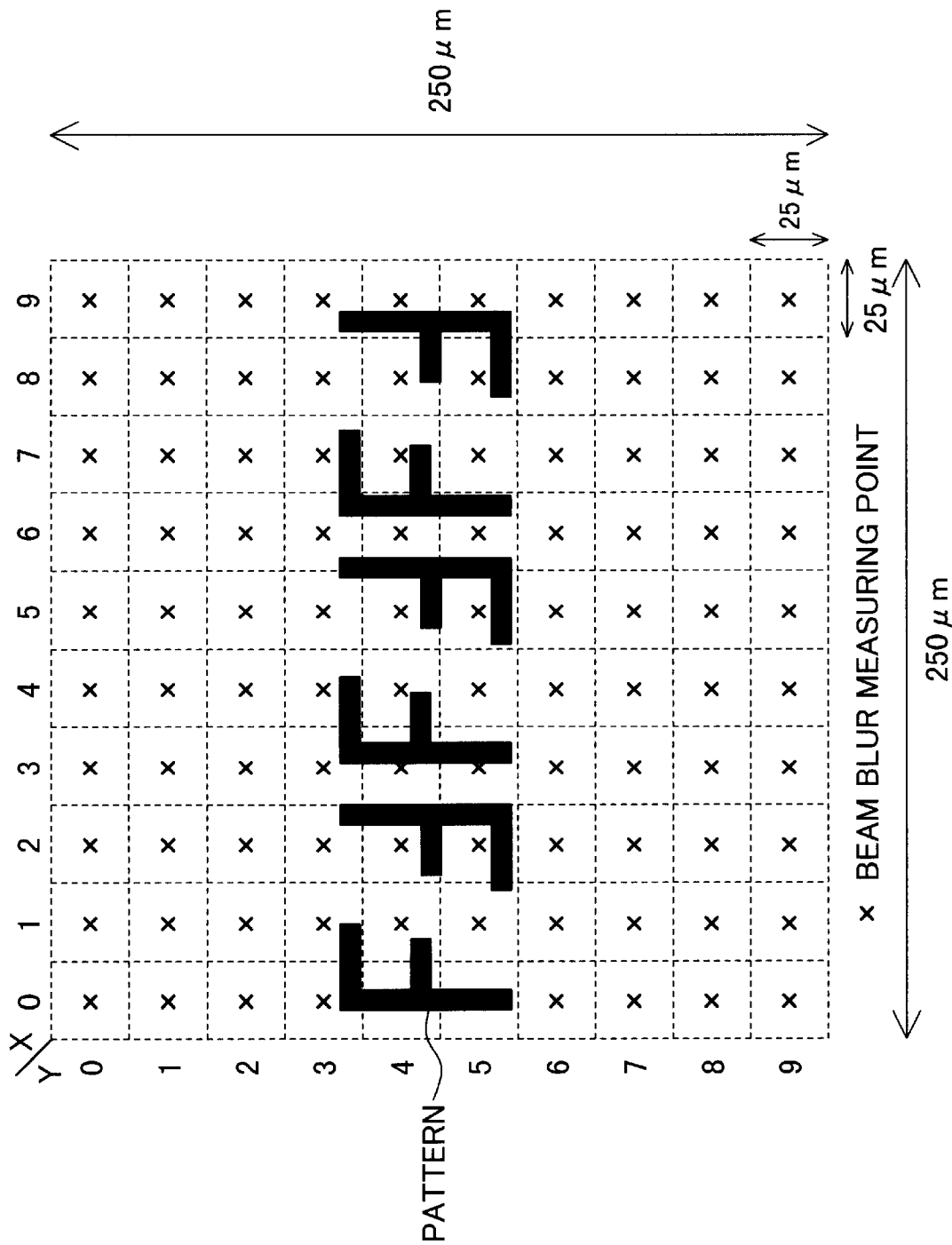

FIG.17

| X\Y | 0 | 1 | 2 | 3 | 4 | 5 | 6 | 7 | 8 | 9 |
|---|---|---|---|---|---|---|---|---|---|---|
| 0 | 40 | 42 | 40 | 38 | 37 | 37 | 37 | 39 | 40 | 41 |
| 1 | 36 | 35 | 35 | 38 | 35 | 35 | 37 | 38 | 38 | 40 |
| 2 | 34 | 31 | 33 | 36 | 30 | 33 | 36 | 37 | 36 | 38 |
| 3 | 32 | 31 | 33 | 33 | 30 | 31 | 30 | 34 | 36 | 36 |
| 4 | 32 | 32 | 32 | 31 | 28 | 29 | 30 | 34 | 33 | 30 |
| 5 | 32 | 32 | 33 | 30 | 27 | 27 | 28 | 30 | 33 | 28 |
| 6 | 32 | 33 | 34 | 31 | 28 | 27 | 29 | 30 | 35 | 28 |
| 7 | 35 | 36 | 35 | 33 | 29 | 28 | 29 | 34 | 35 | 30 |
| 8 | 38 | 39 | 35 | 34 | 34 | 29 | 30 | 35 | 35 | 33 |
| 9 | 41 | 40 | 39 | 36 | 33 | 33 | 32 | 36 | 36 | 35 |

[$\mu$m]

MAIN EXPOSURE DATA

AUXILIARY EXPOSURE DATA

FIG.20
AUXILIARY EXPOSURE MASK DATA
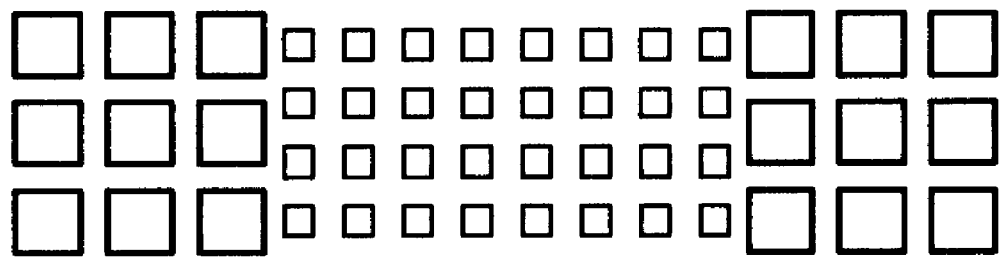
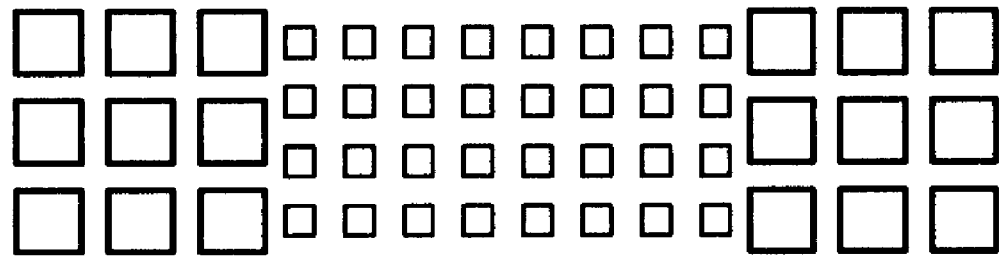

SIZE SHIFT REGION

······ ELECTRON BEAM IRRADIATION REGION
---- BEFORE SIZE SHIFT
—— AFTER SIZE SHIFT

- - - - - ELECTRON BEAM IRRADIATION REGION
- - - - BEFORE SIZE SHIFT
——— AFTER SIZE SHIFT

RECTANGLE/LATTICE DATA CONVERSION METHOD FOR CHARGED PARTICLE BEAM EXPOSURE MASK PATTERN AND CHARGED PARTICLE BEAM EXPOSURE METHOD

BACKGROUND OF THE INVENTION

1. Field of the Invention

The present invention relates generally to a charged particle beam exposure method, more particularly, to a charged particle beam exposure method performing a proximity effect correction in preparation of exposure data for a charged particle beam exposure apparatus in order to improve size accuracy of a transferred pattern, and a method for converting a rectangular pattern data of a charged particle beam exposure mask pattern to a lattice pattern data thereof in order to reduce an exposure dose for a relatively large pattern and a charged particle beam exposure method using the conversion method.

2. Description of the Related Art

In a case where a resist film on a substrate is irradiated with a charged particle beam, for example an electron beam, to draw a circuit pattern thereon, an electron beam incident on the resist film is partly scattered forward and the electron beam transmitted through the resist film is partly scattered backward to again impinge on the resist film. For this reason, even if an electron beam impinges at one point on the resist film, an influence thereof spreads around, causing a so-called proximity effect.

An energy intensity distribution (EID) function $f(X, Y)$ on a resist film when an electron beam impinges at a point of $X=0$ and $Y=0$ on the resist film is expressed by the following equation in which a forward scattering term and a backscattering term approximate respective Gaussian functions:

$$f(X, Y) = \frac{1}{\pi(1+\eta)} \left\{ \frac{1}{\beta_f^2} \exp\left(-\frac{X^2 + Y^2}{\beta_f^2}\right) + \frac{\eta}{\beta_b^2} \exp\left(-\frac{X^2 + Y^2}{\beta_b^2}\right) \right\} \quad (1)$$

wherein $\eta$ denotes a backscattering coefficient, $\beta_f$ denotes a forward scattering radius and $\beta_b$ denotes a backscattering radius. The values are dependent on energy of an electron beam, a thickness of a resist film, material of a substrate and others, each being determined by an experiment. With increase in acceleration voltage of the electron beam, $\beta_f$ decreases and $\beta_b$ increases.

In a prior art proximity effect correction method, fixed sample points were set at the middle points of sides or corners of each pattern to be exposed and an exposure intensity at each of the fixed sample points when pattern was exposed was calculated using the equation (1) and an exposure dose was determined such that the sum of the squares of differences each between an exposure intensity and a corresponding target value over all the fixed sample points is minimized.

However, in company with a progress in integration to a high degree of LSI, a rapid increase has occurred in the number of patterns, resulting in an excessively extended calculation time.

Hence, there has been a desire for a proximity effect correction method capable of reducing the calculation time and confining size error of a developed pattern (transferred pattern) within an allowable range.

As one of such methods, there has been disclosed a method in, for example, JP No. 2502418 and Journal of Vacuum Science Technology, Vol. B10, No. 6, pp. 3072–3076, 1992; in which method a layout plane of an LSI exposure pattern is divided into squares in mesh and a pattern area density is calculated for each of the squares to thereby obtain an approximate value of a scattering exposure intensity of a square of interest in consideration of influences of peripheral squares on the square of interest on the basis of the backscattering term of the equation (1). In this method, an exposure dose is determined such that the sum of the half value of a peak of a forward scattering intensity and a backscattering intensity is constant.

According to the method, using a simple and easy-to-use algorithm, it is possible to prevent a global variation in size of a transferred pattern caused by an influence of backscattering.

However, since no consideration is given to a spread of absorbed energy distribution due to forward scattering, it is not guaranteed that a size of a transferred pattern is equal to a design width. That is, as pattern elements become finer, a spread of an absorbed energy distribution at a half value intensity cannot be neglected, thereby making a size of a transferred pattern larger than a design width due to forward scattering.

Therefore, a proximity effect correction method as described below is proposed in JP 11-151330 A.

(A) A pattern width is adjusted such that a half-width of a forward scattering intensity distribution, determined by surface integration of the forward scattering term of the energy intensity distribution function over a pattern of interest, is equal to a design width and a forward scattering intensity $\epsilon_p$ giving the half-width is determined as a reference forward scattering intensity;

(B) an exposure intensity $\alpha_p \cdot \eta$ due to the backscattering term of the energy intensity distribution function is determined using a pattern area density map method; and (C) a corrected exposure dose Qcp is determined such that Qcp times $(\epsilon_p + \alpha_p \cdot \eta)$ is equal to a threshold value Eth of pattern developing.

For example, when, as shown by dotted lines in FIG. 51(A), design widths in the X direction of a large width pattern and a small width pattern are (X2–X1) and (X4–X3), respectively, the pattern widths are narrowed as shown by solid lines in FIG. 51(A) in the processing of the above step (A). The large width pattern has $\epsilon_p = \frac{1}{2}$ and $\alpha_p = 1$ and a pattern having such values is referred to as a reference pattern. If corrected exposure doses Qcp of the large width pattern and the small width pattern are expressed by $Q_1$ and $Q_2$, respectively, the following equation holds in the step (C):

$$(\frac{1}{2}+\eta)Q_1 = (\epsilon_p + \alpha_p \cdot \eta)Q_2$$

where $Q_1 > Q_2$.

When the rectangular regions 13 and 14 shown by dotted lines, surrounding the rectangular transmission holes 11 and 12 shown by solid lines on the mask 10, are irradiated with an electron beam at respective exposure doses $Q_1$ and $Q_2$, an exposure intensity distribution on a wafer coated with a photoresist is determined as shown in FIG. 51(B).

According to this method, since a slant at the threshold value Eth of an exposure intensity distribution of each of the patterns is sharp, a variation in pattern width relative to a variation in exposure condition decreases, enabling to achieve a high accuracy pattern. Further, a corrected exposure dose can be determined in relatively short time. However, since the above method obtains a corrected exposure dose Qcp for each pattern, it cannot be applied in a case where a block exposure pattern in a small region of, for example, 4.5×4.5 $\mu m^2$ on a stencil mask is selected to collectively expose.

Therefore, in JP 12-166465 A, the minimum value of corrected exposure doses for respective patterns in a block exposure pattern is determined as a corrected exposure dose Qcp for the block exposure pattern, and then auxiliary exposure is applied to exposure intensity-short regions in the block.

For example, when the rectangular transmission holes 11 and 12 of FIG. 51(A) are irradiated with an electron beam at an exposure dose $Q_1$, covering a rectangular region 15 shown by a dotted line in FIG. 52(A), an exposure intensity distribution on a wafer coated with a photoresist is determined as shown in FIG. 52(B). In this state, the narrow line pattern cannot be developed due to shortage of exposure. Then, a rectangular transmission hole not shown for auxiliary exposure (ghost exposure) is irradiated with an electron beam to determine an exposure intensity distribution shown by an alternate long and short dash line in FIG. 53, thereby enabling developing of the narrow line pattern having a width (X4–X3).

As is apparent by comparison of FIG. 53 with FIG. 51(B), however, since a slant of an exposure intensity distribution at a pattern edge of a narrow line pattern is gentle, a variation in width of a transferred pattern image relative to a variation in exposure condition increases, causing reduction in pattern accuracy.

Further, since in the above method it is fundamental to calculate a corrected exposure dose for each pattern and, for example, the above problem arises even in block exposure of 4.5×4.5 $\mu m^2$, the method cannot be applied to an electron projection lithography (EPL) in which a large region of, for example, 250×250 $\mu m^2$ on a wafer is collectively exposed.

In a case of an individual pattern exposure, a deviation between a design size and a completion size caused by the proximity effect can be corrected by optimizing a pattern size on a mask and an exposure dose in each design pattern. In a case where many patterns are collectively exposed, however, no optimization of an exposure dose in each pattern can be performed. Further, in a case where a correction for a proximity effect is performed by alteration in pattern size on a mask without altering an exposure dose, there was a problem that the correction is less effective and insufficient for a large pattern with a higher backscattering intensity.

Therefore, as for a large pattern, a method has been proposed that a pattern is converted to a lattice pattern to thereby reduce an effective exposure dose (JP Publication No. 11-329948-A).

However, this method employing the lattice pattern causes shortage of exposure, in result of forming an exposure-short region in an irregular shape on a resist pattern. This problem can be avoided by reducing a pattern subshape width and increasing the number thereof at the same pattern area density, but there arises a problem that as the pattern subshape width is smaller, size accuracy of a mask pattern is deteriorated.

Further, in a case where a lattice pattern is divided into two mask patterns complementary to each other, when one of the masks is switched to the other in exposure operation, relative shift in position occurs to thereby increase a distance between pattern subshapes, with the result that an irregular shape of an exposure-short region occurs.

SUMMARY OF THE INVENTION

Accordingly, it is an object of the present invention to provide a charged particle beam exposure method using a proximity effect correction method capable of, with a simple construction, reducing a variation in size of a transferred pattern obtained by small region collective exposure.

It is another object of the present invention to provide a charged particle beam exposure method using a proximity effect correction method capable of, with a simple construction, reducing a variation in size of a transferred pattern to a lower level even in a case where a large region is collectively exposed by a charged particle projection method.

It is another object of the present invention to provide a rectangle/lattice data conversion method for a charged particle beam exposure mask pattern capable of securing size accuracy of a mask pattern without generating an exposure-short region and a charged particle beam exposure method using the same conversion method.

It is still another object of the present invention to provide a rectangle/lattice data conversion method for a charged particle beam exposure mask pattern capable of avoiding generation of an exposure-short region even if a relative shift in position occurs when one of the masks complementary to each other is switched to the other and a charged particle beam exposure method using the conversion method.

In another aspect of the present invention, there is provided a charged particle beam exposure method with performing proximity effect correction by adjusting widths of patterns included in a block pattern, formed on a mask, for being repeatedly used and for collectively exposing, and by calculating a corrected exposure dose, the method comprising the steps of:

(a) determining a reference forward scattering intensity on the basis of a forward scattering intensity distribution of a pattern having a minimum design width included in the block pattern;

(b) adjusting each pattern width in the block pattern such that a width of a forward scattering intensity distribution at the reference forward scattering intensity becomes equal to a corresponding design width; and (c) determining the corrected exposure dose such that, in regard to each pattern in the block pattern, a value obtained by multiplying a sum of the reference forward scattering intensity and a backscattering intensity by the corrected exposure dose becomes substantially equal to each other.

With this configuration, since the reference forward scattering intensity is determined on the basis of the forward scattering intensity distribution of the pattern having the minimum width included in the block pattern, a slant at a threshold value Eth of an exposure intensity distribution of a small width pattern can be sharp to thereby decrease a variation in width of a transferred pattern image relative to a variation in exposure condition, enabling to achieve a small width pattern with high accuracy. As for a large width pattern, although a slant of the forward scattering intensity distribution at an exposure intensity giving a design width is gentler than in a case where a reference forward scattering intensity is determined on the basis of the forward scattering intensity distribution, reduction in size accuracy is small because of having a large width. Therefore, relative size accuracy of a transferred pattern image is improved as a whole in comparison with the prior art.

Further, an algorithm for proximity effect correction is relatively simple.

In the step (a), for example, the reference forward scattering intensity is determined as equal to such a slice level that, in regard to the pattern having the minimum design width, by adjusting a width of the forward scattering intensity distribution at the slice level that is a predetermined percentage with respect to a peak value of the forward scattering intensity distribution, for example, a value in the range of 30 to 70%, becomes equal to a design width of the pattern.

Since a margin for a variation in size is small due to an influence of overlapping of exposure intensity distributions of adjacent patterns when the predetermined percentage is lower than 30% and due to a gentle slant of a forward scattering intensity distribution at the positions of the slice level when the predetermined percentage is higher than 70%, the effect of the present invention can be attained when the predetermined percentage is in the range of 30 to 70%.

In the step (c), for example, the corrected exposure dose Qcp is determined such that $Qcp(\epsilon_p+\alpha_p \cdot \eta)=Eth$ holds, where $\epsilon_p$ is the reference forward scattering intensity, Eth is a threshold value for pattern developing, $\eta$ is a backscattering coefficient, and $\alpha_p$ is an effective pattern area density.

The step (b) comprises, for example, the steps of:
setting fixed sample points each being at a middle point on each side of each pattern in the block pattern; and
in regard to each of the fixed sample points, to adjust the pattern width, shifting a side corresponding to the fixed sample point in a direction perpendicular thereto such that an intensity of the forward scattering intensity distribution at the fixed sample point becomes equal to the reference forward scattering intensity.

As the width of a pattern becomes finer, a distance between patterns becomes shorter and when the distance becomes the order of an effective forward scattering radius $\beta_f'$, there arise influences of forward scattering from patterns in the neighborhood. However, the influences are taken into consideration for each of sides according to the above construction, enabling improvement on accuracy in a transferred pattern image.

The step (b) comprises, for example, the steps of:
dividing at least one pattern in the block pattern into plurality of rectangles;
setting fixed sample points each being at a middle point on a side, which is in contact with a boundary of the at least one pattern, of ones of the rectangles; and
in regard to each of the fixed sample points, to adjust the pattern width, shifting a side corresponding to the fixed sample point in a direction perpendicular thereto such that an intensity of the forward scattering intensity distribution at the fixed sample point becomes equal to the reference forward scattering intensity.

With this configuration, since the divided rectangles are each regarded as design patterns and each divided pattern width is adjusted, improvement is achieved on size accuracy of a transferred pattern.

In another aspect of the present invention, there is provided a charged particle beam exposure method with performing proximity effect correction by adjusting widths of a plurality of patterns of a mask for collectively exposing by a charged particle projection method, the method comprising the steps of:
(a) selecting a representative pattern from the plurality of patterns to determine a reference exposure intensity Eth on the basis of the representative pattern;
(b) determining a backscattering intensity distribution $F_b$ of the plurality of patterns;
(c) adjusting a pattern width W of each pattern such that a width of a forward scattering intensity distribution at a slice level $(Eth-F_b)$ becomes equal to a design width W0i; and
(d) in regard to a region where a shortage of exposure intensity arises, determining an auxiliary exposure dose for supplementing the shortage.

With this configuration, by using a pattern whose accuracy is desired to improve as the representative pattern, size accuracy of a transferred pattern as a whole can be improved in comparison with the prior art.

In the step (a), for example, an isolated rectangular pattern having a minimum design width W0 is selected as the representative pattern, and by adjusting a slice level of a forward scattering intensity distribution of the representative pattern such that a width of the distribution at the slice level becomes a design width W0, the slice level is determined as the reference exposure intensity Eth.

Since the isolated pattern receives no influence of backscattering, a relation of the slice level=the reference exposure intensity (a threshold value for developing) is not affected by processing of the steps (b) to (d). Especially, if the isolated pattern has the minimum width, a variation in width of a transferred pattern image for a small width pattern decreases in comparison with a variation in exposure condition for the same, thereby enabling to improve size accuracy of the transferred pattern image as a whole.

In still another aspect of the present invention, there is provided a charged particle beam exposure method in which plurality of patterns are collectively exposed by a charged particle projection method, comprising the steps of:
(a) irradiating a main exposure mask on which the plurality of patterns are formed with a charged particle beam to collectively expose a sensitive substrate; and
(b) irradiating an auxiliary exposure mask on which a pattern for performing auxiliary exposure in a region falling short of exposure intensity after the collective exposure is formed with a charged particle beam to collectively expose the sensitive substrate.

Since a large region can be collectively subjected to auxiliary exposure similarly to the main exposure mask, a throughput in exposure process increases.

According to another aspect of the present invention, there is provided with a rectangle/lattice data conversion method for a charged particle beam exposure mask pattern that, when a rectangular pattern or a rectangle of part thereof is actually or imaginarily formed as a first rectangular pattern on a sensitive substrate by charged particle beam exposure, converts a second rectangular pattern on a mask corresponding to said first rectangular pattern to a lattice pattern including plural pattern subshapes in order to reduce an exposure dose, wherein if a width of a pattern subshape is W, a space width between pattern subshapes is S, an area density of a lattice pattern is $\alpha_p$, the minimum value of a forward scattering intensity in the first rectangular pattern is $F_f min \times \alpha_p$, and a position assuming the minimum value is P, the method comprises the steps of:
(a) obtaining a function D(W, S) representing said area density $\alpha_p$ on the basis of a geometric relation of said lattice pattern, and obtaining a function E(P: W, S) representing a forward scattering intensity at said position P by surface-integration of a forward scattering term of an energy intensity distribution function, and
(b) obtaining said pattern subshape width W and said space width S satisfying relations $D(W, S)=\alpha_p$ and $E(P: W, S)=F_f min \times \alpha_p$, given both of an area density $\alpha_p$ and a forward scattering intensity reduction ratio $F_f min$.

With this configuration, in a case where obtained values of pattern subshape width W and space width S are larger than respective allowable lower limits, size accuracy of a mask pattern can be secured without generating an exposure-short region. Further, calculation formulae for a pattern subshape width W and a space width S are given, and therefore in a case where values of an obtained pattern subshape width W and an obtained space width S are smaller than respective allowable lower limits, size accuracy of a mask pattern can be secured without generating an exposure-short region by altering shapes of pattern subshapes of a lattice pattern such that values of a to-be-obtained pattern subshape width W and a to-be-obtained space width S are larger than the respective allowable lower limits.

Further, according to another aspect of the present invention, there is provided with a rectangular pattern or a rectangle of part thereof is actually or imaginarily formed as a first rectangular pattern on a sensitive substrate by charged particle beam exposure, converts a second rectangular pattern on a mask corresponding to said first rectangular patter to a lattice pattern including plural pattern subshapes in order to reduce an exposure dose, wherein if a width of a pattern subshape is W, a space width between pattern subshapes is S, an area density of said lattice pattern is $\alpha_p$, the minimum value of a forward scattering intensity in said first rectangular pattern is $F_f\min\times\alpha_p$, and a position assuming the minimum value is P, the method comprises the steps of:

(a) obtaining a function D(W, S) representing said area density $\alpha_p$ on the basis of a geometric relation of said lattice pattern, and obtaining a function E(P: W, S) representing a forward scattering intensity at said position P by surface-integration of a forward scattering term of an energy intensity distribution function, and (b) determining values of said pattern subshape width W and said space width S on the basis of said function $D(W, S)=\alpha_p$, and values of said pattern subshape width W and said space width S or a value of a relation formula of S and W, given all of an area density $\alpha_p$, an allowable lower limit $F_f\min$ of a forward scattering intensity reduction ratio $F_f\min$, a common allowable lower limit value Lmin of both said pattern subshape width W and said space width S, and the values of said pattern subshape width W and said space width S or the value of the relation formula of S and W, and (c) adopting the values of said pattern subshape width W and said space width S as parameters to determine said lattice pattern in a case where a condition is satisfied that W≧Lmin, S ≧Lmin and $E(P: W, S)=F_f\min\times\alpha_p$.

With this configuration, the pattern subshape width W and the space width S can be determined by simpler calculation as well as the above-mentioned advantage is obtained.

According to another aspect of the present invention, there is provided with a rectangle/lattice data conversion method for a charged particle beam exposure mask pattern that, when a rectangular pattern or a rectangle of part thereof is actually or imaginarily formed as a first rectangular pattern on a sensitive substrate by charged particle beam exposure, converts a second rectangular pattern on a mask corresponding to said first rectangular pattern to a first lattice pattern in order to reduce an exposure dose, comprising the steps of:

(a) dividing said second rectangular pattern into plural rectangular regions;

(b) grouping said plural rectangular regions such that adjacent rectangular regions are included into first and second complementary patterns, respectively, complementary to each other in order to form said first lattice pattern using two masks complementary to each other;

(c) converting each of said plural rectangular regions to a second lattice pattern; and (d) performing a boundary processing on each of said second lattice patterns such that at least one side of each peripheral subshape thereof is in contact with a side of a rectangular region corresponding to each of the second lattice patterns.

With this configuration, since a boundary processing is performed on a lattice pattern in each of rectangular regions, pattern subshapes are connected on both sides of a parting line, whereby even if a relative shift in position occurs when masks complementary to each other are interchanged therebetween in exposure operation, shortage of exposure due to increase in space width can be avoided.

Other aspects, objects, and the advantages of the present invention will become apparent from the following detailed description taken in connection with the accompanying drawings.

BRIEF DESCRIPTION OF THE DRAWINGS

FIG. 7(A) is a schematic diagram showing a relationship between a forward scattering intensity distribution and a design width corresponding to the pattern of FIG. 6 and FIG. 7(B) is a schematic diagram showing a relationship between an exposure intensity distribution obtained by adding a backscattering intensity to the forward scattering intensity and a design width;

FIG. 14 is an illustration showing shifts of peripheral sides of two design patterns adjacent to each other indicated with dashed lines in step S44 of FIG. 12, after having been divided in step S42 of FIG. 12;

FIG. 16 is simplified descriptive representation showing a transferred pattern and beam blur measuring points in an electron beam collective irradiation region;

FIG. 17 is a table showing beam blur measured values corresponding to the respective beam blur measuring points of FIG. 16;

FIG. 20 is an illustration showing auxiliary exposure mask data obtained by replacing the auxiliary exposure data of FIG. 19(B) with a pattern of an area density equivalent to an exposure dose of an auxiliary exposure shot as an image;

FIG. 51(A) is a view showing a design pattern, a pattern shifted due to a proximity effect correction and an electron beam irradiation region of part of a mask, and FIG. 51(B) is a schematic diagram showing a corrected exposure intensity distribution corresponding to the pattern of FIG. 51(A);

FIG. 52(A) is a view showing a design pattern, a pattern shifted due to a proximity effect correction and an electron beam irradiation region of part of a mask, and FIG. 52(B) is a schematic diagram showing a corrected exposure intensity distribution corresponding to the pattern of FIG. 52(A)

DESCRIPTION OF THE PREFERRED EMBODIMENTS

Figure 1:
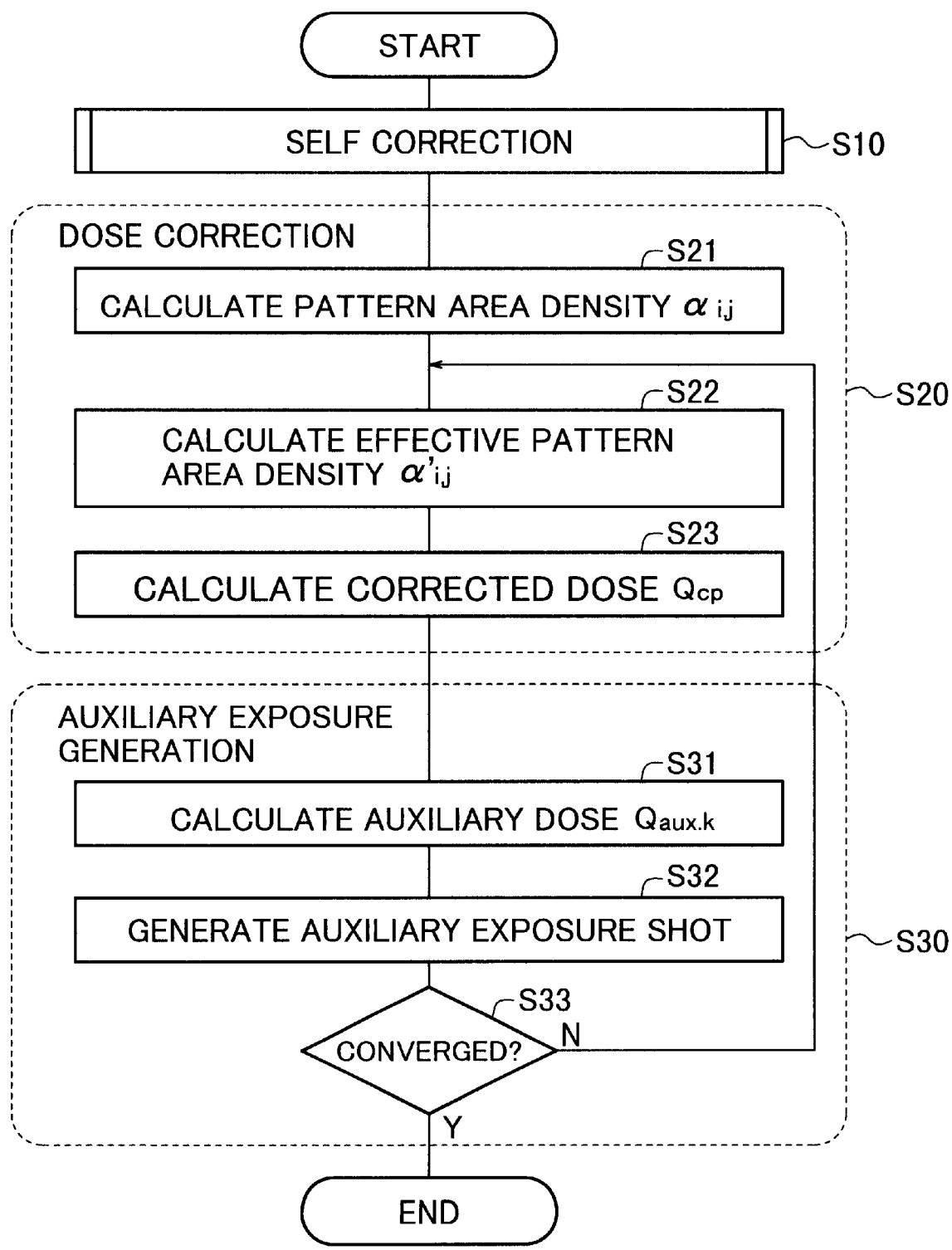
FIG. 1 is a general flow chart showing a procedure of a proximity effect correction method of a first embodiment of the present invention.

Referring now to the drawings, wherein like reference characters designate like or corresponding parts throughout several views, preferred embodiments of the present invention are described below.

First, description will be given of a known energy intensity distribution function in consideration of an electron beam blur δ caused by Coulomb's effect and so on.

The energy intensity distribution function f (X, Y) of the above equation (1) is obtained when an electron beam impinges at one point, but the electron beam incident on a surface actually has an area on the surface. In an electron beam exposure apparatus, an electron beam emitted from an electron gun is focused to the crossover at some point in a path to an exposure object, and electrons in the beam receive a repulsive force from each other at the crossover to spread a beam section (Coulomb's effect). Further, the electron beam also broadens by an aberration according to an energy distribution of the electron beam. A current density distribution at an incident point of the electron beam considering the spread approximates a Gaussian function S (X, Y), where the exponent is expressed by $-(X^2+Y^2)/\delta^2$. Further, the blur can approximate as follows using an electron beam current $I_b$ and constants a and b $$\delta = aI_b + b.$$

For instance, $\alpha=0.03$ μm/A and $\beta=0.05$ μm. The electron beam current $I_b$ is expressed as a product of a current density J of an electron beam incident on a mask and an aperture area S (an aperture area of a selected block exposure pattern or a variable rectangle) of an electron beam irradiation section on the mask, and therefore the formula is expressed as $$\delta = aJS + b. \qquad (2)'$$

Since a current density J is usually constant, a blur δ can be obtained with ease from the aperture area S. An energy intensity distribution function F (X, Y) in consideration of the beam blur δ is expressed by the following equation (3).

$$F(X, Y) = \int_{-\infty}^{\infty} S(X', Y')f(X - X', Y - Y')dX'dY' \qquad (3)$$

$$= \frac{1}{\pi(1+\eta)} \left\{ \frac{\eta}{\beta_f^2 + \delta^2} \exp\left(-\frac{X^2 + Y^2}{\beta_f^2 + \delta^2}\right) + \frac{\eta}{\beta_b^2 + \delta^2} \exp\left(-\frac{X^2 + Y^2}{\beta_b^2 + \delta^2}\right) \right\}$$

By using the following relations:
effective forward scattering radius $\beta_f'=(\beta_f^2+\delta^2)^{1/2}$ and
effective backscattering radius $\beta_b'=(\beta_b^2+\delta^2)^{1/2}$,
the equation (3) becomes the same equation as an equation obtained by substituting $\beta_f'$ and $\beta_b'$ for $\beta_f$ and $\beta_b$, respectively, in the equation (1).

Further, since, for example, $67 <0.1$ μm when $\beta_b=11.43$ μm and $I_b<1.5$ mA, a relation $\beta_b'=\beta_b$ is regarded to be established.

From the above circumstances, the above equation (3) is expressed by the following equation (4).

$$F(X, Y) = \frac{1}{\pi(1+\eta)} \left\{ \frac{1}{\beta_f'^2} \exp\left(-\frac{X^2 + Y^2}{\beta_f'^2}\right) + \frac{\eta}{\beta_b^2} \exp\left(-\frac{X^2 + Y^2}{\beta_b^2}\right) \right\} \qquad (4)$$

To sum up, in order to take into consideration a Coulomb's effect and so on in a proximity effect correction calculation, it is only required that an effective scattering coefficient $\beta_f'$ depending on the aperture area S is calculated in each shot and the calculated result is adopted.

In a case where, as described above, for example, $\beta_f=0.028$ μm, $d<0.1$ μm and $\beta_b'$ is shorter than a distance between patterns, when only an influence of forward scattering is considered, it is only required to pay attention to a pattern of interest, and influences of patterns around the pattern of interest can be neglected. For simplification, an effective scattering coefficient is hereinafter expressed as $\beta_f$.

In the following embodiments, adjustment in mask pattern width can be regarded as an alteration in design width, but since the design width is used for repeated adjustment in pattern width and the design width is also proportional to (in calculation, a proportional coefficient is 1) the width of a pattern image as a target, the design width is considered not to be altered though a pattern width is adjusted. The design width is also an initial value of a pattern width.

First Embodiment

Then, description will be given of an electron beam exposure method using a proximity effect correction method of the first embodiment of the present invention.

The proximity effect correction is a processing for exposure data and is performed by adjusting the width of a pattern formed on a mask including a block pattern, which is repeatedly used under collective exposure, and then calculating a corrected exposure dose. The pattern data on the mask, included in the exposure data, includes: positions of patterns, a design size, information on whether or not a pattern belongs to a block pattern, a size of the block pattern and others.

FIG. 1 is a general flow chart showing a procedure of the proximity effect correction method.

The method includes three major steps: step S10 of performing a self correction (pattern width adjustment) considering only a forward scattering term (including an influence of a Coulomb's effect and others associated with a beam blur) and also only a pattern of interest; step S20 of correcting an exposure dose taking into consideration the forward scattering term and a backscattering term; and step S30 of obtaining not only the minimum value of corrected exposure doses for plural patterns in a block exposure pattern as a corrected exposure dose Qcp for the block exposure pattern, but also an auxiliary exposure dose Qaux for an exposure intensity-short region in the block to generate an auxiliary exposure shot in a region in which Qaux or Qaux/Qcp is equal to or more than a prescribed value. The first embodiment features the processing in step S10 and the processings in steps S20 and S30 are the same as corresponding steps disclosed in Japanese Patent Application JP 12-166465-A. However, this embodiment is different from JP 12-166465-A in that there is used a reference forward scattering intensity for each block exposure pattern in step S20.

Description will be given of a block exposure pattern below. A processing for individual patterns is the same as a processing for a block exposure pattern including only one pattern.

Figure 2:
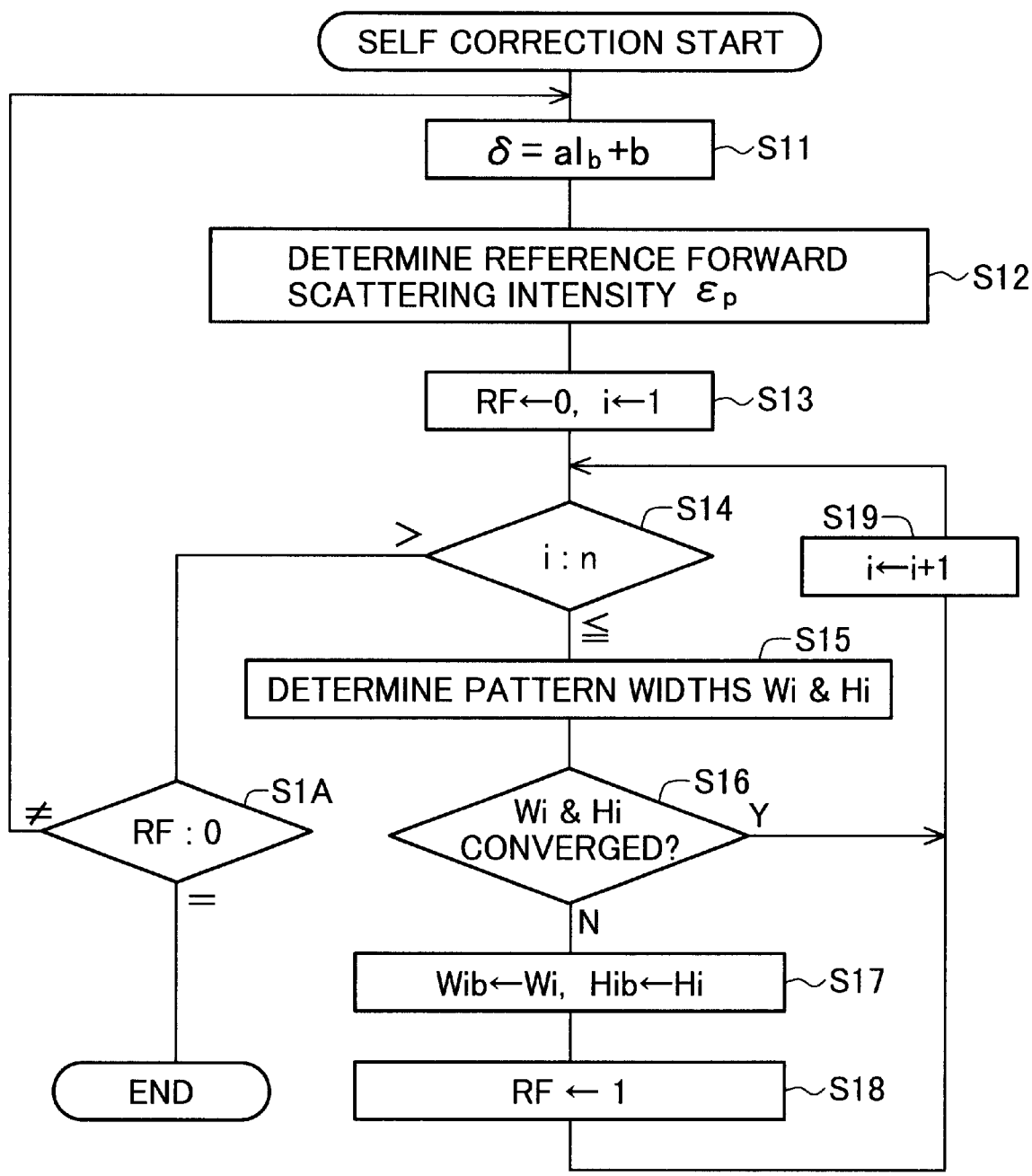
FIG. 2 is a detailed flow chart showing a processing for one block exposure pattern in step S10 of FIG. 1.

FIG. 2 is a detailed flow chart showing a processing for one block exposure pattern in step S10 of FIG. 1. In self-correction in step S10, the adjustment of a pattern width is made for each block exposure patterns such that for each pattern of each block, the distribution width W coincident with a reference forward scattering intensity $\epsilon_p$ of a forward scattering intensity distribution based on the forward scattering term of the equation (4) is equal to the design pattern width W0. The reference forward scattering intensity $\epsilon_p$ is determined in each block exposure pattern.

(S11) A total sum of aperture areas in a block is substituted into the equation (2) to obtain a beam blur $\delta$.

Figure 3A:
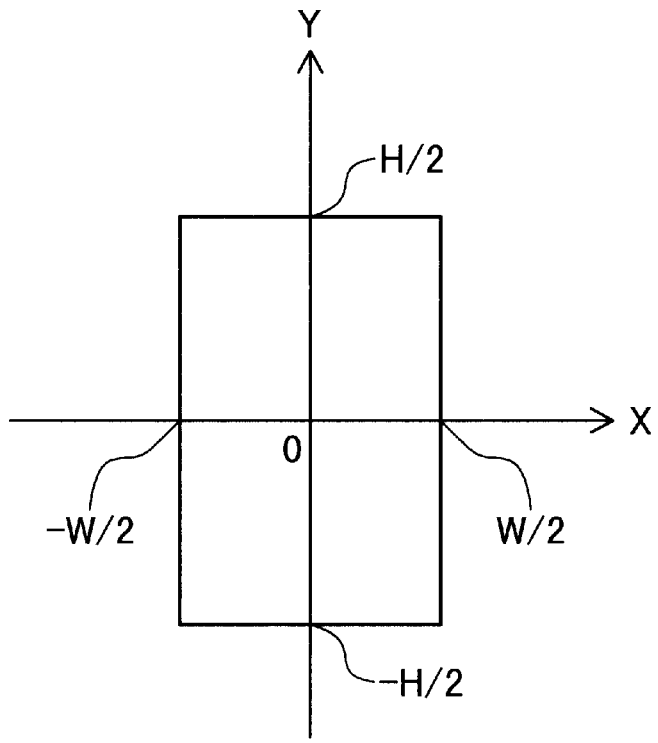
FIG. 3(A) is a graph showing a rectangular pattern having sizes W and H in the X direction and the Y direction, respectively, in an X-Y orthogonal coordinate system

(S12) A rectangular pattern with the minimum width in the block is selected, and when the half-peak distribution width of a forward scattering distribution of the selected pattern is adjusted so as to be equal to the design pattern width, the half-peak intensity thereof is determined as a reference forward scattering intensity $\epsilon_p$ of block exposure. In more detail, the intensity $\epsilon_p$ is obtained in the following way:

FIG. 3(A) shows a rectangular pattern having sizes W and H in the X direction and the Y direction, respectively, in an X-Y orthogonal coordinate system. A forward scattering intensity distribution $F_f$ (x, y; W, H) of this pattern is expressed by the following equation:

$$F_f(X, Y; W, H) = \frac{1}{\pi \beta_f^2} \int_{-H/2}^{H/2} \int_{-W/2}^{W/2} \exp\left(-\frac{(X-X')^2 + (Y-Y')^2}{\beta_f^2}\right) dX' dY' \quad (5)$$

-continued $$= \frac{1}{\sqrt{\pi} \beta_f} \int_{-W/2}^{W/2} \exp\left(-\frac{(X-X')^2}{\beta_f^2}\right) dX' \cdot$$

$$\frac{1}{\sqrt{\pi} \beta_f} \int_{-H/2}^{H/2} \exp\left(-\frac{(Y-Y')^2}{\beta_f^2}\right) dY'$$

$$= G\left(X; -\frac{W}{2}, \frac{W}{2}, \beta_f\right) \cdot G\left(Y; -\frac{H}{2}, \frac{H}{2}, \beta_f\right)$$

wherein the function G is defined as $$G(X; X_1, X_2, \sigma) = \frac{1}{\sqrt{\pi} \sigma} \int_{X_2}^{X_1} \exp\left(-\frac{(X-X')^2}{\sigma^2}\right) dX' \quad (6)$$

$$= \frac{1}{2}\left\{\text{erf}\left(\frac{X_2 - X}{\sigma}\right) - \text{erf}\left(\frac{X_1 - X}{\sigma}\right)\right\}$$

and an error function erf is defined by the following equation.

$$\text{erf}(X) = \frac{2}{\sqrt{\pi}} \int_0^X \exp(-t^2) dt \quad (7)$$

Figure 3B:
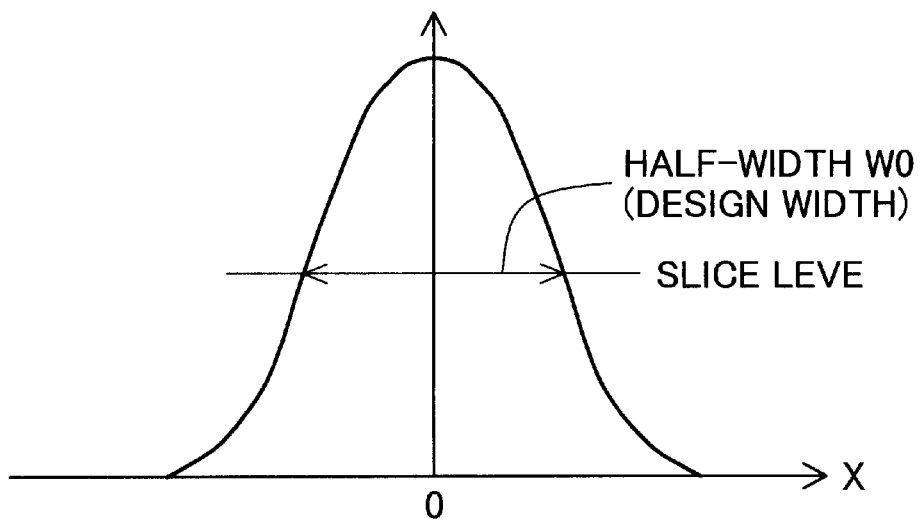
FIG. 3(B) is a graph showing a forward scattering intensity distribution obtained by surface-integrating the forward scattering term of an energy intensity distribution function over the pattern.

FIG. 3(B) shows a forward scattering intensity distribution $F_f$ (x, 0; W, H) on the X axis. W and H are determined such that for a pattern of a design size W0×H0 having the minimum widths in the block, the half peak widths of forward scattering intensity distributions along the X axis and the Y axis are equal to the design width values W0 and H0, respectively. Therefore the W and H are a solution of the following simultaneous equations with two unknowns:

$$F_f(W0/2,0; W,H)=F_f(0,0; W,H)/2 \quad (8)$$

$$F_f(0,H0/2; W,H)=F_f(0,0; W,H)/2 \quad (9)$$

The reference forward scattering intensity $\epsilon_p$ is expressed by the following equation using the solution W and H:

$$\epsilon_p=F_f(W0/2,0; W,H) \quad (10)$$

Figure 4:
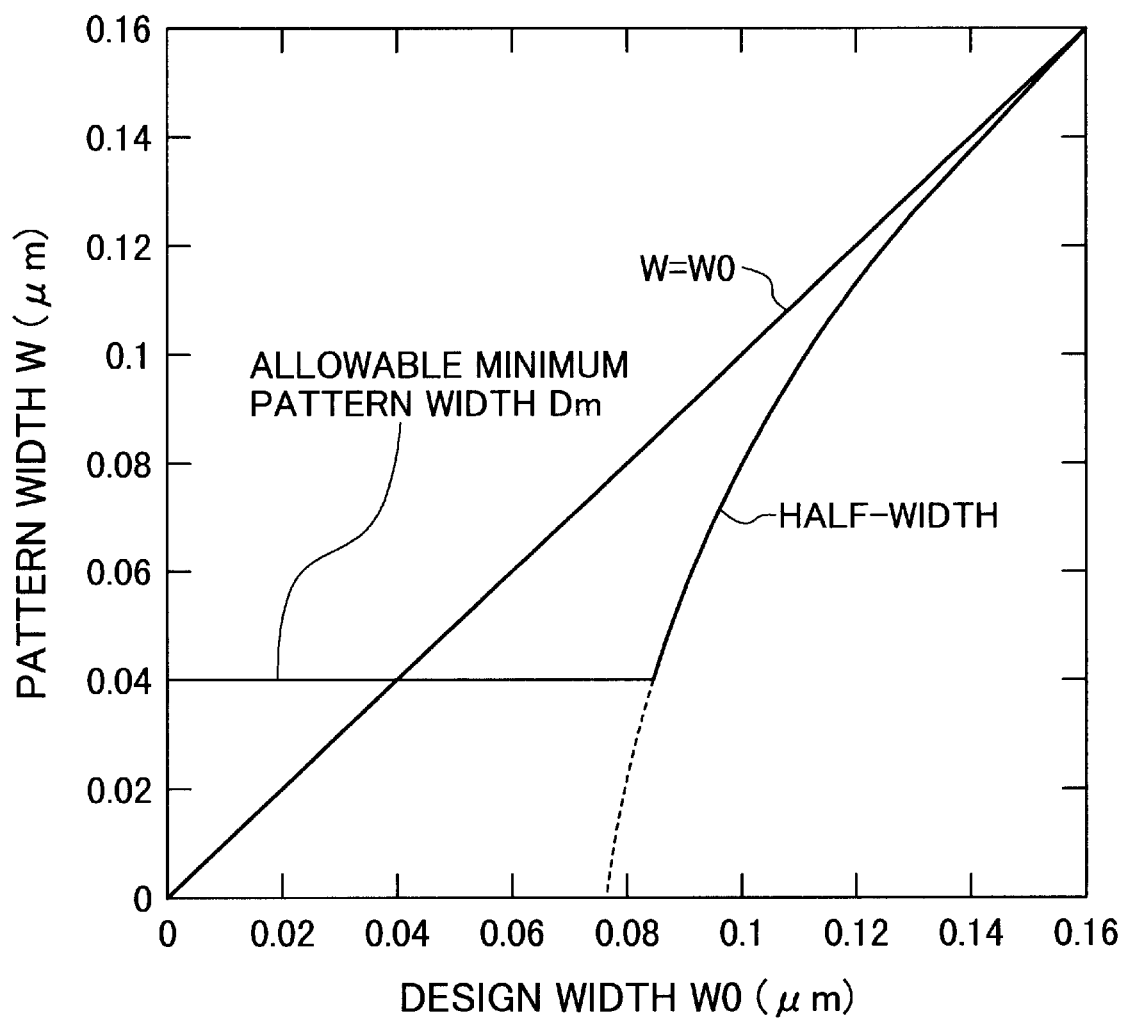
FIG. 4 is a graph showing a pattern width (shifted width) W of a mask of FIG. 3(A) with respect to a half-width (design width) W0 FIG. 3(B) in a case where an effective forward scattering radius is 0.04 $\mu$m.

FIG. 4 shows a numerical solution of the equation (8) for the design width W0 when H=∞ and the effective forward scattering radius $\beta_f$=0.04 μm. When a pattern width W is excessively narrow, accuracy of a transferred pattern image is worsened, and therefore an allowable minimum pattern width Dm is determined on the basis of experiments. For instance, Dm=0.04 μm. When W<Dm or no solution exists, W=Dm is adopted, which is substituted into the equation (8) to obtain H, and the reference forward scattering intensity $\epsilon_p$ is determined on the basis of the equation (10).

(S13) A retry flag RF is reset and 1 is substituted for a pattern identification number i of the block.

(S14) If i≦n, the process advances to step S15 but if not, the process advances to S1A, where n denotes the number of patterns in a block of interest.

(S15) Pattern widths Wi and Hi are determined such that for a pattern having a design size Wi0×Hi0 in the block, the distribution width coincident with the reference forward scattering intensity $\epsilon_p$ of a forward scattering intensity distribution $F_f$ is equal to the design width Wi0 and Hi0. That is, the Wi and Hi is obtained by solving the following simultaneous equations (11) and (12) with two unknowns:

$$F_f(Wi0/2,0; Wi,Hi)=\epsilon_p \quad (11)$$

$$F_f(0,Hi0/2,0; Wi,Hi)=\epsilon_p \quad (12)$$

(S16) When Wi and Hi are different from the previous values Wib and Hib, $\delta$ in step S11 alters and parameters of the function $F_f$ alters, and therefore the calculation in step S15 is again required to be performed for all the patterns of the block. Hence, if Wi and Hi are not converged, that is, if |Wi−Wib| or |Hi−Hib| is larger than a prescribed value, the process advances to step S17, but if not, the process advances to step S19. The initial values of the previous values Wib and Hib are set to design values Wi0 and Hi0, respectively.

(S17) Wi and Hi are stored as Wib and Hib, respectively.
(S18) The retry flag RF is set to 1.
(S19) "i" is incremented by 1 and the process returns to step S14.
(S1A) If RF=1, the process returns to step S11, but if not, the processing of FIG. 2 is terminated.

Figure 6:
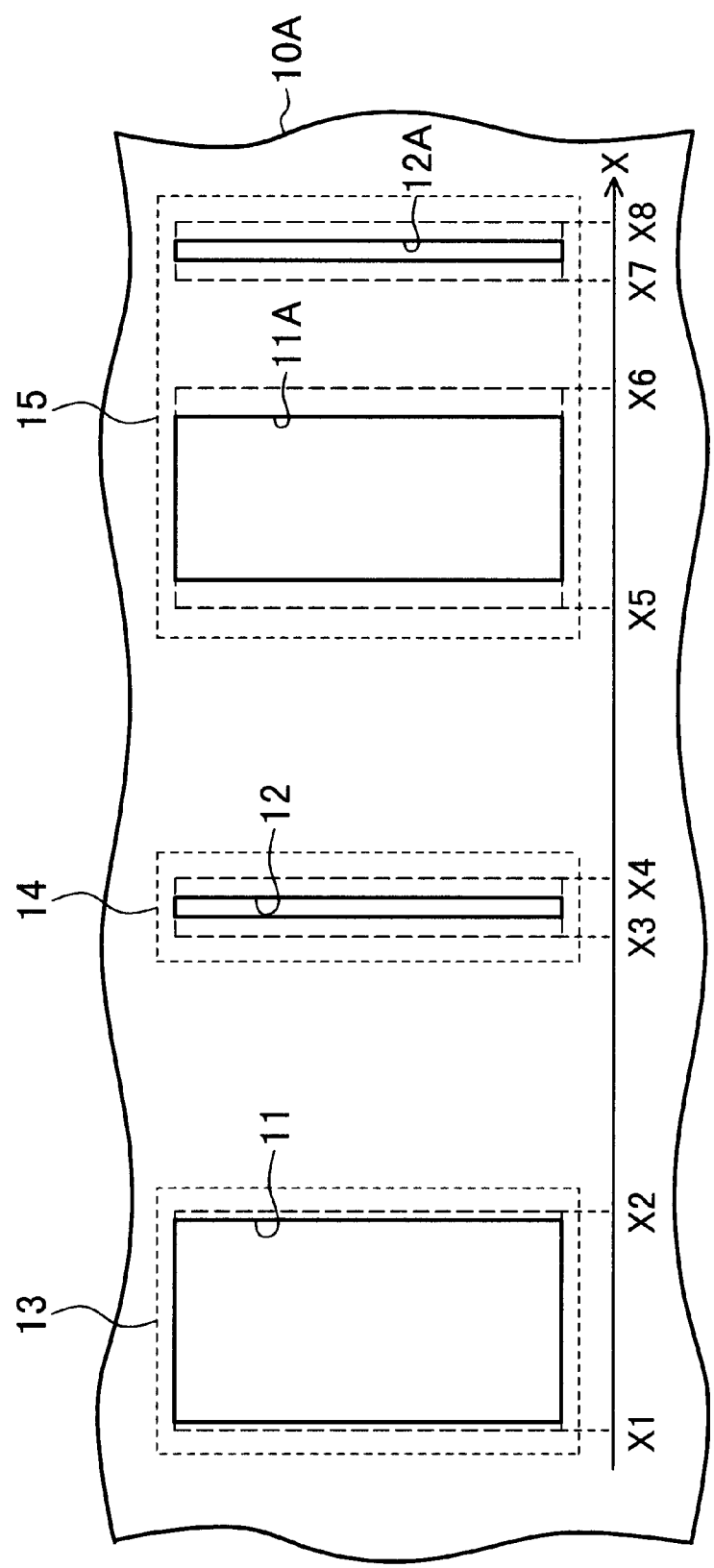
FIG. 6 is a view showing a design pattern, a pattern shifted due to a proximity effect correction and an electron beam irradiation region of part of a mask.

For instance, in a case where as shown with dashed lines in FIG. 6, X direction design widths of a large width isolated pattern and a small width isolated pattern for individual exposure are (X2−X1), (X4−X3), respectively, and those of a large width pattern and a small width pattern for a block exposure are (X6−X5) and (X8−X7), respectively, a pattern width of each of the patterns are made narrower by the processing in step S10 as shown with solid lines. When rectangular regions 13 to 15 shown with dotted lines are irradiated with an electron beam for rectangular transmission holes 11, 12, 11A and 12A each indicated by a solid line on a mask 10A, an outline of a forward scattering intensity distribution on a wafer coated with a photoresist is obtained as shown in FIG. 7(A). In FIG. 7(A), the distribution is normalized such that the maximum value of a forward scattering intensity distribution of the limitlessly large rectangular pattern is 1. A forward scattering intensity distribution of individual exposure is the same as in the case of JP 12-166465-A and a pattern width is shifted such that the half-peak distribution width of a forward scattering intensity distribution is equal to the design width. For a large width pattern and a small width pattern of individual exposure, both forward scattering intensities coincident with the design width are ½ and $\epsilon_p$, respectively, while both are almost $\epsilon_p$<½ for block exposure. In FIG. 6, the large width pattern 11A is narrower than the large width pattern 11 for individual exposure. Thereby, a beam blur decreases.

Figure 8:
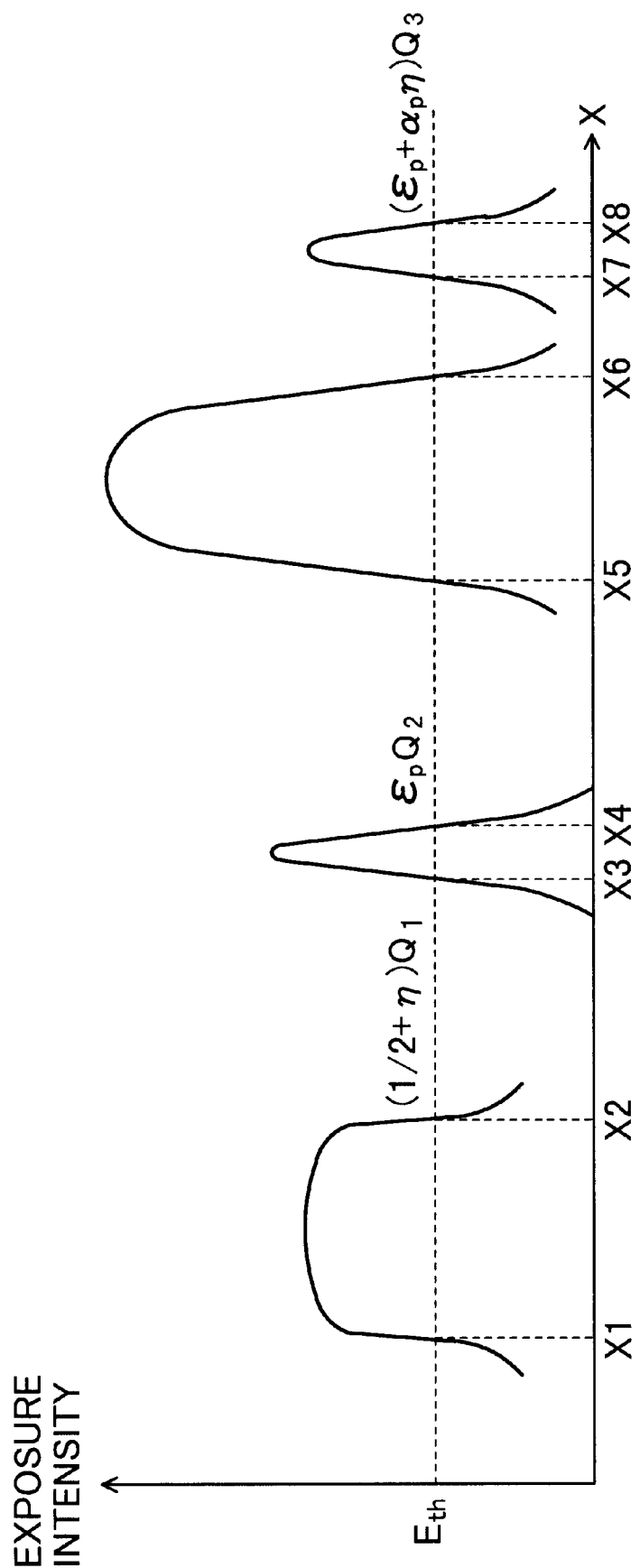
FIG. 8 is a schematic diagram showing an exposure intensity distribution after correction of the exposure intensity distribution of FIG. 7(B)

Then, description will be visually given of the contribution of forward scattering and backscattering to an exposure intensity distribution with reference to FIGS. 7(B) and 8.

FIG. 7(B) is a schematic diagram showing an exposure intensity distribution obtained by adding a backscattering intensity distribution to the forward scattering intensity distribution of FIG. 7(A). An exposure dose is constant and not corrected.

In this case, a backscattering component of a pattern area density $\alpha_p$ ($\alpha_p$<1) is $\alpha_p \cdot \eta$ and the exposure intensity coincident with the design width is expressed by $\epsilon_p + \alpha_p \cdot \eta$ for any of the patterns. In a large width isolated pattern, $\epsilon_p$=½ and $\alpha_p$=1. Although an influence of backscattering is exerted over a wide range, the influence is relatively smaller with a smaller integration area, and therefore $\alpha_p \cdot \eta$ of a small width isolated pattern can be neglected.

Note that in FIGS. 7(A) and 7(B), although the exposure intensity actually assumes a value multiplied by a constant 1/(1+η) as is clear from the above equation (4), this constant is omitted.

Then, description will be given of an exposure dose correction processing in step S20.

FIG. 8 is a schematic diagram showing an exposure intensity distribution after correction of the exposure intensity distribution of FIG. 7(B).

As shown in FIG. 8, for each pattern, a corrected exposure dose Qcp is determined such that a value obtained by multiplying the corrected exposure dose by the exposure intensity ($\epsilon_p + \alpha_p \cdot \eta$) coincident with the design width is equal to a threshold value Eth, that is, so as to meet $$(\epsilon_p + \alpha_p \cdot \eta) Qcp = Eth. \quad (13)$$

In FIG. 8, Q1 to Q3 represent corrected exposure dose Qcp for a large width isolated pattern and a small width isolated pattern for individual exposure, and for a block exposure pattern, respectively, which are determined such that $$(½+\eta)Q_1 = \epsilon_p Q_2 = (\epsilon_p + \alpha_p \cdot \eta) Q_3 = Eth.$$

Although in the above description, the pattern area density is assumed as $\alpha_p$ for simplification, it is actually an effective pattern area density $\alpha_p'$, which will be described later.

Then, detailed description will be given of an exposure dose correction processing in step S20.

(S21) A surface on which a pattern to be exposed is placed is divided into squares each of A×A in size of a mesh arrangement and an area density $\alpha i,j$ of a square pattern on the i-th row and the j-th column is calculated by the following formula:

$$\alpha i,j = (\text{an area of a pattern on the } i\text{-th row and the } j\text{-th column})/A^2.$$

This pattern here has a width adjusted in step S10. For instance, the block shot size corresponds to a square having a side of 4.5 μm in length and a square of the mesh arrangement is a square having a side of 1.5 μm in length. Since an alteration in pattern width is not performed in steps S20 and S30, the calculation is done only once.

(S22) The effective pattern area density $\alpha'i,j$ described later is calculated.

Figure 5:
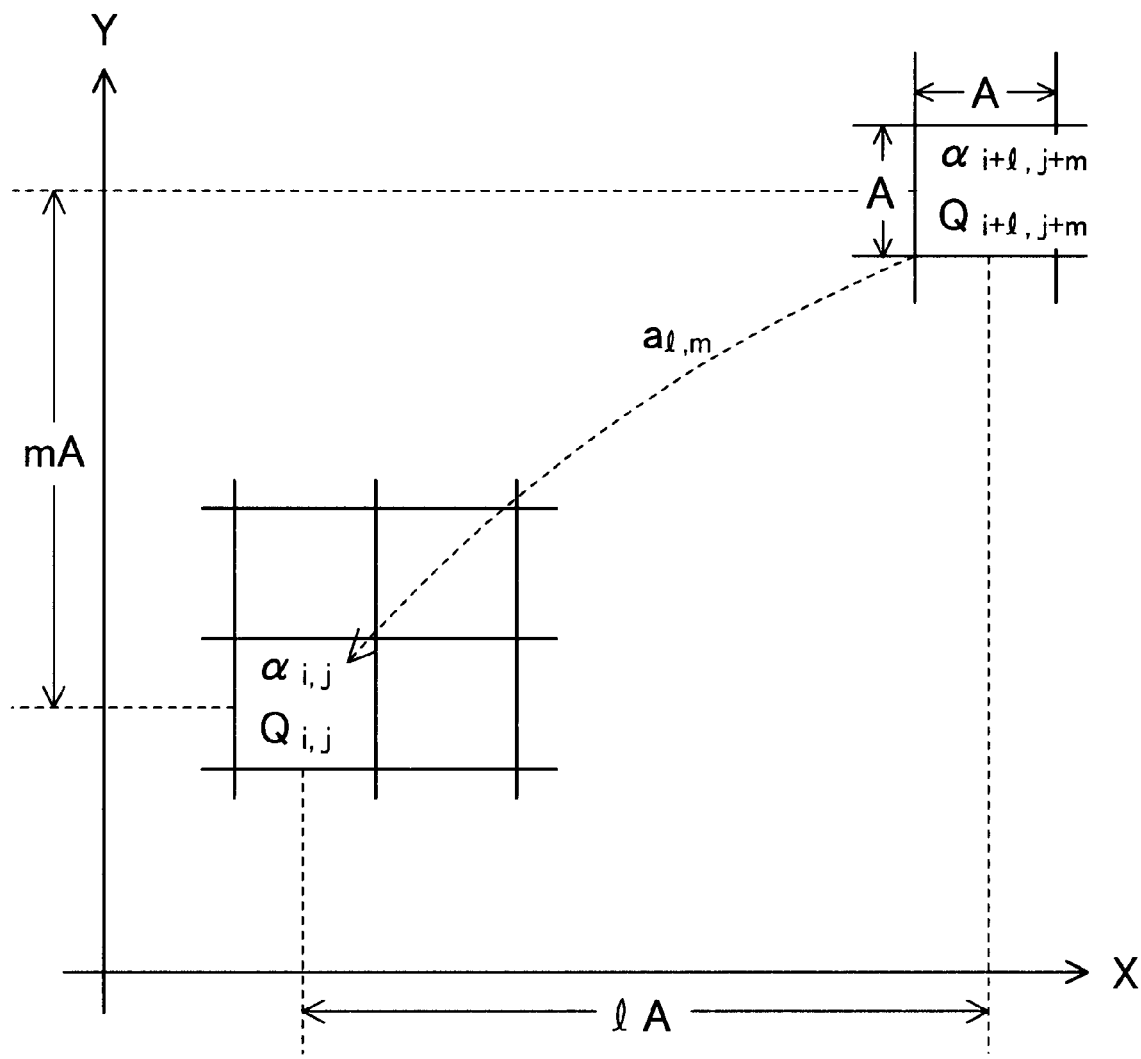
FIG. 5 is a descriptive graph for a pattern area density map method.

In FIG. 5, when all of the surface of a rectangular region divided into mesh arrangement of the i+1 rows and the j+m columns is exposed, an exposure intensity al,m at a central point of a square on the i row and the j column (hereinafter simply referred to as square i,j) by backscattering is obtained by surface integration of the backscattering term of the above equation (4) over the mesh arrangement of the i+1 rows and the j+m columns, which is expressed by the following equation:

$$a_{l,m} = \frac{1}{\pi \beta_b^2} \int_{lA-A/2}^{lA+A/2} \exp\left(-\frac{X^2}{\beta_b^2}\right) dX \int_{mA-A/2}^{mA+A/2} \exp\left(-\frac{Y^2}{\beta_b^2}\right) dY \quad (14)$$

$$= \frac{1}{4}\left\{erf\left(\frac{(l+1/2)A}{\beta_b}\right) - erf\left(\frac{(l-1/2)A}{\beta_b}\right)\right\}$$

$$\times \left\{erf\left(\frac{(m+1/2)A}{\beta_b}\right) - erf\left(\frac{(m-1/2)A}{\beta_b}\right)\right\}$$

The exposure intensity al,m is normalized such that a surface integral of the backscattering term of the above equation (4) over all the surface, that is, Σal,m, which is a sum of all al,m over all l and all m, is 1.

When a pattern with an area density $\alpha i+l, j+m$ in a square i+l,j+m is exposed with a corrected exposure dose Qi+l,j+m, an exposure intensity in a square i,j by backscattering approximates η×al,m×αi+l,j+m×Qi+l,j+m. It is assumed that an influence of backscattering to a point is exerted only within a circle of a radius 2$\beta_b$ with the point as a center. This assumption is sufficient in calculation accuracy.

Therefore, if an effective pattern area density $\alpha'i+j$ is defined by the following formula, an exposure intensity of a square i+j by backscattering approximates η×α'i,j×Qcp.

$$\alpha'_{i,j} = \frac{1}{Q_{i,j}} \sum_l \sum_m a_{l,m} \alpha_{i+l,j+m} Q_{i+l,j+m} \quad (15)$$

where ranges of integers 1 and m are both $-\text{int}(2\beta_b/A)$ to $\text{int}(2\beta_b/A)$, wherein $\text{int}(x)$ is a function for rounding x to the nearest whole number by raising fractions to a unit. Calculation of the above equation is referred to as a smoothing processing.

Now, description will be given of a relationship between a corrected exposure dose Qcp and an auxiliary exposure dose Qaux for a block pattern.

For simplification, let us consider a case where auxiliary exposure is performed with one square of a mesh arrangement as a unit. Then, an auxiliary exposure shot size becomes A×A. It is assumed that a first to ninth squares are included in a block exposure region, an auxiliary exposure dose and an effective pattern area density of the k-th square are indicated by Qaux.k and α'k, respectively, and the effective pattern area density in the block is maximized at k=m.

For each square k, it is determined that the sum of $(\epsilon_p + \alpha'k \cdot \eta)Qcp$ and an auxiliary exposure dose Qaux.k is equal to Eth. That is, the following equation is established:

$$(\epsilon_p + \alpha'k \cdot \eta)Qcp + Qaux.k = Eth \quad (16)$$

If Qcp is determined such that Qaux.k=0 when k=m, the following equation is derived from the equation (16):

$$(\epsilon_p + \alpha'm \cdot \eta)Qcp = Eth \quad (17)$$

The following equation is derived from the above equations (16) and (17):

$$Qaus.k = (\alpha'm - \alpha'k)\eta Qcp.i \quad (18)$$

No auxiliary shot is generated in a region where Qaus.k= 0. Note that "Qaux.k>Δ×Qcp.i", that is, $$(\alpha'm - \alpha'k)\eta > \Delta. \quad (19)$$

may be an auxiliary exposure generation condition, where A is determined by size accuracy of a desired transferred pattern, for example, as 0.05 or 0.01, which means that an omitted auxiliary exposure dose is smaller than 5% or 1% of a corrected exposure dose, respectively.

(S23) A corrected exposure dose Qcp is calculated on the basis of the above equation (17). Although the above equation (17) is for block exposure, it is also applied to plural square exposure patterns. The processing in step S20 is different from JP 12-166465-A in that sp in the equation (17) for each block exposure pattern is different from each other.

Then, description will be given of step S30 of generating an auxiliary exposure shot. This processing is the same as in JP 12-166465-A.

(S31) An auxiliary exposure dose Qaux.k is calculated on the basis of the above equation (17). Although the above equation (18) is for block exposure, it is also applied to plural square exposure patterns.

(S32) As described above, for example, it is determined to perform auxiliary exposure on a square meeting the condition of the above equation (19), that is, an auxiliary exposure shot is generated. The auxiliary exposure shot is superimposed on a block exposure shot. In the auxiliary shot, exposure is performed in conditions that a rectangular electron beam size is made to coincide with A×A, focusing the image.

(S33) Unless a corrected exposure dose Qcp and an auxiliary exposure dose Qaux.k are not converged, the process returns to step S22.

Note that an auxiliary exposure dose is also taken in to consideration in step S22. Further, each initial value of corrected exposure doses Qcp is given as a corrected exposure dose for a large width isolated pattern, for example.

In the first embodiment, a rectangular pattern with the minimum width in a collective exposure region (block) used repeatedly is selected to determine a reference forward scattering intensity $\epsilon_p$ on the basis of a forward scattering intensity distribution of the selected pattern and to adjust each pattern width such that the distribution width coincident with the reference forward scattering intensity of the forward scattering intensity distribution of each $\epsilon_p$ of patterns in the block is equal to the design width. Thus, as shown in FIG. 8, a slant of an exposure intensity distribution of a small width pattern in the block at the threshold value Eth is sharp, and variations in width of a transferred pattern image decrease, compared with variations in the exposure condition, thereby enabling achievement of a small width pattern with high accuracy. Although the slant for a large width pattern is softer than in the case of JP 12-166465-A, its reduction in size accuracy is small because of having a large width. Therefore, size accuracy of a transferred pattern image is improved as compared with the prior art from a viewpoint of the entirety of the patterns.

Further, similarly to JP 12-166465-A, a corrected exposure dose can be obtained in a relatively short time.

Note that since a slant of a forward scattering intensity distribution is relatively sharp in the vicinity of half-width intensities, it is not always required in step S12 to equalize the half-peak distribution width of the smallest width pattern of the block to each design value, and when the peak value of the forward scattering intensity distribution $F_f$ is Fmax, if the distribution width coincident with a value of "$F_f$= kFmax" with k in a range of 30~70% is made equal to the design width, size accuracy of a transferred pattern is improved as compared with in the prior art. The reason for limitation on the range of k is that a margin for size alteration is decreased due to the influence of overlapping of exposure intensity distributions of adjacent patterns if k is lower than 30% and due to a softer slant of a forward scattering intensity distribution at the corresponding position if k is more than 70%.

Further, in step S12, a reference forward scattering intensity $\epsilon_p$ may be determined such that the distribution width coincident with the slice level (=the reference intensity $\epsilon_p$) of the forward scattering intensity distribution of a pattern having the minimum design width in a collective writing region is equal to the design width. That is, as for a pattern having a design size W0×H0 of the minimum width of the block, the reference forward scattering intensity $\epsilon_p$ may be determined such that $\epsilon_p = F_f(W0/2, 0,; W0, H0)$. In a case where pattern sizes in a region of collective writing are different extremely, if a large pattern is subjected to graphic modification according to the half-peak distribution width intensity of the forward scattering intensity distribution of a fine pattern, an exposure margin for the large pattern is reduced since the distribution widths coincident with the vicinity of lower ends of forward scattering intensity distributions are equal to the design width, but in such a way, by setting the reference forward scattering intensity $\epsilon_p$ to a relatively high intensity without performing a graphic modification of a pattern with the minimum size, reduction in exposure margin for a large pattern can be avoided.

Furthermore, in step S15, the size shift on patterns in a region of collective writing may be performed in the shorter side direction (X axis direction) of the patterns such that the distribution width coincident with the reference forward scattering intensity $\epsilon_p$ of the forward scattering intensity distribution is equal to the design width, while in the longer side direction (Y axis direction) such that the distribution width coincident with "$F_f=kFmax$" of the forward scattering intensity distribution is equal to the design width. Generally, when a pattern has very narrow width, an exposure intensity at its corner parts is lowered to easily round the corner images, but applying such a processing along the longer side direction permits the forward scattering intensity at the connection part of the patterns to be 2k times the peak intensity (if k=0.5, the forward scattering intensity is the same as the peak intensity), thereby preventing the reduction of the exposure intensity at the connection part.

Second Embodiment

Then, description will be given of an electron beam exposure method using a proximity effect correction method according to the second embodiment of the present invention with reference to FIGS. 9 to 11.

As patterns are finer, a distance between patterns is shorter, and if the distance is reduced to a value of the order of an effective forward scattering radius $\beta_f$, influences of forward scattering arises from the adjacent patterns. The second embodiment is different from the first embodiment in that an influence of a forward scattering from a pattern in the neighborhood is considered for each of sides of the pattern of interest in a forward scattering intensity calculation in step S15 of FIG. 2.

Figure 9A:
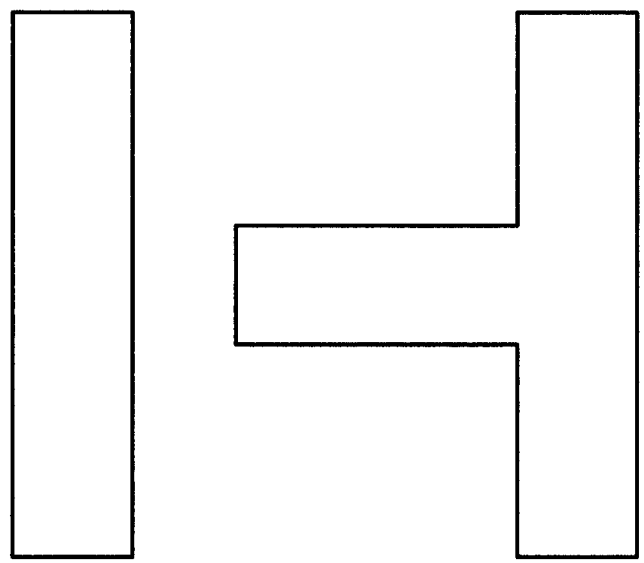
FIG. 9(A) is a diagram showing a block pattern used in description of a shift in size in a proximity effect correction method of a second embodiment of the present invention and FIG. 9(B) is a diagram showing fixed sample points set on the pattern.
Figure 9B:
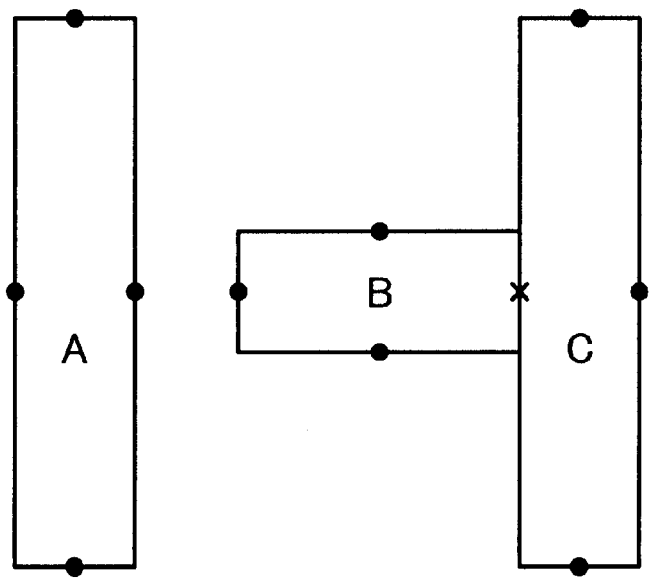
Figure 10A:
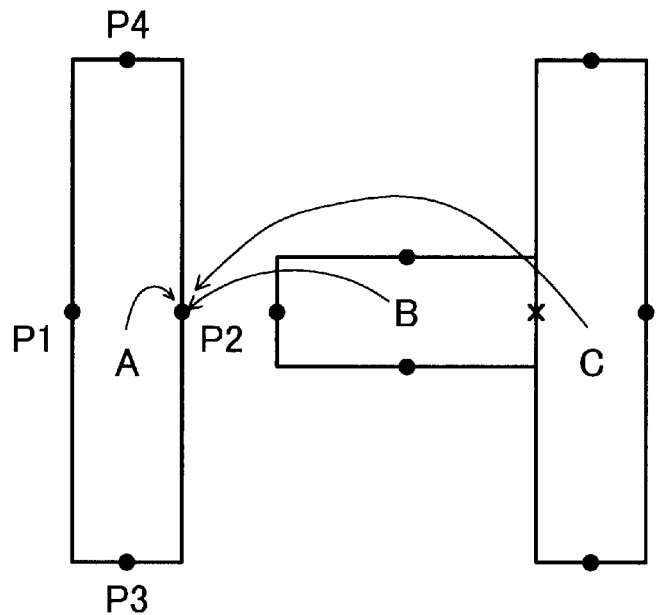
FIG. 10(A) is an illustration showing an influence of forward scattering from an adjacent pattern on a fixed sample point P2 and FIG. 10(B) is a diagram showing a pattern shifted in bilateral asymmetry in consideration of the influence.
Figure 10B:
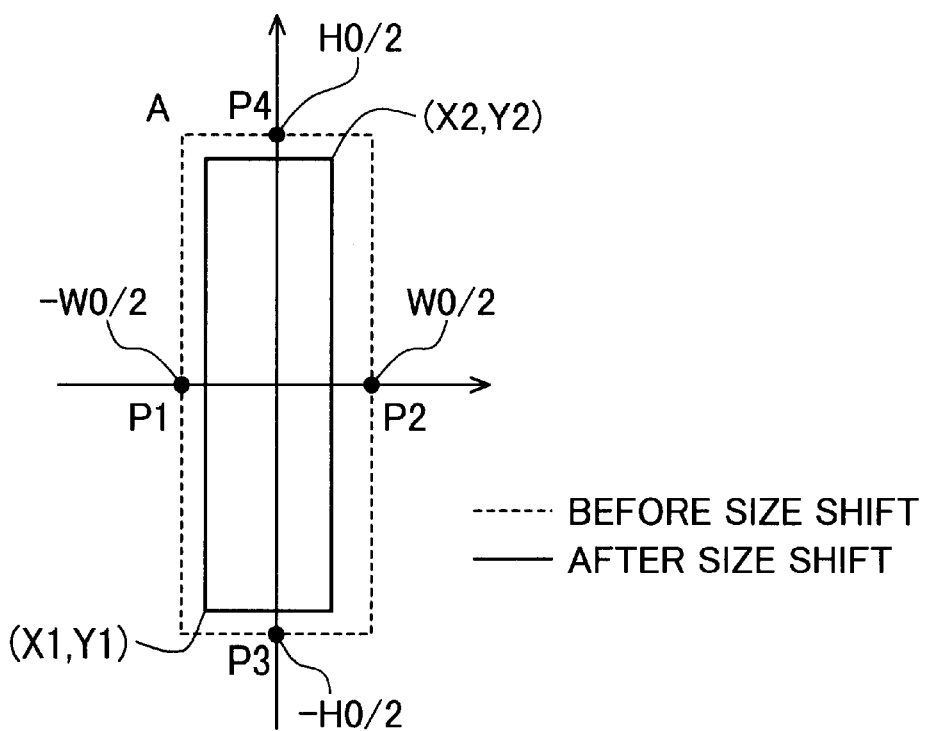

FIG. 9(A) shows a block pattern in a collective exposure region. As shown in FIG. 9(B), a non-rectangular pattern is divided into rectangles and each fixed sample point indicated by a bold dot is set in the middle point of each side of each rectangle. No fixed sample point is set at the middle point of a side where patterns B and C are in contact with each other. Then, in order to incorporate an influence of forward scattering from each of patterns in the neighborhood, a forward scattering intensity is calculated at each of the fixed sample points set to each of the rectangles. FIG. 10(A) shows the influence at the fixed sample point P2 from patterns in the neighborhood. The integration range in a forward scattering intensity calculation is, for example, within $\pm 2\epsilon_f$ in both of the X direction and Y direction from each fixed sample point as the center. With respect to each fixed sample point, a side corresponding to the fixed sample point is shifted in a direction perpendicular to the side such that a forward scattering intensity at the fixed sample point is equal to the reference forward scattering intensity, thus adjusting the pattern width.

In a case where in such a way, an influence of forward scattering from a pattern in the neighborhood is incorporated, opposing sides generally have different amount of shift. Therefore, as shown in FIG. 10(B), if coordinates of lower left and upper right corners of the pattern are given as (X1, Y1) and (X2, Y2), respectively, a forward scattering intensity distribution function $F_f$ corresponding to the above equation (5) is defined by the following equation:

$$F_f(X, Y; X1, X2, Y1, Y2) = G(X; X1, X2, \beta_f) \times G(Y; Y1, Y2, \beta_f) \quad (20)$$

In this case, in order to equalize the distribution width coincident with the reference forward scattering intensity $\epsilon_p$ of the forward scattering intensity distribution with the design width (N0, H0) for a pattern having a design size of W0×H0, the coordinates (X1, Y1) and (X2, Y2) are calculated such that forward scattering intensities of the 4 fixed sample points P1, P2, P3 and P4 are each equal to the reference forward scattering intensity $\epsilon_p$. That is, the coordinates of the 4 points P1–P4 are obtained by solving the following simultaneous equations with 4 unknowns with respect to points 1 to 4:

$$F_f(-W0/2, 0; X1, X2, Y1, Y2) + \epsilon 1 = \epsilon_p \quad (P1)$$

$$F_f(W0/2, 0; X1, X2, Y1, Y2) + \epsilon 2 = \epsilon_p \quad (P2)$$

$$F_f(0, -H0/2; X1, X2, Y1, Y2) + \epsilon 3 = \epsilon_p \quad (P3)$$

$$F_f(0, H0/2; X1, X2, Y1, Y2) + \epsilon 4 = \epsilon_p \quad (P4)$$

where $\epsilon 1$ to $\epsilon 4$ are forward scattering intensities from the adjacent patterns other than the pattern A, respectively, at the fixed sample points P1 to P4 of the pattern A.

The other points are the same as those of the first embodiment.

According to the second embodiment, since influences of forward scattering from the neighboring patterns are considered for each of the sides of the pattern of interest, accuracy of a transferred pattern image can be improved.

Figure 11A:
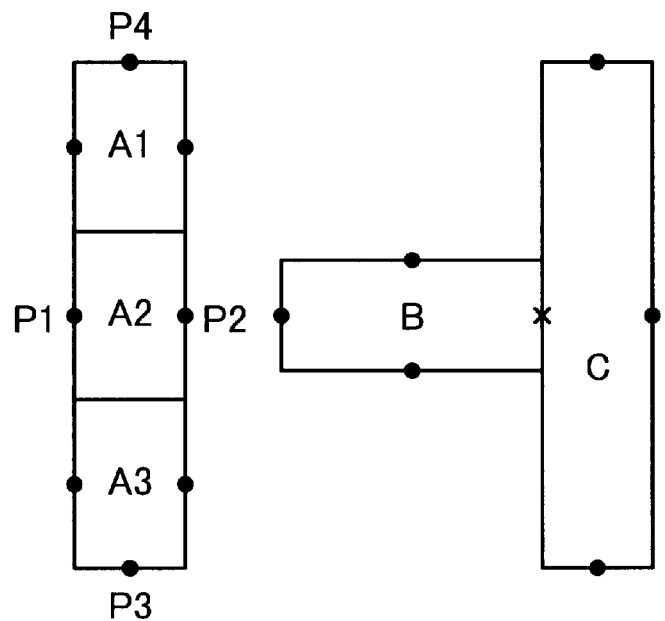
FIG. 11(A) is a diagram showing fixed sample points set on a divided pattern and FIG. 11(B) is a diagram showing a left side pattern of FIG. 11(A) shifted by an influence of a forward scattering.
Figure 11B:
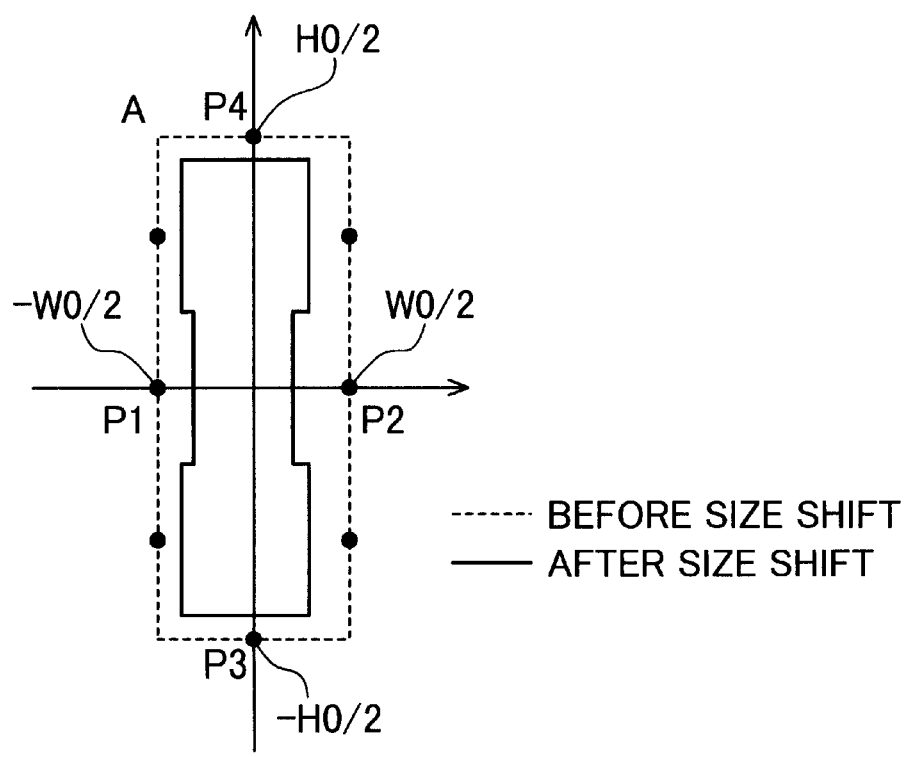

Note that in order to perform a size shift more correctly in consideration of an influence of forward scattering, it is assumed that the pattern A of FIG. 10(A) is composed of 3 division patterns A1 to A3 in calculation as shown in FIG. 11(A) and fixed sample points are set at the middle point of each of sides of the division patterns A1 to A3, in coincident with the boundary of the pattern A, to adjust widths of parts of the pattern A by shifting a corresponding side in a direction perpendicular to the side similarly to the above description. Thereby, for example, a more correctly adjusted pattern can be obtained as shown in FIG. 11(C).

Third Embodiment

Although the above embodiment are described in connection with a case where exposure of a small region block pattern of, for example, 4.5×4.5 $\mu m^2$ on a stencil mask is repeatedly exposed at plural places on a wafer, the present invention can be applied to EPL obtaining a subfield image of 250×250 $\mu m^2$ by collectively exposing, for example, a subfield of 1×1 $\mu m^2$ on a mask.

Then, description will be given of an electron beam exposure method using a proximity effect correction method according to the third embodiment of the present invention with reference to FIGS. 12 to 15.

This method comprises step 40 of performing a pattern width adjustment and step S50 of generating auxiliary pattern exposure. Since collective exposure is adopted, Qcp Now, description will be given of a pattern having a length of infinity in the Y axis direction for simplification. A reference exposure intensity (threshold value) Eth=$\epsilon_p$ is obtained by calculating a forward scattering intensity $\epsilon_p$ of an isolated pattern which has a design width W0 and which allows approximation of "$\alpha_p'\eta=0$" in the following equation obtained by setting Qcp=1 in the equation (13):

$$\epsilon_p + \alpha_p'\eta = Eth. \quad (21)$$

That is, the slice level is adjusted such that the distribution width coincident with the slice level of a forward scattering intensity distribution of a pattern having a design width W0 is equal to the design width W0 to determine the slice level as a reference exposure intensity Eth. To be concrete, the following equation is calculated:

$$Eth = 0.5 \, erf(W0/\beta_f). \quad (22)$$

By selecting the minimum width as a design width W0, fluctuations in width of a transferred pattern image decreases compared with fluctuations in the exposure condition for the reason described in the above first embodiment and size accuracy of the transferred pattern image is improved compared with the prior art from a viewpoint of the entirety of the pattern.

Then, an effective pattern area density $\alpha_p'$ is calculated by the pattern area density map method described above.

With the calculation performed, determination is done on the slice level $\epsilon_p = Eth - \alpha_p' \cdot \eta$ of a forward scattering intensity of each pattern from the equation (21). On the other hand, a forward scattering intensity distribution is determined by a pattern width W. Therefore, the pattern width W is adjusted such that the distribution width coincident with the slice level of a forward scattering intensity distribution is equal to the design width W0i. To be concrete, a solution W is obtained from the following equation:

$$\epsilon_p = [erf\{(W-W0i)/2\beta_f\} + erf\{(W+W0i)/2\beta_f\}]/2. \quad (23)$$

In more detail, in calculation of an effective pattern area density $\alpha_p'$, a pattern is divided into plural patterns and furthermore, fixed sample points are set as shown in FIG. 11(A) to shift each of the sides of division patterns in a direction perpendicular to the each side and to adjust a pattern width W. Further, a processing in step S50 becomes necessary since auxiliary exposure is performed similarly to a case of block exposure using the following equation obtained by setting Qcp.i=1 in the above equation (18):

$$Qaux.k = (\alpha'm - \alpha'k)\eta. \quad (24)$$

According to the third embodiment, a proximity effect correction calculation can be performed by the algorithm as described above with relative ease.

Figure 15A:
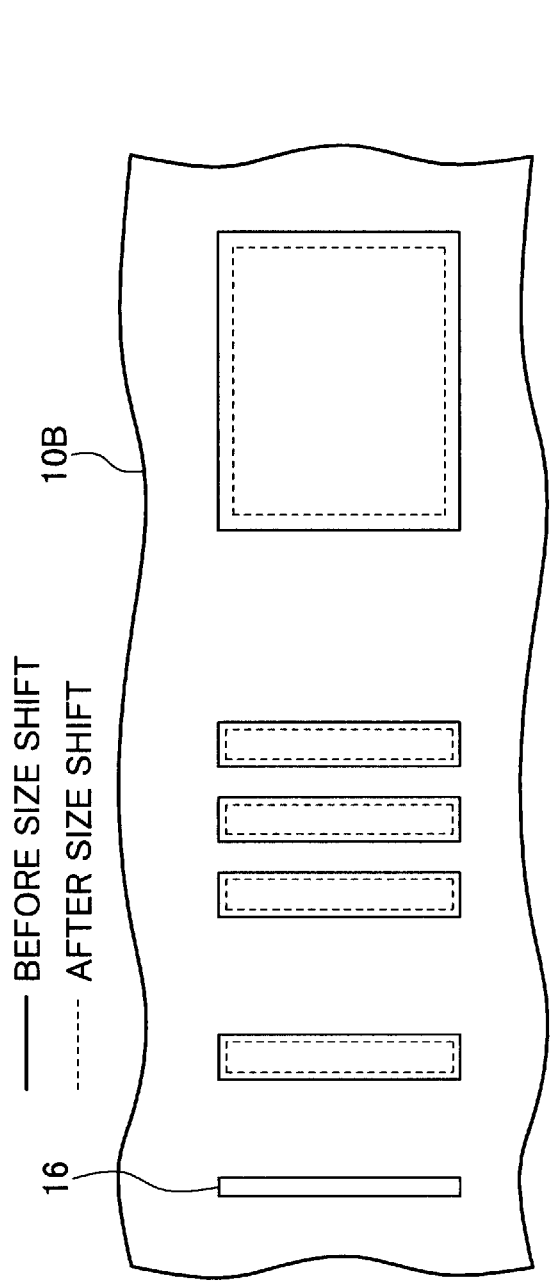
FIG. 15(A) is views showing part of a mask pattern before and after size shift and FIG. 15(B) is a schematic diagram showing an exposure intensity distribution corresponding to FIG. 15(A)
Figure 15B:
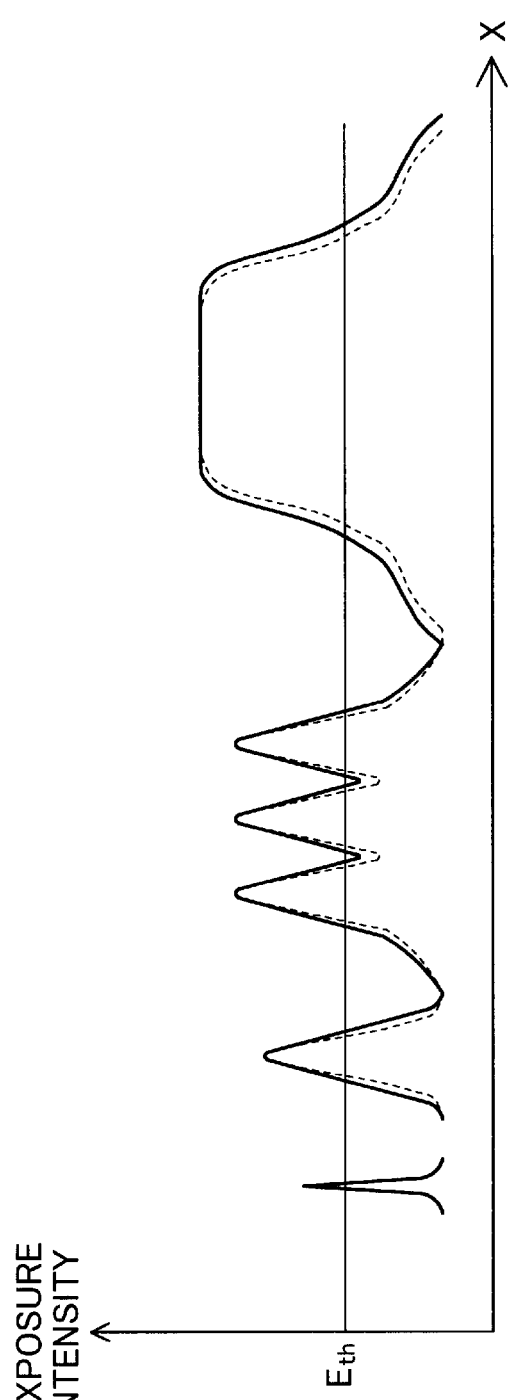

FIGS. 15(A) and 15(B) are conceptually descriptive views of the present invention.

FIG. 15(A) shows part of a mask 10B for collective exposure. In this figure, solid lines represent each pattern of a design size and dotted lines represent each pattern of a width adjusted by processing in step S40. A pattern 16 is a rectangular pattern having the minimum design width selected in step S41, for which no width adjustment is performed FIG. 15(B) shows an exposure intensity distribution in a case where collective exposure is applied with a mask of FIG. 15(A). In this figure, solid lines and dotted lines indicate each patterns of a design size and ones having an adjusted width by processing in step S40, respectively. In FIG. 15(B), no auxiliary exposure is included.

Then detailed description will be given of the processing of FIG. 12.

(S41) An isolated rectangular pattern having the minimum width is selected, and the X-Y orthogonal coordinate system is determined as in FIG. 3(A). Then the slice level of exposure intensity distributions is adjusted such that the distribution width in the X axis direction and the Y axis direction coincident with the slice level is equal to respective design widths W0 and H0, and the adjusted slice level is obtained as a reference exposure intensity Eth. Eth is calculated by the following equation:

$$Eth = F(W/2, 0; W, H) \quad (25)$$

where F is defined by the following equation:

$$F_s(X, Y; W, H) = F_f(X, Y; W, H) + \eta F_b(X, Y; W, H) \quad (26)$$

$$F_f(X, Y; W, H) = G(X; -W/2, W/2, \beta_f) \times G(X; -H/2, H/2, \beta_f) \quad (27)$$

$$F_b(X, Y; W, H) = G(X; -W/2, W/2, \beta_b) \times G(X; -H/2, H/2, 62_b) \quad (28)$$

Since an isolated pattern receives no backscattering, the following equations will exert no influence on a relation of "a slice level = a reference exposure intensity (developing threshold value)". Especially when the isolated pattern is a pattern having the minimum width, fluctuations in width of a transferred pattern image decrease compared with fluctuations in an exposure condition for a small width pattern to thereby improve size accuracy of a transferred pattern image in the entirety of the pattern.

(S42) A pattern (exposure data) is uniformly divided into rectangular patterns each as a unit of size shift. Sizes of division patterns are each of the order of, for example, $(\beta_f/10) \times (\beta_f/10)$ such that influences from an adjacent division pattern on each of edges of a division pattern are regarded to be uniform.

Figure 13A:
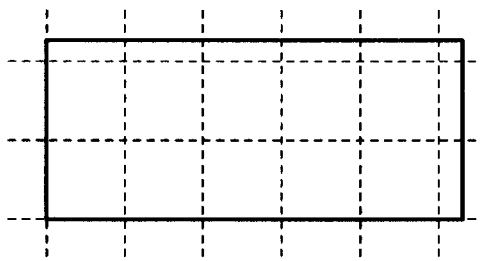
FIGS. 13(A), 13(C) and 13(E) are illustrations for division of one rectangular pattern indicated by a solid line
Figure 13B:
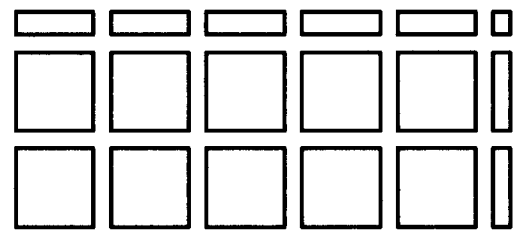
FIGS. 13(B), 13(D) and 13(F) are illustrations showing the division patterns of FIGS. 13(A), 13(C) and 13(E) as separate parts for clarity.
Figure 13C:
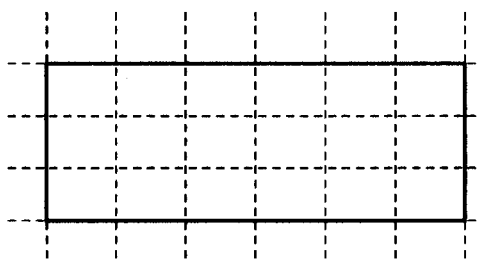
Figure 13D:
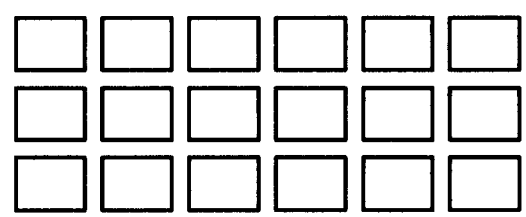
Figure 13E:
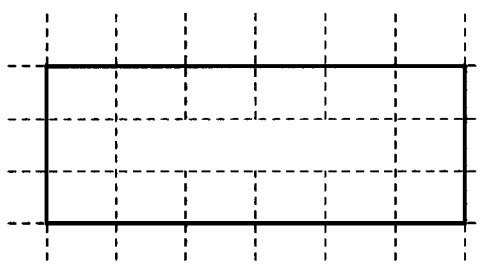
Figure 13F:
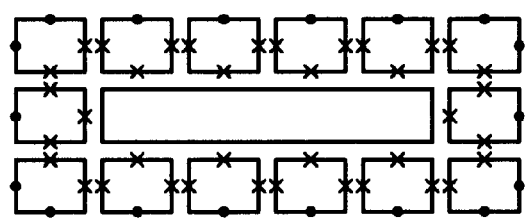

FIGS. 13(A), 13(C) and 13(E) are illustrations in a case where one rectangular pattern indicated by a solid line is divided as shown with solid lines, and FIGS. 13(B), 13(D) and 13(F) show the division patterns of FIGS. 13(A), 13(C) and 13(E), respectively, as separate parts for clarity.

FIG. 13(A) shows a case where the one rectangular pattern is simply divided in predetermined sizes starting from the lower left corner, wherein if a pattern size is perfectly not divided into full predetermined sizes, finer patterns are generated in the right and upper sides. In this case, there arise inconveniences in a size shift operation, such as disappearance of a pattern or generation of a negative pattern width.

FIG. 13(C) shows a case where the one rectangular pattern is divided into uniform sizes having predetermined longitudinal and lateral dimensions, and by dividing the one rectangular pattern uniformly, fine patterns as shown in FIG. 13(A) can be prevented from being generated. However, in graphic modification described later (pattern width adjustment), only sides which coincide with those of the original pattern are subjected to the graphic modification, and therefore such division into fine patterns is nothing more than to uselessly increase the number of patterns and to make the operation complicate and not useful. Considering such circumstances, as shown in FIG. 13(E), although the one rectangular pattern is divided into uniform patterns similarly to FIG. 13(C), only a region along the periphery of the original pattern is divided into patterns of the same size such that all the division patterns have respective sides in coincident with the boundary of the original pattern. With such processing applied, the number of division patterns can be prevented from uselessly increasing. Bold dots of FIG. 13(F) represent fixed sample points similar to FIG. 13(A).

Hereinafter, with respect to processing for division patterns, a pattern not having been divided because of a small size or of isolation is also referred to as a division pattern. Further, for example, in a case where a pattern having a design size of $1 \times 3 \, \mu m^2$ is divided into 3 parts each having a size of $1 \times 1 \, \mu m^2$, the size of $1 \times 1 \, \mu m^2$ is also referred to as a design size.

(S43) Calculation is performed on pattern area densities $\alpha i, j$ over i row numbers and j column numbers.

(S44) Calculation is performed on effective pattern area densities $\alpha' i, j$ obtained by adopting Qi,j=1 and Qi+l, j+m=1 in the above equation (14) over i row numbers and j column numbers.

(S45) In order to incorporate influences of forward scattering from patterns in the neighborhood for each of the division patterns obtained in step S42, fixed sample points are set as shown in FIG. 13(F) to calculate forward scattering intensity $\epsilon1$ to $\epsilon4$ from adjacent patterns at each of the fixed sample points similarly to the second embodiment. Then, one pair of orthogonal points (X1, Y1) and (X2, Y2) are obtained by solving the following simultaneous equations with 4 unknowns for the points P1 to P4 such that the width of an exposure intensity distribution coincident with the slice level (=a reference exposure intensity Eth) are equal to the design width in each of the division patterns each having a design size of W0×H0:

$$F_f(-W0/2,0;\ X1, X2, Y1, Y2)+\epsilon1+\alpha'i,j\cdot\eta=Eth \quad (P1)$$

$$F_f(W0/2,0;\ X1, X2, Y1, Y2)+\epsilon2+\alpha'i,j\cdot\eta=Eth \quad (P2)$$

$$F_f(0, -H0/2,0;\ X1, X2, Y1, Y2)+\epsilon3+\alpha'i,j\cdot\eta=Eth \quad (P3)$$

$$F_f(0, H0/2,0;\ X1, X2, Y1, Y2)+\epsilon4+\alpha'i,j\cdot\eta=Eth \quad (P4)$$

However, no movement occurs of a side which does not coincide with the edge of the original pattern like a side attached by a symbol X shown in FIG. 13(F).

By regarding the division pattern as the design pattern to adjust a pattern width of each division pattern as a unit, size accuracy of a transferred pattern prior to the division is improved.

(S51 to S53) Processing similar to that in steps S51 and S53 of FIG. 1 described above is performed. Since it is determined whether or not auxiliary exposure is performed in each square as a unit, unless an auxiliary shot is performed, local shortage of exposure may occur in a pattern including plural squares. Further, in a size shift operation, by rounding coordinates of a pattern to raise fractions to the minimum size unit, shortage of exposure intensity may arise. Such shortage of exposure intensity is cancelled by generating an auxiliary exposure shot of a square size. In step S43, a pattern area density of auxiliary exposure is also considered. If an effective pattern area density alters by a size shift or generation of an auxiliary exposure shot, no convergence is determined to thereby return to step S43.

FIG. 14 shows that two design patterns indicated with dashed lines are divided in step S42 and that peripheral sides are shifted in step S44.

Note that in step S41, a reference exposure intensity Eth=$\epsilon_p$ may be determined similarly to the processing in step S12 of FIG. 2 or an modified example thereof. That is, in step S41, a pattern width may be adjusted. For instance, in a case where an isolated rectangular pattern having the minimum design width W0 is selected and the distribution width coincident with the slice level, which is a value in the range of 30 to 70% of the peak value, of a forward scattering intensity distribution in the pattern is adjusted so as be equal to the design width, the adjusted slice level may be determined as a reference exposure intensity Eth.

Further, a relationship between a typical value of a design width, for example the minimum value W0, and a reference exposure intensity Eth is tabulated by calculation or on the basis of experiences and in step S41, the reference exposure intensity Eth may be determined with reference to the table at a value of W0.

Since in step S41, it is only required to determine a reference exposure intensity Eth, the pattern of interest is allowed not to be an isolated pattern, in which a pattern width of the pattern is determined by processing in steps S43 to S53.

Further, it has been well known that a beam blur $\delta$ in the energy intensity distribution function is dependent on an area for collective irradiation, a position in a collective irradiation region, a local aperture area in the collective irradiation region and a current density due to influences of an aberration of lenses in an exposure apparatus and a Coulomb's effect. Therefore, in order to achieve high accuracy correction, influences from the parameters on a beam blur $\delta$ are measured in advance with experiments to obtain the beam blur using a function obtained by fitting. Alternatively, in order to delete a calculation time, a table obtained by tabulating results of the experiments is employed to obtain the beam blur $\delta$.

For instance, as conceptually shown in FIG. 16, a collective irradiation region 250×250 $\mu m^2$ is divided into regions of 10×10, beam blurs $\delta$ ($\mu m$) are measured at each of the middle points attached with symbols x to tabulate results of the measurement as shown in FIG. 17. The numbers 0 to 9 of FIGS. 15 and 16 indicate the central positions of respective regions in the X direction and Y direction. A beam blur $\delta$ at an arbitrary point under collective irradiation can be obtained by two-dimensional interpolation in the table.

Alternatively, dependency of a beam blur on an area for collective irradiation, a position in a collective irradiation region, a local aperture area in the collective irradiation region and a current density is derived by simulation in which an optical system of each electron beam apparatus is taken into consideration to obtain a beam blur $\delta$ from the equation expressing the relationships.

Further, for example, the overall dependency can also be obtained in combination of a dependency of a beam blur $\delta$ on position in a collective irradiation region obtained by experiments and a dependency of a beam blur $\delta$ on an irradiation area obtained by simulation.

Fourth Embodiment

Then, description will be given of an electron beam exposure method using a proximity effect correction method of the fourth embodiment of the present invention with reference to FIGS. 18 to 23.

In the above first to third embodiments, an auxiliary exposure shot of an adjusted auxiliary exposure dose is generated for an auxiliary area short of an exposure intensity, and therefore since the number of auxiliary exposure shots increases, thereby enlarging extremely the exposure time. Therefore, in the fourth embodiment of the present invention, an auxiliary exposure mask is prepared and an auxiliary exposure is collectively performed over a large area similarly to the major exposure.

Figure 18:
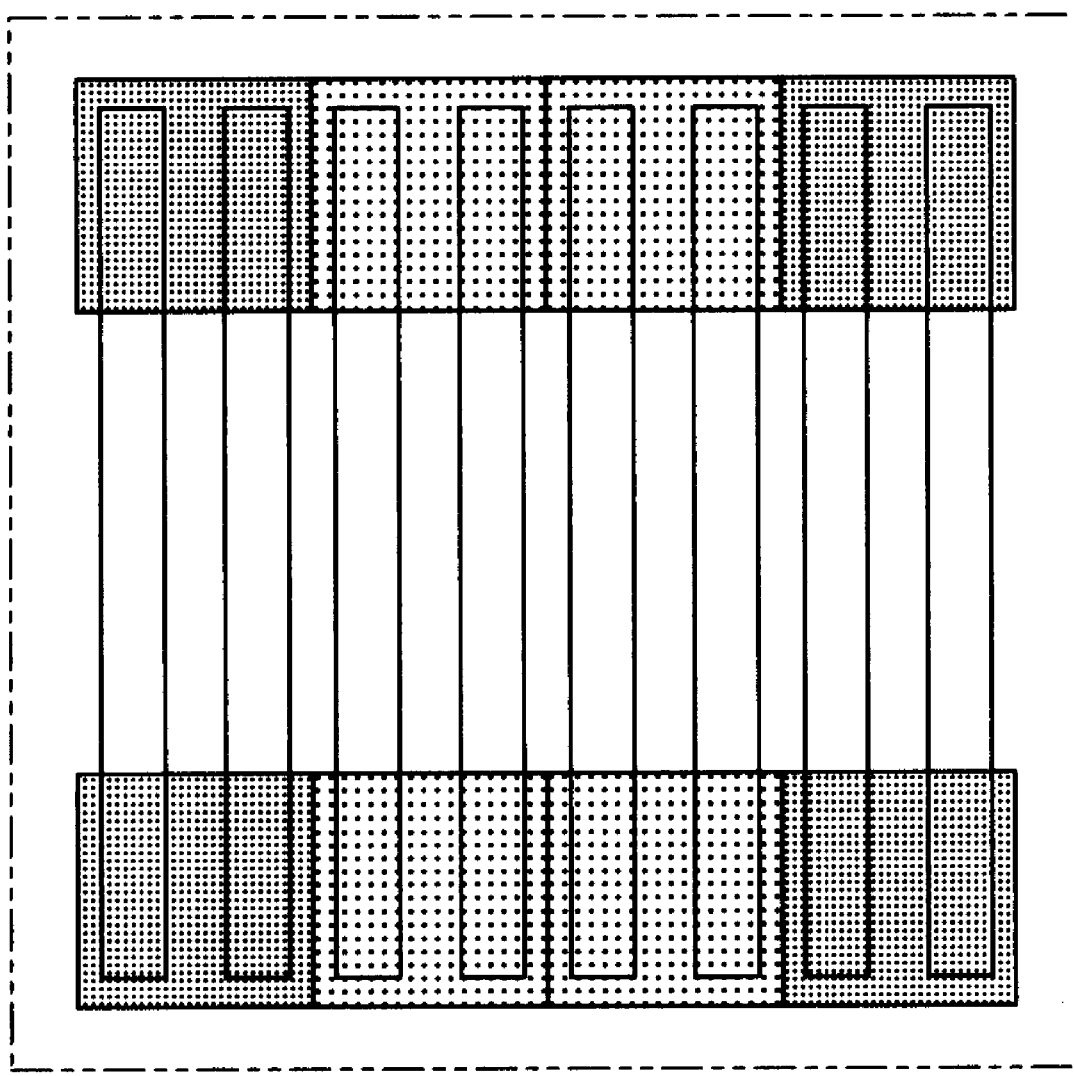
FIG. 18 is an illustration showing exposure data as an image after an exposure dose is adjusted and an auxiliary exposure shot is generated.
Figure 19A:
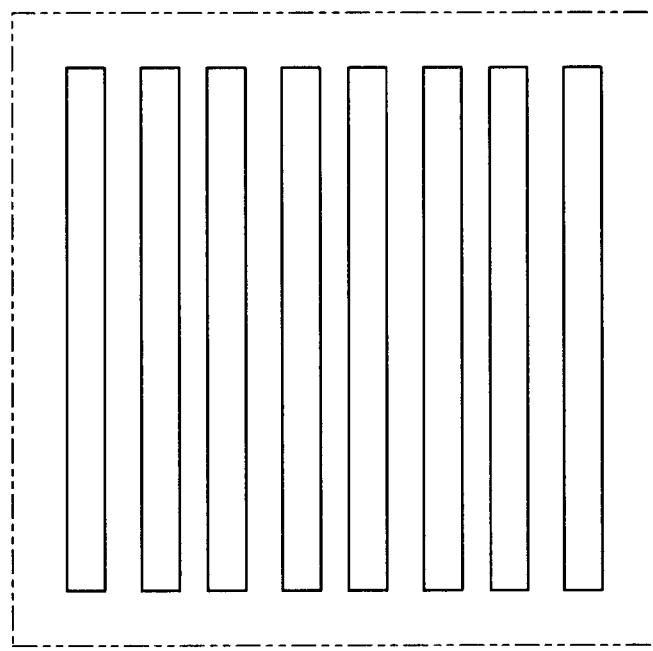
FIGS. 19(A) and 19(B) are diagrams showing main exposure data and auxiliary exposure data, respectively, extracted from the exposure data of FIG. 18 as images.
Figure 19B:
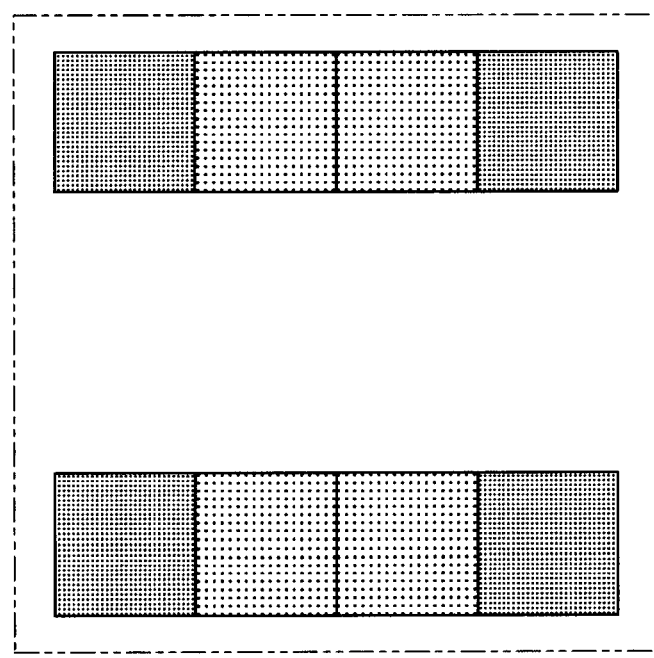

FIGS. 18 to 20 are illustrations, each indicating exposure data with an image. In one of the above first to third embodiments, preparations are made for exposure data after an exposure dose is adjusted and an auxiliary exposure shot is generated (FIG. 18). Then, major exposure data and auxiliary exposure data are separated from the exposure data (FIGS. 19(A) and 19(B)) and finally, the auxiliary exposure data is replaced with a pattern of an area density equivalent to an exposure dose of an auxiliary exposure shot (FIG. 20), which is then used as data for an auxiliary exposure mask data.

Then, description will be given of a method for employing, instead of auxiliary exposure data, a pattern group of an area density $\alpha$ having an exposure intensity equivalent to an auxiliary exposure shot of an exposure dose Qaux.

Let us assume that an exposure intensity of a large pattern at the center is 1. This pattern is divided into a pattern group having an area density $\alpha$, where an exposure intensity at the center of each division pattern is α. Hence, in order to draw with an exposure dose Q0 to attain an effect of an auxiliary exposure shot of an exposure dose Qaux, the auxiliary exposure shot is divided into a pattern group having an area density α=Qaux/Q0.

Figure 21A:
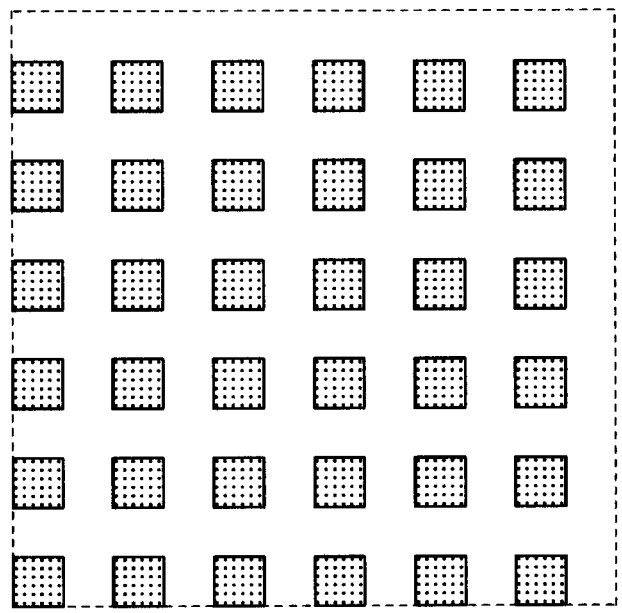
FIGS. 21(A) and 21(B) are illustrations showing a pattern having an area density equivalent to an exposure dose of an auxiliary exposure shot, constituted of in a mesh arrangement and a parallel strip arrangement, respectively.
Figure 21B:
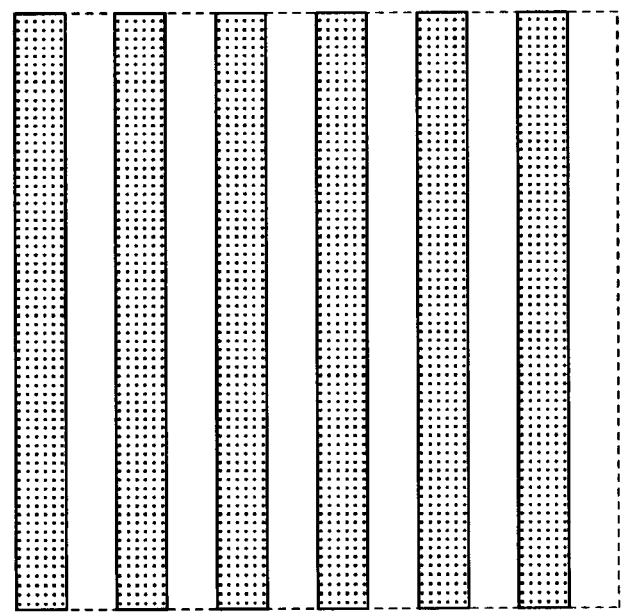

It is difficult to form a pattern group divided into sufficient fine size because of limitations on a pattern size and a space allowable in fabrication of a mask. FIGS. 21(A) and 21(B) show two lattice pattern groups formed of in a mesh arrangement and a parallel strip arrangement, respectively, and both the arrangements are used to attain pattern groups having a relative small area density and a relative large area density, respectively.

Figure 22:
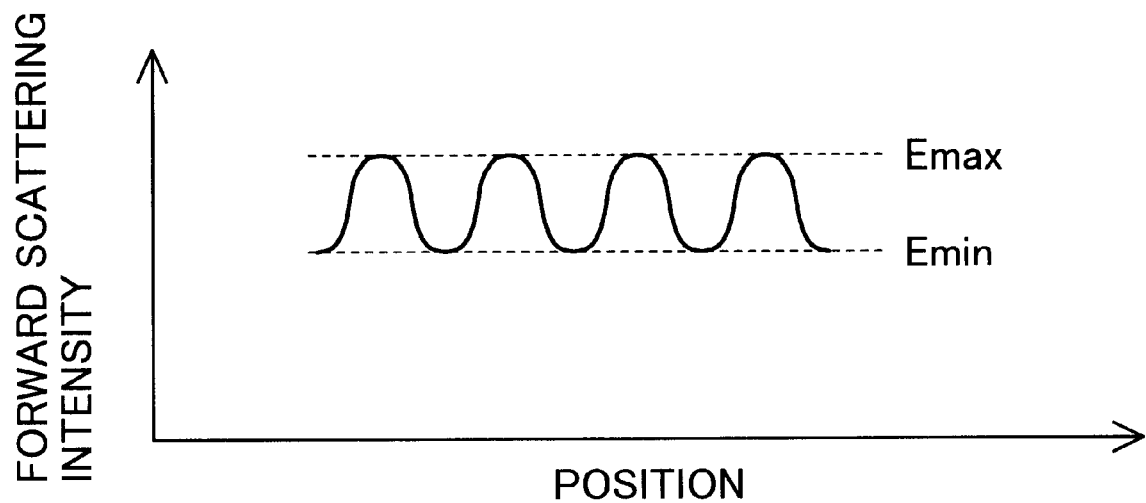
FIG. 22 is a graph showing a forward scattering intensity distribution of the parallel strip pattern of FIG. 21(B) in a simplified model.

FIG. 22 is a schematic graph showing a forward scattering intensity distribution of the parallel strip pattern of FIG. 21(B), where the exposure intensity is higher at a place where a pattern is located and lower at a place where no pattern is located. It is important that a maximum value Emax and a minimum value Emin of a forward scattering intensity is regarded almost zero. The unevenness of backscattering can be neglected.

Figure 23:
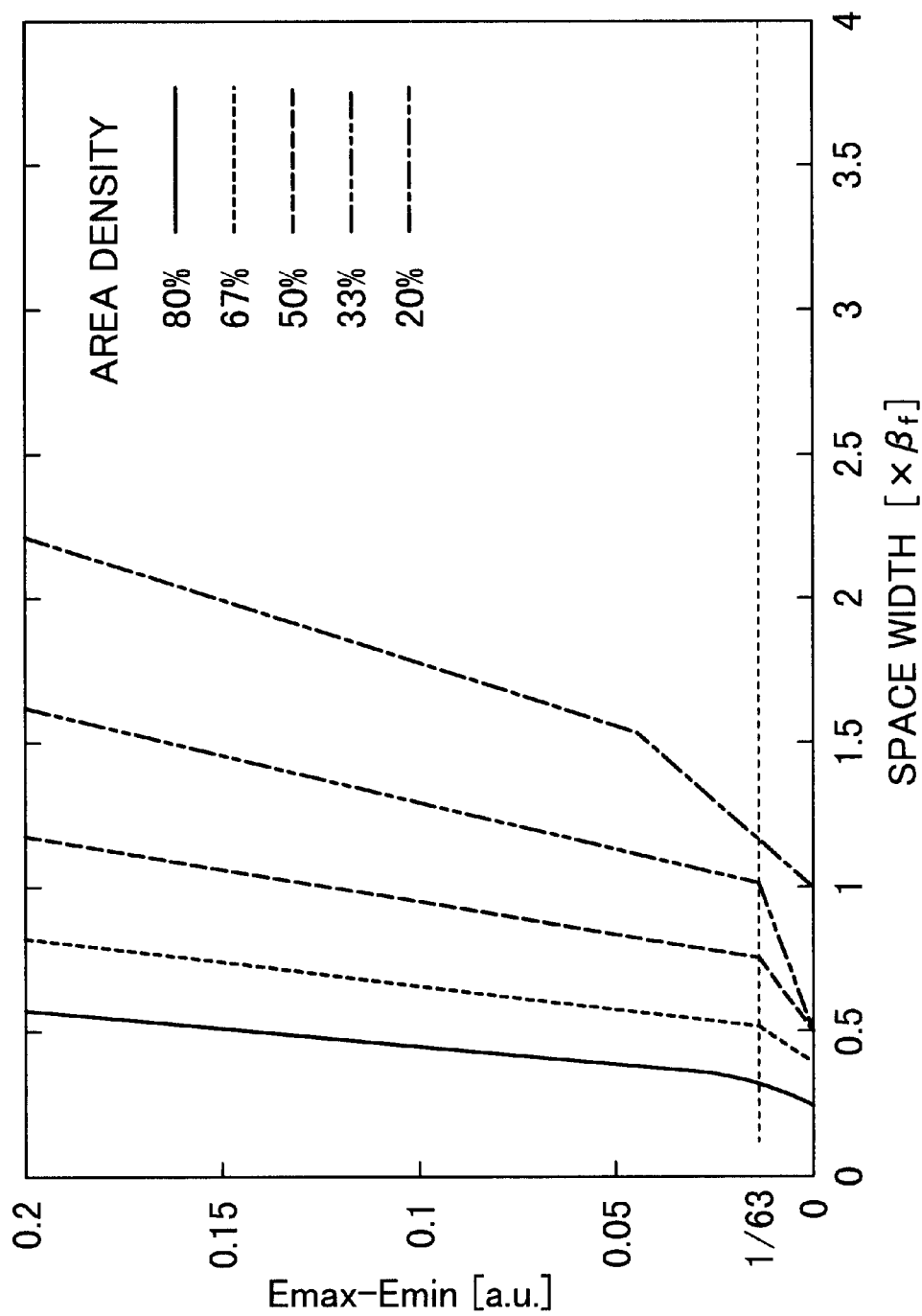
FIG. 23 is a graph showing a relationship between a space width (its unit is a forward scattering length $\beta_f$) of the parallel strip pattern, and a difference Emax−Emin (an arbitrary unit) between a maximum value and a minimum value of a forward scattering intensity at each of area densities.

FIG. 23 is a graph showing a relationship between a space width (a unit is a forward scattering length $\beta_f$) of the parallel strip pattern (line and space pattern) of FIG. 21(B) and a difference Emax−Emin (an arbitrary unit). For instance, in a case where Emax−Emin is regarded almost 0 when Emax−Emin≤1/63, it is required that a pattern width and a space width are both equal to or less than $0.75\beta_f$, in order to fabricate a parallel strip pattern of an area density of 50%.

However, since in this embodiment, only auxiliary exposure is formed on a mask, use of an electron beam with a blur at some extent arises no problem in accuracy of a pattern and thereby an effective forward scattering length can be enlarged, which allows meeting a request for a short size of 0.75 times a forward scattering length.

According the fourth embodiment, since auxiliary exposure can be collectively performed for a large region similarly to a major exposure mask, a throughput in an exposure process can be improved.

Fifth Embodiment

Then, description will be given of an electron beam exposure method using a proximity effect correction method of the fifth embodiment of the present invention with reference to FIGS. 24 to 28.

Figure 12:
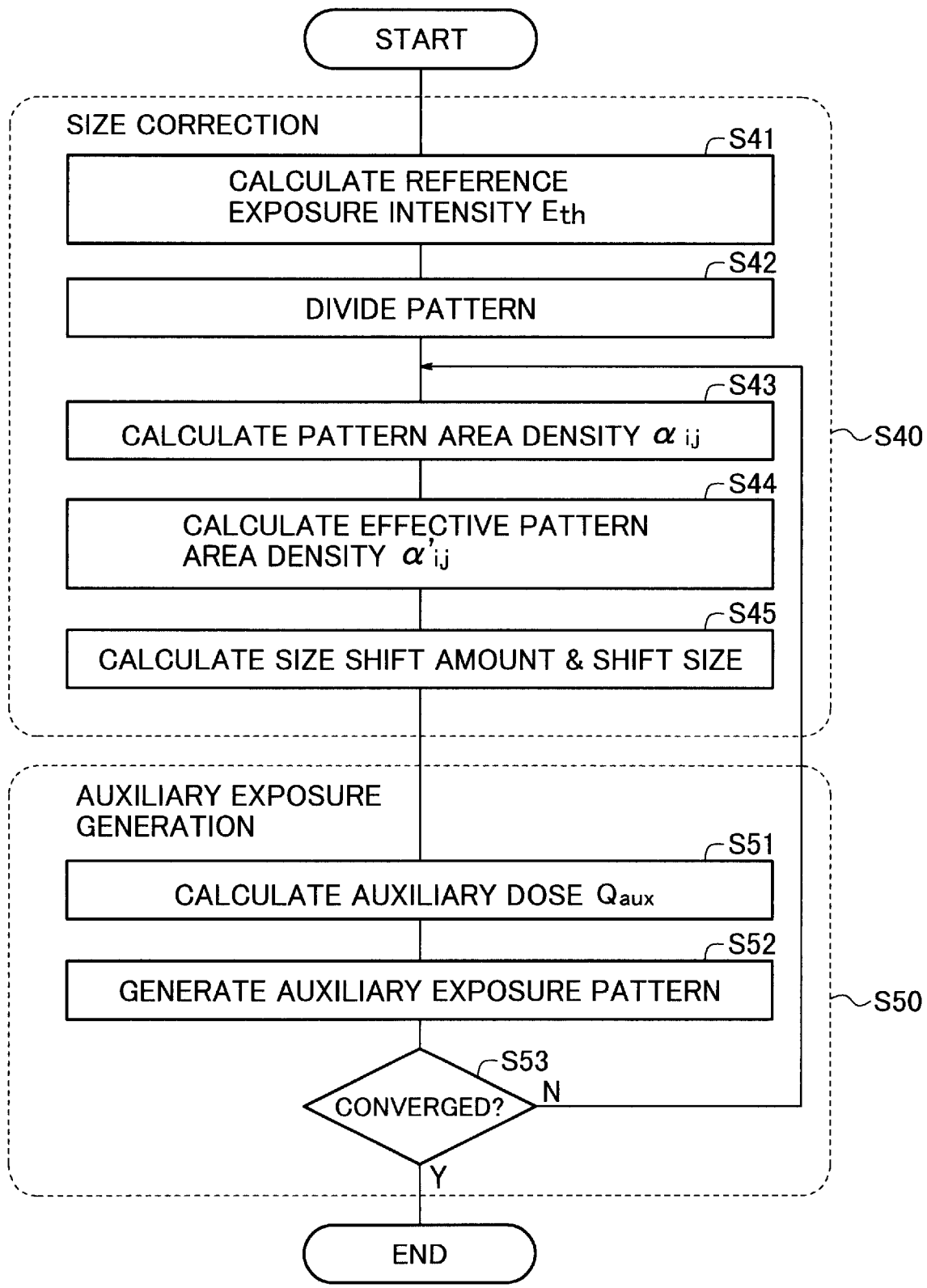
FIG. 12 is a general flow chart showing a procedure for a proximity effect correction method used in an electron projection method of a third embodiment of the present invention.
Figure 24A:
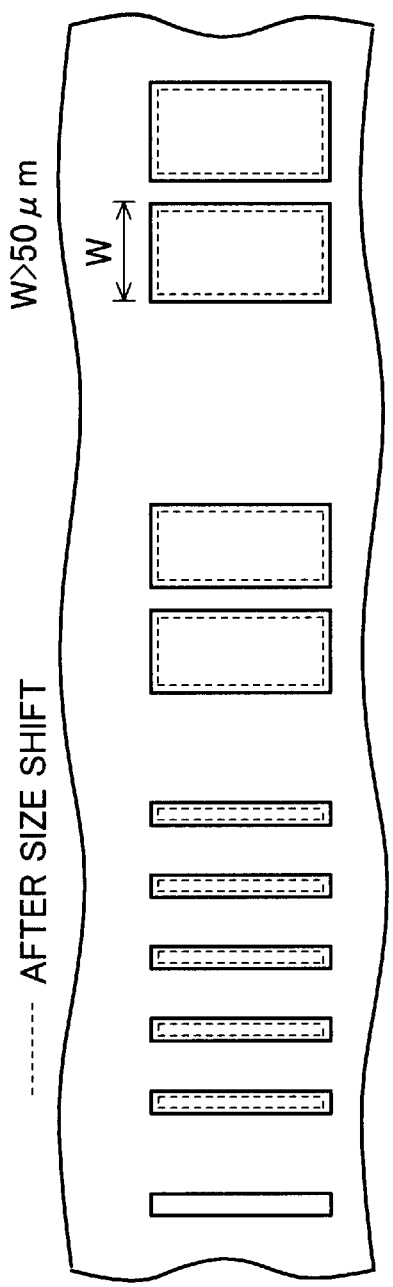
FIG. 24(A) is a diagram showing part of a collective transfer mask having large patterns adjacent to each other and used in an electron beam projection method and FIG. 24(B) is a graph showing an exposure intensity distribution of the pattern.
Figure 24B:
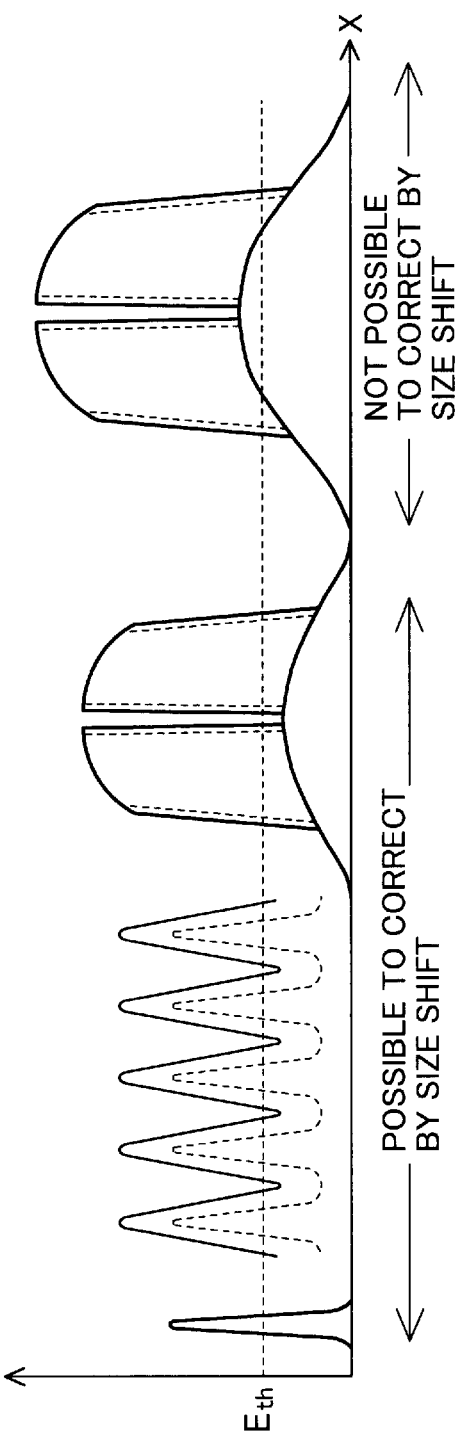

For example, in a case where rectangular patterns each having widths W and H both of 50 μm or more are closely formed as shown in FIG. 24(A) under conditions that an effective forward scattering length is 30 nm, an effective backscattering length is 30 μm and a backscattering coefficient is 0.6, a backscattering intensity in a space between patterns exceeds a reference exposure intensity Eth as shown in FIG. 24(B), and therefore a width at a reference exposure intensity Eth of an exposure intensity distribution cannot be made to coincide with the design width even if a pattern width is adjusted in step S45 of FIG. 12.

However, by altering part of a large rectangular pattern to a lattice pattern such as a parallel strip pattern with or without a cross-beam, or to a matrix pattern to reduce a pattern area density locally, a backscattering intensity in a space portion is decreased to a reference exposure intensity or lower, thereby enabling correction of such a pattern.

Figure 25:
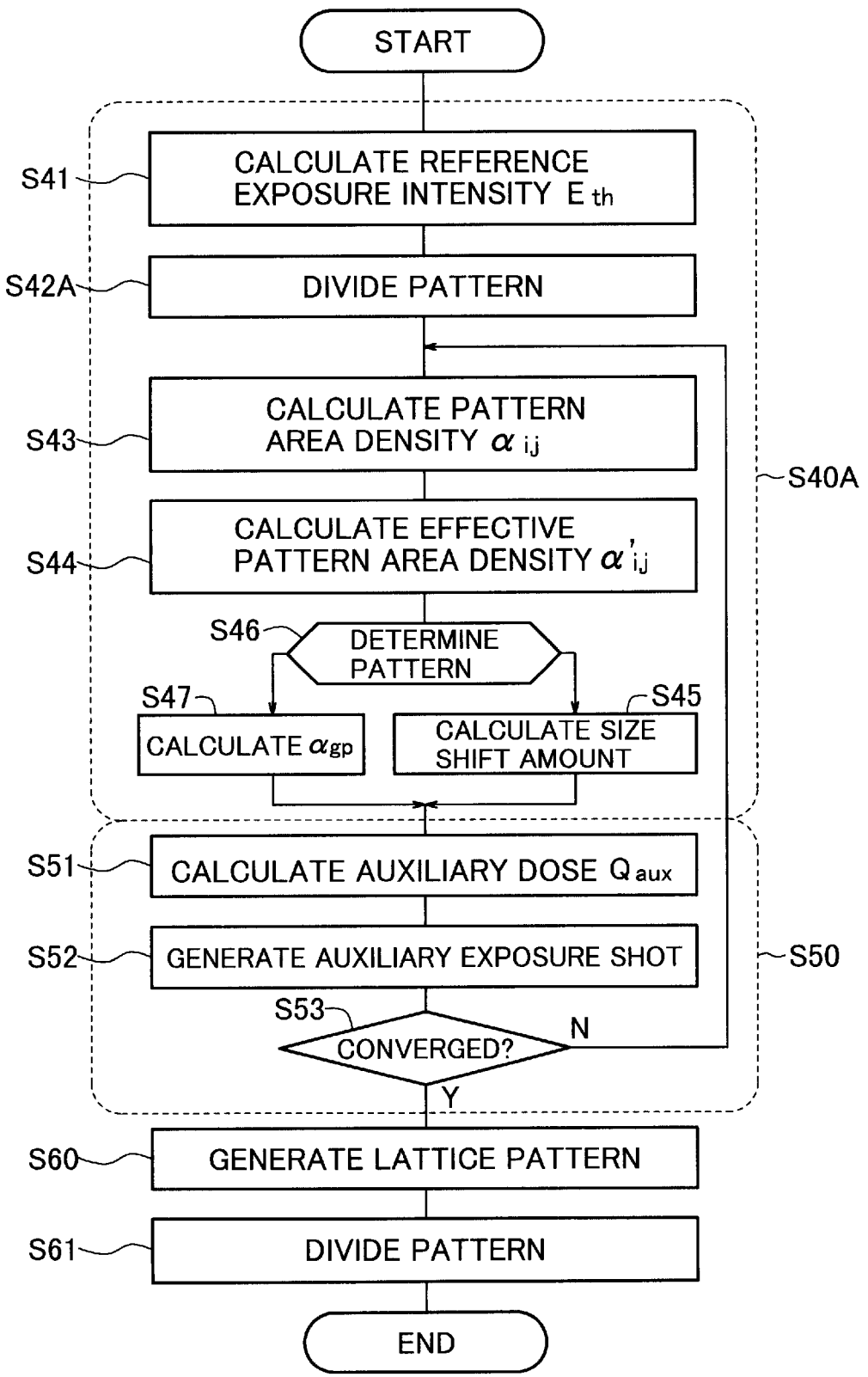
FIG. 25 is a general flow chart showing a procedure for a proximity effect correction method, which is the improvement of the method of FIG. 12, of a fifth embodiment of the present invention.

FIG. 25 is a general flow chart showing a procedure for a proximity effect correction method of the fifth embodiment of the present invention, which is the improvement of the method of FIG. 12.

FIG. 25 is a processing obtained by adding steps S46 to S48, S60 and S61 to the processing of FIG. 12. Further, in order to generate a lattice pattern, all of a region of the pattern as shown in FIG. 24(A) is uniformly divided into a size of, for example, about $(\beta_b/10)$ as shown with solid lines in FIG. 26(B). Dotted lines in FIG. 26(B) represent a mesh as described above.

Figure 26A:
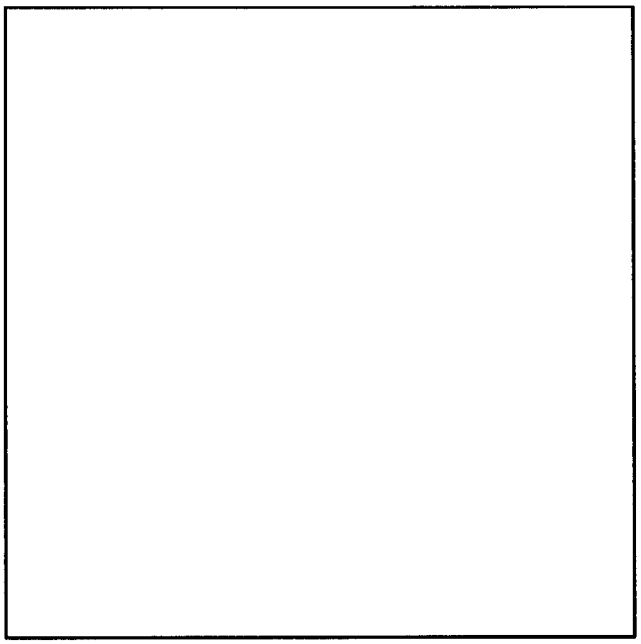
FIG. 26(A) is an illustration of a pattern before division and FIG. 26(B) is an illustration in which hatching is applied in a size shift region of the pattern after division and a pattern area density calculation mesh is indicated by dotted lines.
Figure 26B:
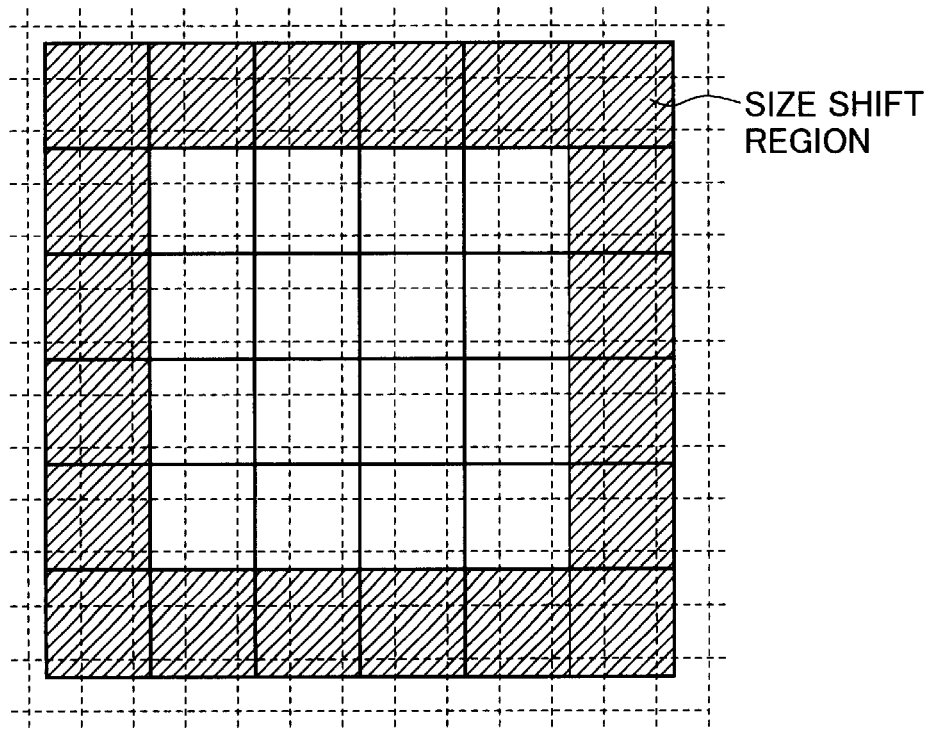
Figure 27A:
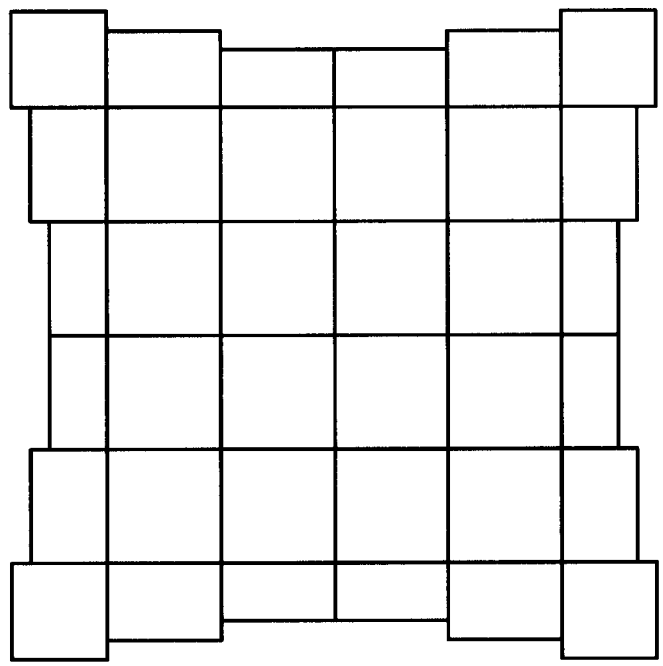
FIG. 27(A) is an illustration showing a pattern size-shifted in step S45 of FIG. 25

(S46) Among rectangular patterns obtained by the division in step S42A, division patterns in contact with a boundary of the original pattern, for example division patterns in a region applied with hatching as shown in FIG. 26(B), is subjected to adjustment in pattern width as shown in FIG. 27(A) by performing a processing which is the same as in step S45 of FIG. 12. The processing in step S45 is also performed on part of the original pattern, which has not been divided because of its smallness.

A processing in step S47 is performed on four side abutting patterns in an inside region surrounded by the region applied with hatching of FIG. 24(B). The four side abutting patterns refer to division patterns whose four sides are all in contact with sides of other division patterns. Such division patterns are free from requirement of size accuracy, but because they are each a relatively large pattern, a backscattering intensity is relatively large. For this reason, the four side abutting patterns exert a great influence on the division pattern in contact with the boundary of the original pattern, thereby generating fluctuations in completion size with ease.

Figure 27B:
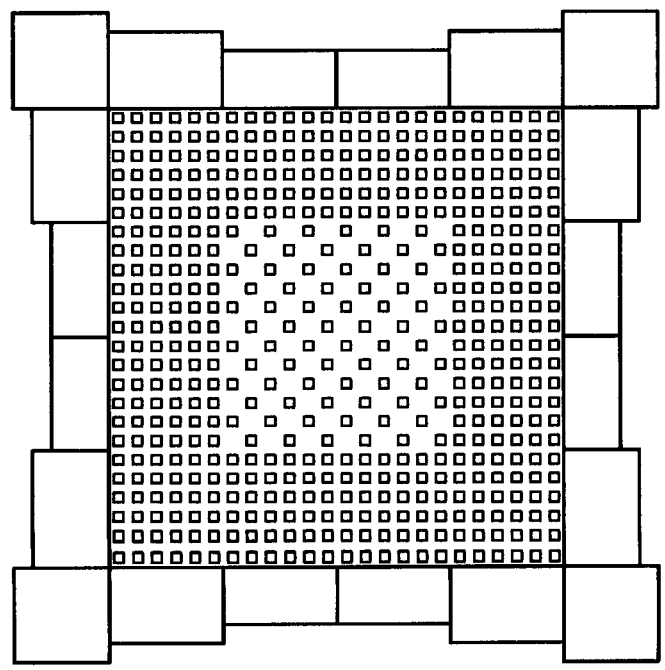
FIG. 27(B) is an illustration showing a lattice pattern generated in step S60 of FIG. 25 on the basis of a pattern area density calculation in step S47 of FIG. 25.

(S47) Area densities $\alpha_{gp}$ of the division patterns in the inside region are calculated using the following equation since each of division patterns in the inside region is converted to, for example, a lattice pattern having a pattern area density $\alpha_{gp}$ as shown in FIG. 27(B) in later step S60:

$$\alpha_{gp}(F_f\min+(\alpha_p'/\alpha_{gpb})\eta)=kEth \qquad (29)$$

where $\alpha_{gp}$, $F_f\min$, $\alpha_p'$ and $\alpha_{gpb}$ are all for a division pattern of interest and the forward scattering intensity reduction ratio $F_f\min$ is a ratio between the minimum value Emin and an average intensity (Emax+Emin)/2 of a forward scattering of the lattice pattern, which is 1 or less. The term $\alpha_p'$ is the minimum value of effective pattern area densities of squares included in the division pattern of interest, calculated in step S43. A pattern area density αi,j in step S43 after the first round of repeating loop including steps S43 to S53 is obtained by taking into consideration a lattice pattern in step S47 and a size shift in step S45. The term $\alpha_{gpb}$ is a previous value of $\alpha_{gp}$ and has an initial value of 1 and when it is determined to have been converged in step S53, $\alpha_{gpb}=\alpha_{gp}$. The k is a constant 1 or more.

When converged, $\alpha_{gp}\times F\min$ is almost equal to the minimum value (corresponding to the minimum value described above) of a forward scattering intensity of the division pattern of interest having a pattern area density $\alpha_{gp}$ and $(\alpha_{gp}/\alpha_{gpb})\alpha_p'\cdot\eta=\alpha_p'\cdot\eta$ is a backscattering intensity of the division pattern of interest having a pattern area density $\alpha_{gp}$. That is, the lattice pattern area density $\alpha_{gp}$ in the division pattern of interest is determined such that the minimum exposure intensity of a lattice pattern in the division pattern of interest is a value of k times Eth.

By reducing a pattern area density of the inside region in such a way, the problem of fluctuations is solved. Further, perfect correction is enabled on even a pattern on which perfect correction cannot be achieved only by adjustment in pattern width since a backscattering intensity is larger than a reference forward scattering intensity. By determining $\alpha_{gp}$ using the above equation (29), it is guaranteed that no impossibility of development due to shortage of exposure is encountered even with the minimum value of a forward scattering intensity after conversion to a lattice pattern.

Part of a pattern may not be developed due to fluctuations in exposure dose when a value of k is excessively close to 1, while a backscattering intensity is not sufficiently reduced when it is excessively large, and therefore it is preferable to set a value of k about 1.2.

Further, a forward scattering intensity reduction ratio $F_f$min alters according to a relationship between a forward scattering length and a space width or a pitch of a lattice pattern. Therefore, it is suitable to determine a forward scattering intensity reduction ratio $F_f$min on the basis of an expected minimum pattern area density, the minimum space width required in mask fabrication and so on.

$\alpha_{gp}$ is substituted for $\alpha_{gpb}$.

(S60) A lattice pattern is generated on the basis of a pattern area density $\alpha_{gp}$ after the convergence.

In a case where, for example, a division pattern has a size $3 \times 3$ $\mu m^2$ and $\alpha_{gp}$=0.5, if the division patterns are converted to a line and space pattern, for example, 50 line patterns each having a width 30 nm and a length 60 nm are generated at a pitch 60 nm, while if converted to a zigzag lattice pattern, for example, rectangular patterns each having a size 30×30 $nm^2$ are generated in a matrix of 70×70 at pitches 42.7 nm in longitudinal and lateral directions, respectively.

In the process, it should be noted that if a pattern width and a space width are excessively small, mask fabrication is difficult, while if they are excessively large compared with a forward scattering length, local reduction in exposure intensity arises falling into developing a lattice pattern. In order to avoid such inconveniences, it is required to set suitable conditions for pattern generation when generating the pattern. For instance, in a case where a forward scattering length is 30 nm and the minimum aperture width of a mask is 30 nm, a fixed space width of 30 nm is one preferable condition. Further, a fixed pitch, for example, 2 times a forward scattering length is another preferable condition. Moreover, a method selectively using a zigzag lattice pattern or a line and space pattern according to a value of a pattern area density $\alpha_{gp}$ is useful in order to alleviate a difficulty in mask fabrication. This is because much narrower spaces are required in order to realize the same pattern area density $\alpha_{gp}$ as a line and space pattern using a zigzag lattice pattern in a condition of a constant pitch, narrower spaces are required, and therefore, for example, the zigzag lattice pattern is selected in a case where a pattern area density $\alpha_{gp}$ is less than 50%, while the line and space pattern is selected in a case where it is 50% or more, thereby preventing generation of a crossbeam having an extremely narrow width and therefore reducing difficulty in fabrication of a mask to decrease.

(S61) Then, a pattern generated in step S60 is divided.

A pattern shown in FIG. 27(B) has an aperture in the shape of a doughnut for reduction in pattern edge flatness and since there is nothing in a central portion, such a pattern cannot be realized. The doughnut pattern is usually divided into two patterns and corresponding masks are fabricated for the respective patterns, requiring two times of exposure.

Figure 28A:
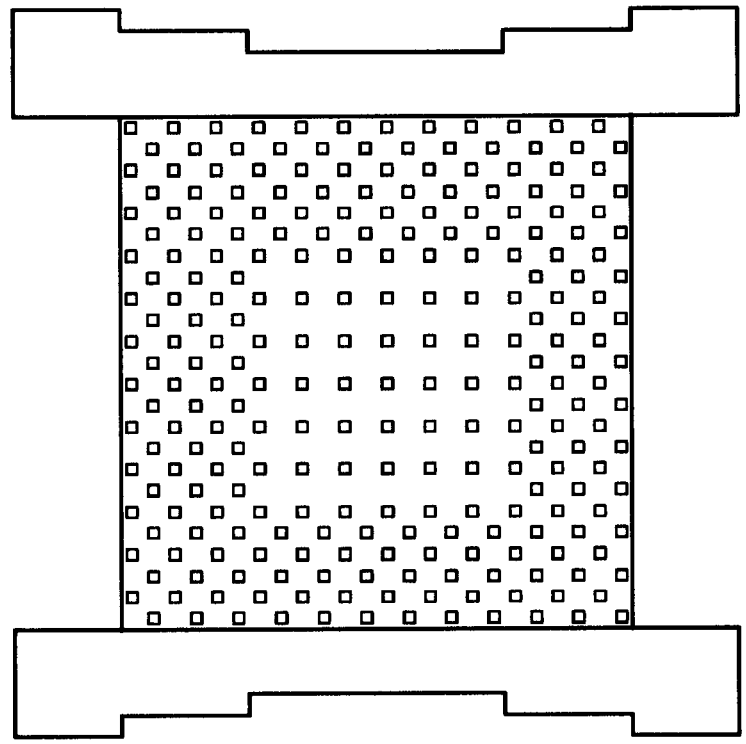
FIGS. 28(A) and 28(B) are illustrations showing respective patterns obtained by dividing the pattern of FIG. 27(B) into 2 respective parts in step S61 of FIG. 25.
Figure 28B:
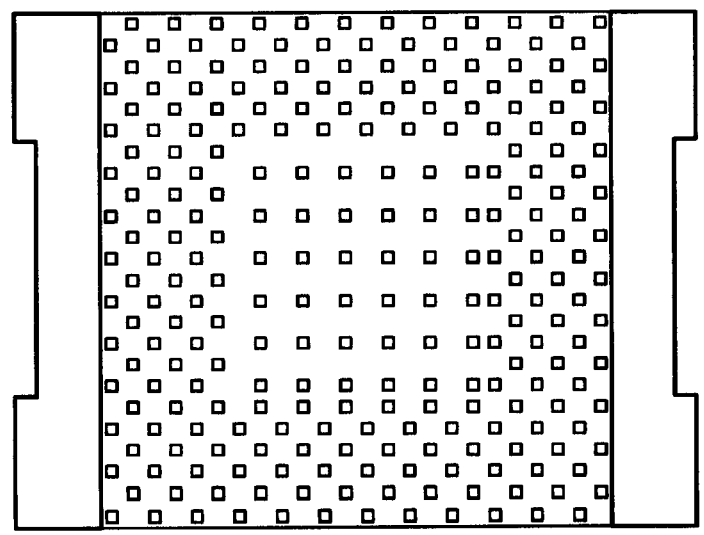

The pattern of FIG. 27(B) is divided into, for example, a pattern of FIG. 28(A) and a pattern of FIG. 28(B). A peripheral pattern is divided into a longitudinal pattern and a lateral pattern and a lattice pattern is uniformly divided. There are two reasons for the uniform division. The first reason is that making aperture areas to be almost the same as each other prevents one of the two exposure from having a Coulomb's effect extremely larger than the other. The second reason is that fabrication of a mask for a lattice pattern with a small pitch or space is very difficult, but uniformly dividing the patterns with two masks allows increasing the pitch by two times, which not only makes it easy to fabricate a mask, but also improves durability of the mask.

Note that an effective pattern area density $\alpha_p'$ used in calculation for a pattern area density $\alpha_{gp}$ is not required to be the minimum value in division patterns, but may be the maximum value, the average value, the value of a square having a pattern gravity center, or an weighted average over squares included or shared by another division pattern. Further, as a calculation method for a pattern area density $\alpha_{gp}$, the following selected values or equation may be used:

If $\alpha_p' \geq 0.5$, $\alpha_{gp}$=0.5, and if $\alpha_p'<0.5$, $\alpha_{gp}$=1.0.

or if $\alpha_p'>0.5$, $\alpha_{gp}$=0.5/$\alpha_p'$.

Further, in a case where even if a mask is an aperture mask, there is no doughnut pattern in a chip and only one major exposure mask is used, one of the following methods are used:

(1) In a case where a pattern is originally part of a large pattern, the process advances to step S47 without performing a determination processing in step S46 of FIG. 25, thereby preventing generation of a doughnut pattern.

Figure 29A:
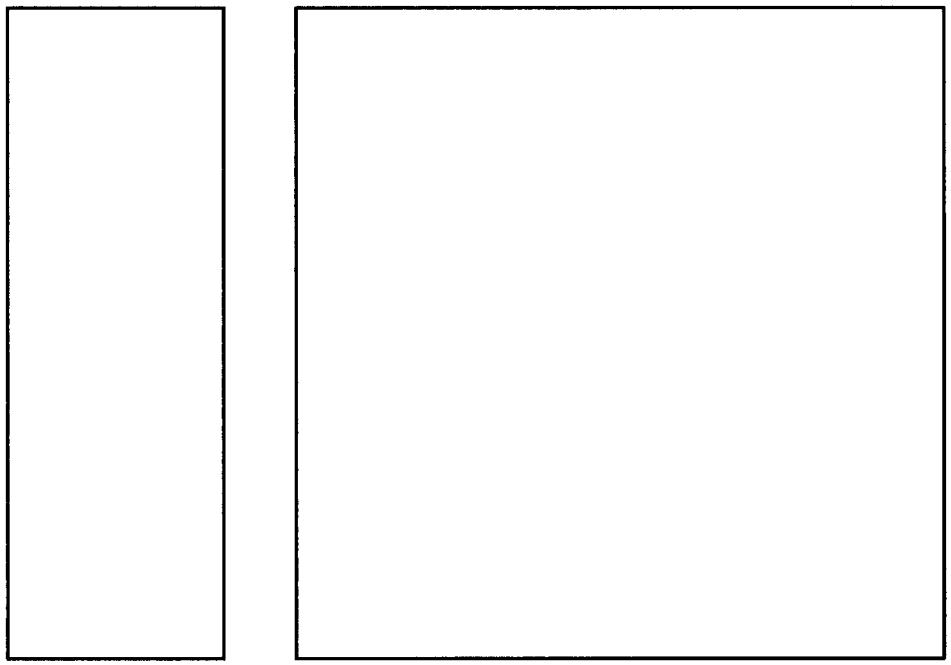
FIG. 29(A) is an illustration showing another pattern before division and FIG. 29(B) is an illustration showing a lattice pattern generated in step S60 of FIG. 25 on the basis of a pattern area density calculation in step 47 of FIG. 25.
Figure 29B:
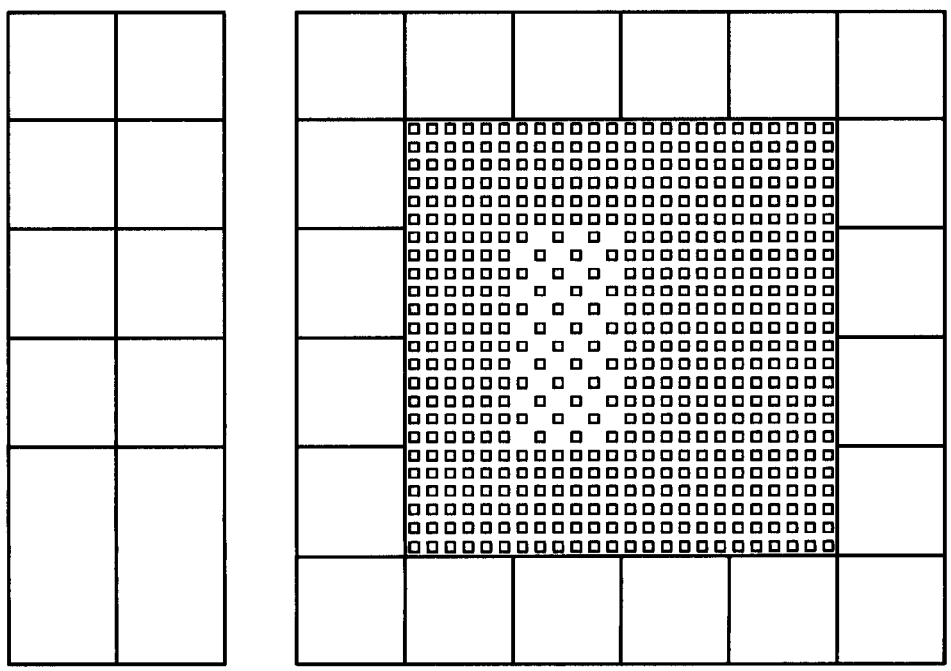
Figure 30:
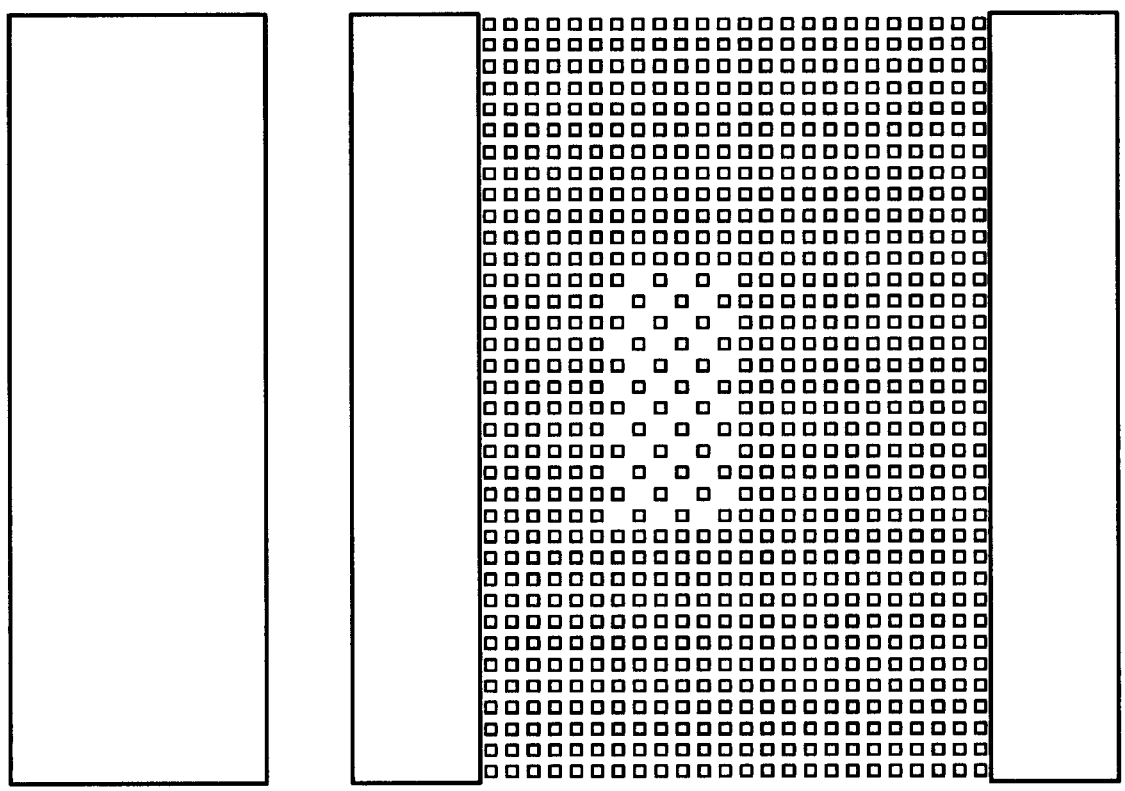
FIG. 30 is an illustration for explaining region expansion of a lattice pattern, performed instead of step S61 of FIG. 25 on the pattern of FIG. 29(B) so as not to generate a doughnut pattern.

(2) Instead of step S61 of FIG. 25, expansion of a region of a lattice pattern is carried out as follows. For instance, in a case where in step S60, a lattice pattern is generated in part of a pattern of FIG. 29(A) as shown in FIG. 29(B), a region expansion of a lattice pattern is performed up to an exposure boundary in parallel to a side having the highest backscattering intensity, among exposure boundaries of the originally pattern. In the expended region, for example, a zigzag lattice pattern or a line and space pattern with a width 30 nm is generated.

Further, in a case where a single major exposure mask is used such as a case where a membrane mask sustains a doughnut pattern, no pattern division in step S61 is required.

Furthermore, in a case where an especially fine pattern is desired to draw with good accuracy, in order to reduce a beam blur caused by a Coulomb's effect in the proximity of the fine pattern, pattern division may be performed so as to reduce a total area of a fine pattern side.

Sixth Embodiment

Figure 31:
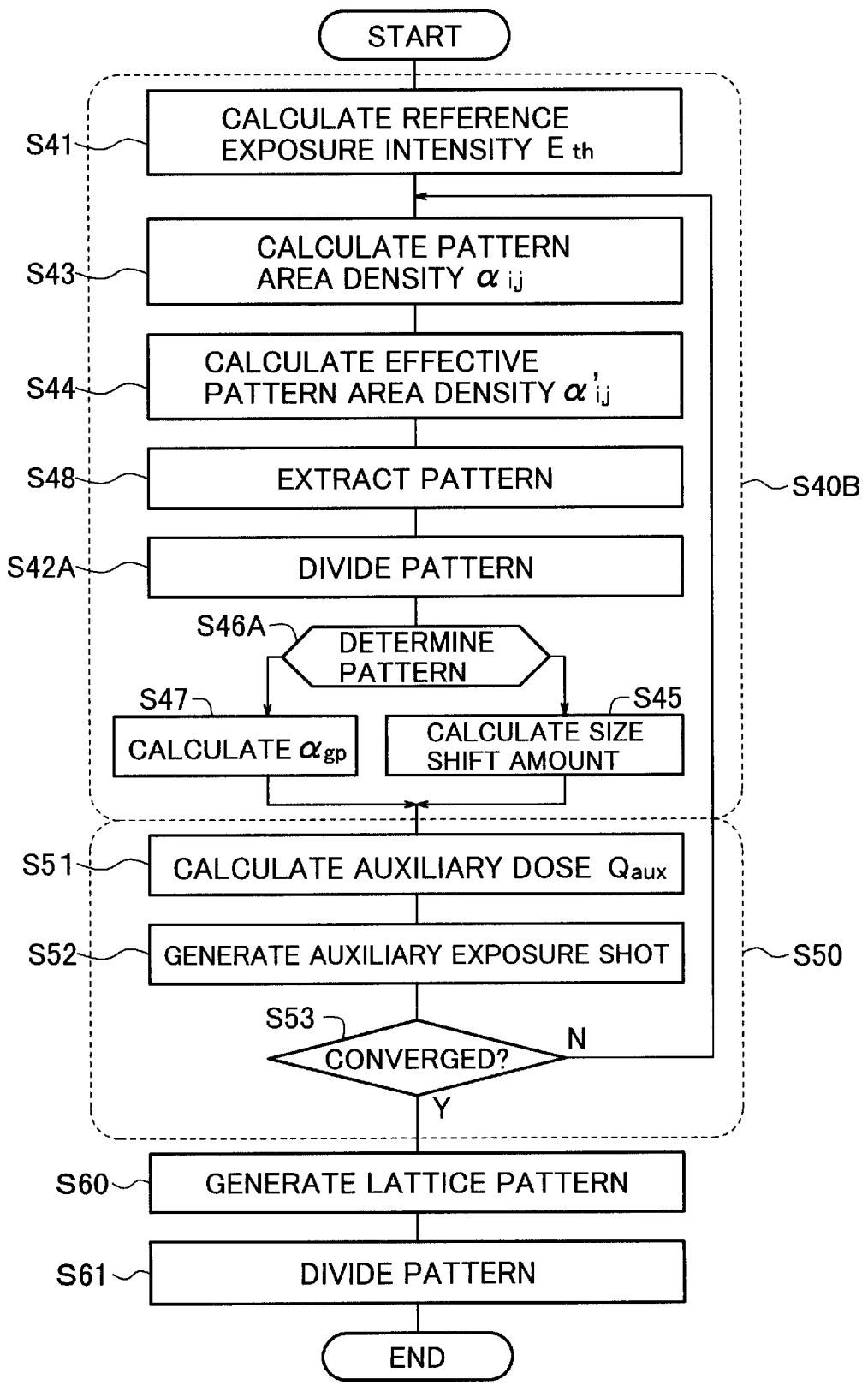
FIG. 31 is a general flow chart showing a procedure for a proximity effect correction method, which is the improvement of the method of FIG. 25, of a sixth embodiment of the present invention.

Then, description will be given of an electron beam exposure method using a proximity effect correction method according to the sixth embodiment of the present invention with reference to FIG. 31.

In the fifth embodiment, the transfer was enabled by separating large patterns adjacent to each other shown in FIG. 24(A). However, in a case where the inside region described above exists when a pattern is divided in step S42A, a lattice pattern always occurs. Further, two major exposure masks are required.

Therefore, in the sixth embodiment of the present invention, a step S48 in which a pattern requiring reduction in its pattern area density is extracted is added to step S40B. In order to acquire information on which of patterns should be extracted, processing of steps S43 and S44 is performed prior to step S48.

(S48) It is determined whether or not $\alpha_p' \cdot \eta$ is larger than, for example, 80% or more of a reference exposure intensity Eth on squares including a pattern boundary in mesh arrangement, which has been set in step S43, and then extracted is a pattern whose boundary is included in a affirmatively determined square. The percentage is set high if a resist correctly provides a resolution even in a low contrast, but if not, the percentage is set low.

Then, after graphic division processing in step S42A is performed, the process advances to step S46A.

(S46A) Similarly to step S46 of FIG. 25, among rectangular patterns obtained by division in step S42A, patterns (peripheral patters) in contact with the boundary of the original pattern is subjected to the same processing as in step S45 of FIG. 12 to adjust a pattern width as shown in FIG. 27(A). However, the processing in step S47 is performed for patterns inside the peripheral pattern of only the pattern extracted in step S48.

The processing in steps S48 and S42A is performed only in the first round of the repeating loop.

The other points are the same as those in the fifth embodiment.

Seventh Embodiment

Figure 32A:
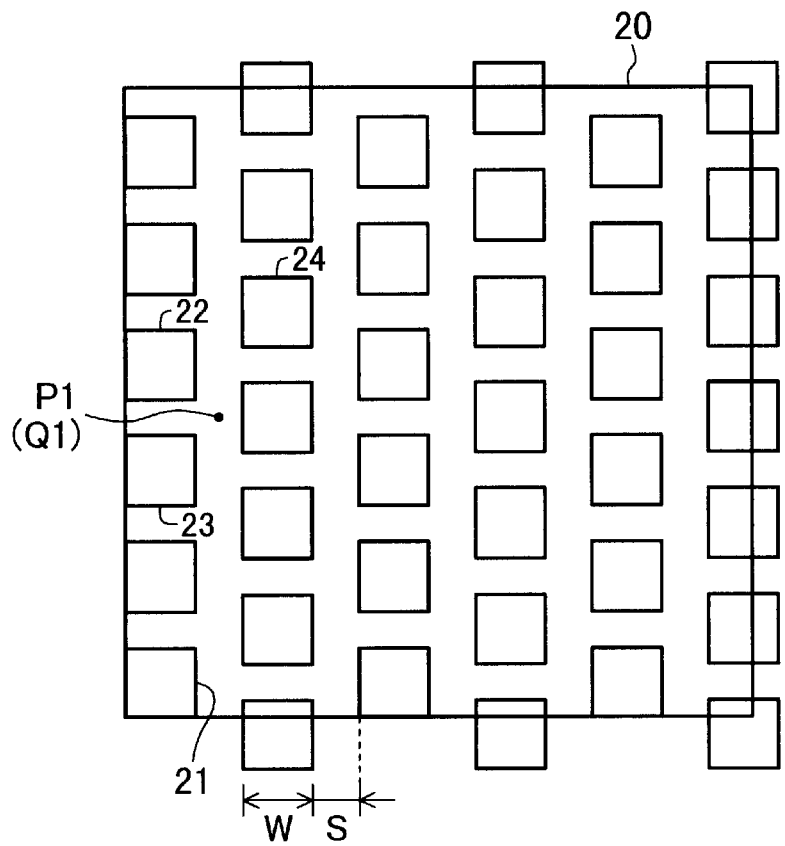
FIG. 32(A) is an illustration for a large rectangular/lattice pattern conversion method of a seventh embodiment of the present invention and FIG. 32(B) is an enlarged diagram of part of FIG. 32(A) for describing a forward scattering intensity calculation.

In a case where a sensitive substrate coated with a resist sensitive to a charge particle beam, for example an electron beam, is irradiated with the electron beam, and then developed to form a large rectangular pattern (resist pattern), for example a rectangle having a shorter side of 10 $\mu$m, a corresponding large rectangular pattern 20 as shown in FIG. 32(A) is also required to be formed on a mask. The large rectangular pattern 20 may be a rectangle inside a region applied with hatching of FIG. 26(B) or may be one of rectangle in matrix of 4 rows and 4 columns inside the hatched region, and in this case, the corresponding rectangle on a sensitive substrate is an imaginary one, which is not actually developed. For the above reason, in preparation of a mask data, the large rectangular pattern 20 is converted to a matrix pattern having small squares as pattern subshapes as shown in FIG. 32(A) in order to reduce an exposure dose. The matrix pattern is arranged such that two adjacent sides of a pattern subshape 21 of the large rectangular pattern 20 are in contact with two adjacent sides of the large rectangular pattern 20.

If a width W of a pattern subshape and a distance between adjacent pattern subshapes are larger, a mask pattern can be fabricated on a mask blank with higher accuracy, but a forward scattering intensity reduction ratio $F_f$min increases to produce an irregular shape indicating an exposure-short region. This can be avoided by allowing an exposure dose at the minimum exposure dose position Q1 in a transferred pattern region to be larger than a threshold value Eth. The position Q1 corresponds to a position P21 in the large rectangular pattern 20 of FIG. 32(A). A forward scattering intensity reduction ratio $F_f$min is a value in consideration of a margin, and the value is determined by taking into consideration the minimum size of a pattern that is allowable to be formed on a mask and $\beta_f$. Increasing the value is preferable from the viewpoint of exposure dose correction, but with the larger value, a pattern formed on a mask must be in smaller size, compared with $\beta_f$. An area density $\alpha_p$ (although in the fifth embodiment, a pattern area density of a lattice pattern is expressed with $\alpha_{gp}$, it is hereinafter simply expressed with $\alpha_p$) is determined by, for example, the method described in the above fifth embodiment.

Description will be given below of a method for determining a width W of a pattern subshape and a space with S in a case where a forward scattering intensity reduction ratio $F_f$min and a pattern area density $\epsilon_p$ are given.

A pattern area density $\alpha_p$ is geometrically obtained using a width W of a pattern subshape and a space width S subshapes as follows:

$$W^2/(W+S)^2 = \alpha_p \tag{30}$$

Figure 32B:
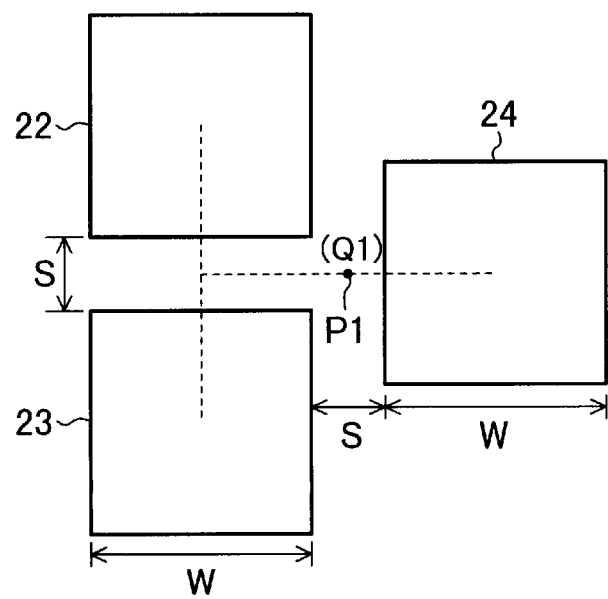

A cause for alteration of a position of an exposure intensity distribution is a forward scattering intensity component having a relatively small scattering radius. A forward scattering exposure intensity at a position Q1 on a sensitive substrate can be calculated approximately, for example, only using exposure with an electron beam passing through pattern subshapes 22 to 24 around the position P1. FIG. 32(B) is an enlarged view of a part of FIG. 32(A) for facilitating the understanding of a calculation formula for a forward scattering exposure intensity. The reduction ratio is set 1 for simplification. When a forward scattering intensity at the position Q1 is $F_{Lmin \times \alpha p}$, no shortage of exposure occurs on all of a transferred pattern region and this condition can be expressed by the following equation using a function $F_f$ of the above equation (27):

$$2 \times F_f((W+S)/2, (W+S)/2: W,W) + F_f((W+S)/2, 0: W,W) = F_f \min \times \alpha_p \tag{31}$$

Figure 33:
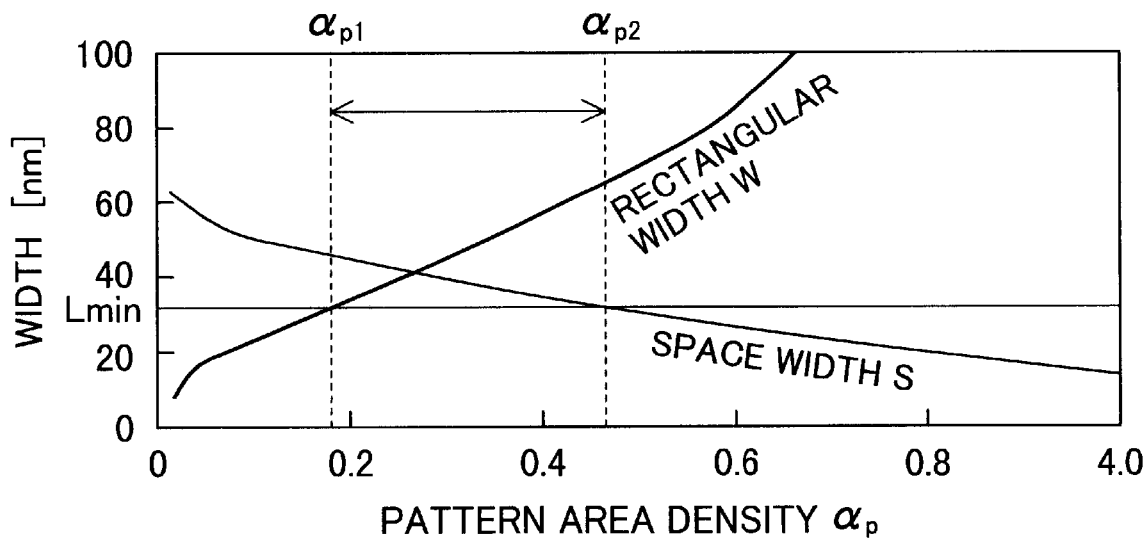
FIG. 33 is a graph showing calculation results of numerical values of a pattern subshape width W and a space width S with respect to a pattern area density $\alpha_p$ in a case where a lattice pattern is a matrix pattern, a forward scattering radius $\beta_f$=3 nm and a forward scattering intensity reduction ratio $F_f$min=0.7.

A pattern subshape width W and a space width S between subshapes are obtained by solving the simultaneous equations (30) and (31) with two unknowns, with a given pattern area density $\alpha_p$ and a given forward scattering intensity reduction ratio $F_f$min. FIG. 33 shows calculation results of numerical values of a pattern subshape width W and a space width S between subshapes with respect to a pattern area density $\alpha_p$ in a case of $\beta_f$=30 nm and $F_f$min=0.7.

Allowable lower limits Lmin for a pattern subshape width W and a space S width between subshapes are, for example, each 30 nm in order to secure a necessary accuracy of a mask pattern. In this case, a pattern area density $\alpha_p$ at which W>Lmin and S >Lmin is in the range of $\alpha_{p1} < \alpha_p < \alpha_{p2}$, that is, $0.25 < \alpha_p < 0.46$. If a pattern area density $\alpha_p$ is in the range, a matrix pattern can be used as a lattice pattern for reduction in exposure dose and the pattern subshape width W and the space width S between subshapes can be determined as described above.

Then, description will be given of a boundary processing for an obtained matrix pattern.

Figure 34A:
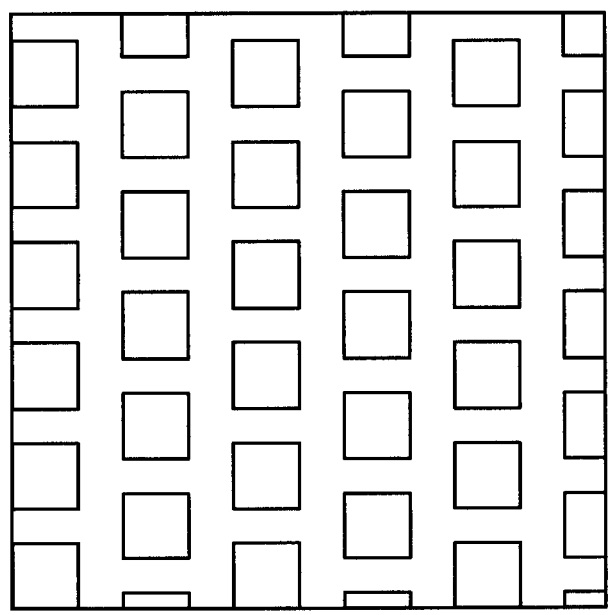
FIGS. 34(A) and 34(B) are illustrations for a boundary processing on the lattice pattern of FIG. 32(A)
Figure 34B:
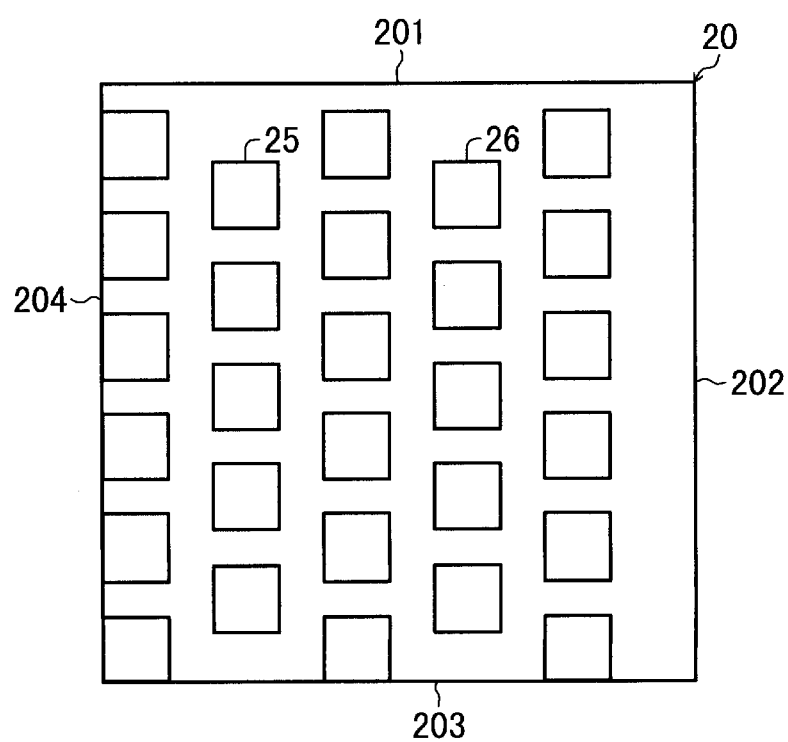
Figure 35:
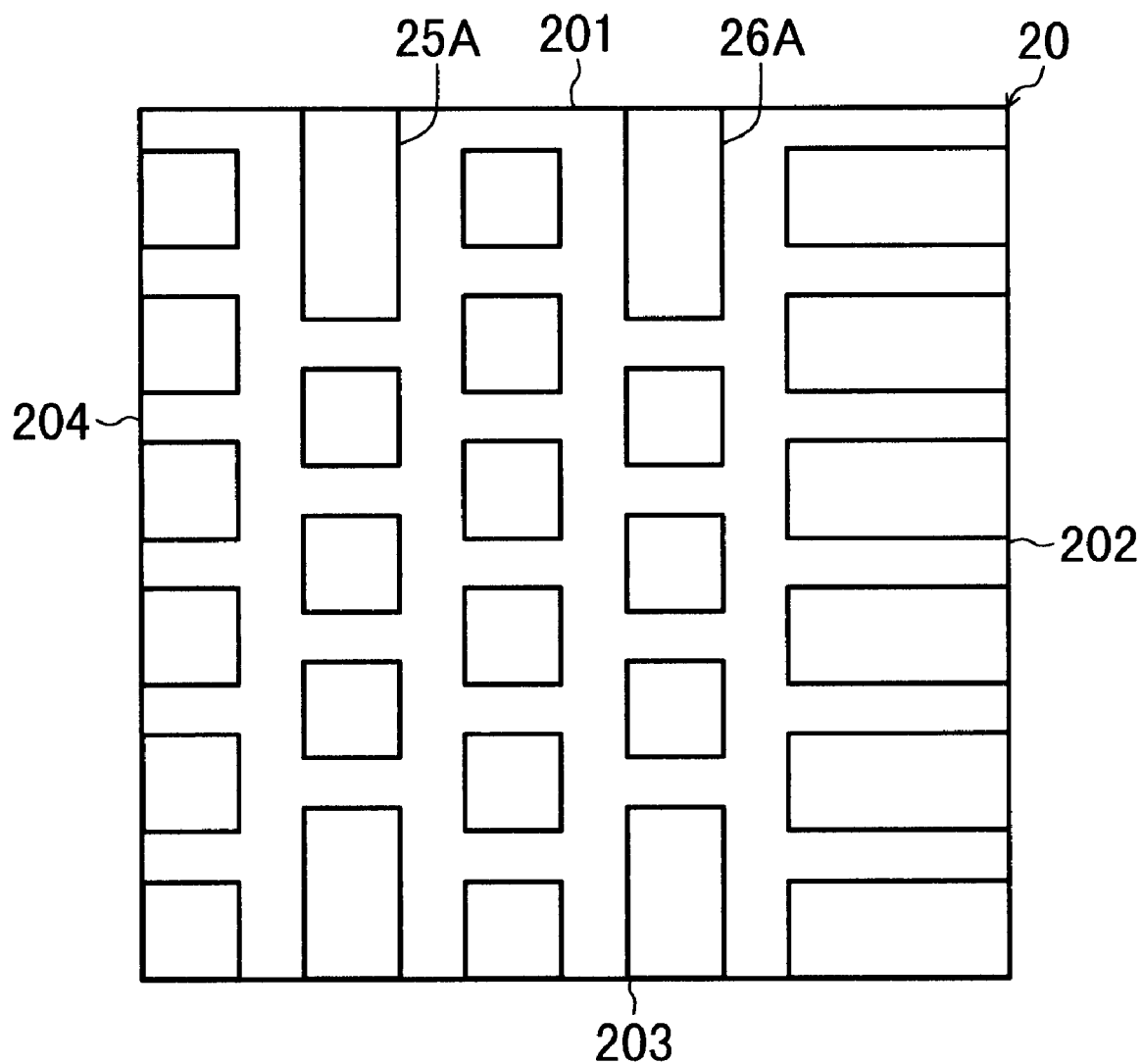
FIG. 35 is a diagram of a lattice pattern after boundary processing.

In order to improve a pattern edge accuracy, pattern portions outside the large rectangular pattern 20 in FIG. 32(A) are deleted to obtain a pattern as shown in FIG. 34(A). If pattern subshapes each partly deleted are formed on a mask substrate, a pattern accuracy decreases, and therefore they are perfectly deleted to obtain a pattern as shown in FIG. 34(B). This obtained pattern is equal to a figure-related logical product of the large rectangular pattern 20 and a matrix pattern. A size of a transferred pattern is smaller than desired due to the deletion. Therefore, pattern subshapes 25 and 26 having the respective sides, which face a side 201 of the large rectangular pattern 20 and are at a distance longer than a space width S from the side 201, are expanded such that the sides reach the side 201 moving in parallel to form rectangles, thereby converting the original subshapes 25 and 26 to subshapes 25A and 26A shown in FIG. 35. Such processing is also performed on sides 202 and 203 of the large rectangular pattern 20. The side 204 of the large rectangular pattern 20 does not require the boundary processing since it is in contact with a side of neighboring pattern subshape. Although the large rectangular pattern 20 is not in a matrix pattern, it is shown in FIG. 35 in order to show the relationship with a matrix pattern. This point is also the same in other figures.

With such a boundary processing applied, accuracy of a transferred pattern can be improved compared with the matrix pattern of FIG. 32(A), on which no boundary processing is performed.

Figure 36A:
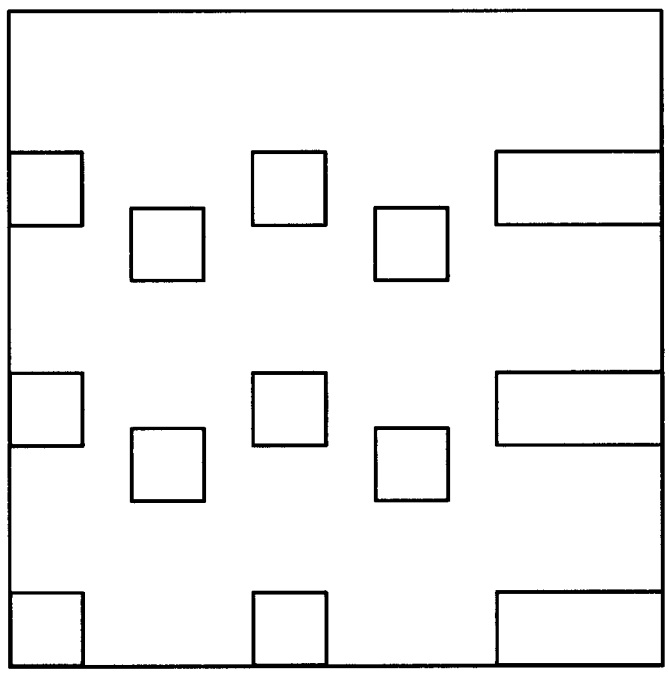
FIGS. 36(A) and 36(B) are diagrams showing one embodiment of respective two complementary patterns obtained by dividing the matrix pattern of FIG. 35.
Figure 36B:
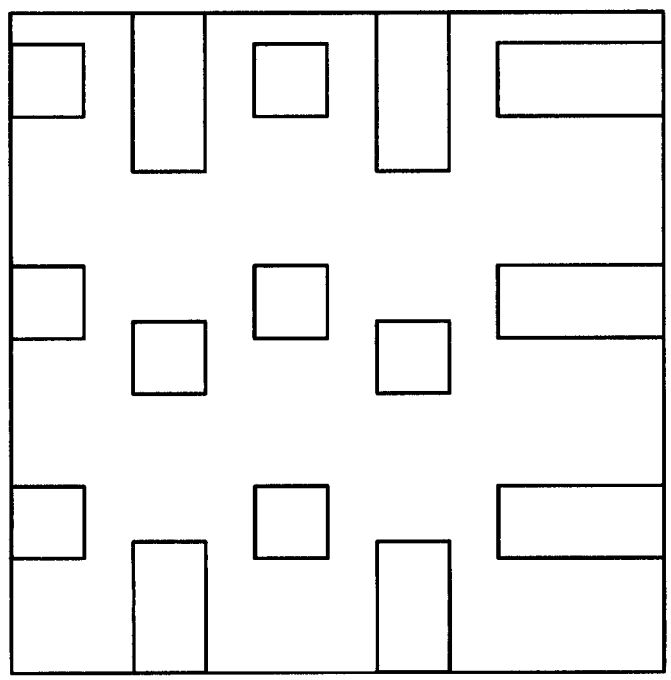

There are available electron beam masks of a stencil type and a scattering type (U.S. Pat. No. 5,130,213) and in a case of a stencil mask, by dividing the matrix pattern of FIG. 35 into two patterns complementary to each other, a distribution density of pattern subshapes is reduced to improve an accuracy of a completion mask pattern and to further increase a strength of the mask. For example, FIGS. 36(A) and 36(B) show respectively two complementary patterns obtained by dividing the matrix pattern of FIG. 35.

Eighth Embodiment

Then, description will be given of a method of the eighth embodiment analogous to the seventh embodiment in a case where a lattice pattern is a line and space (L/S) pattern.

Figure 37:
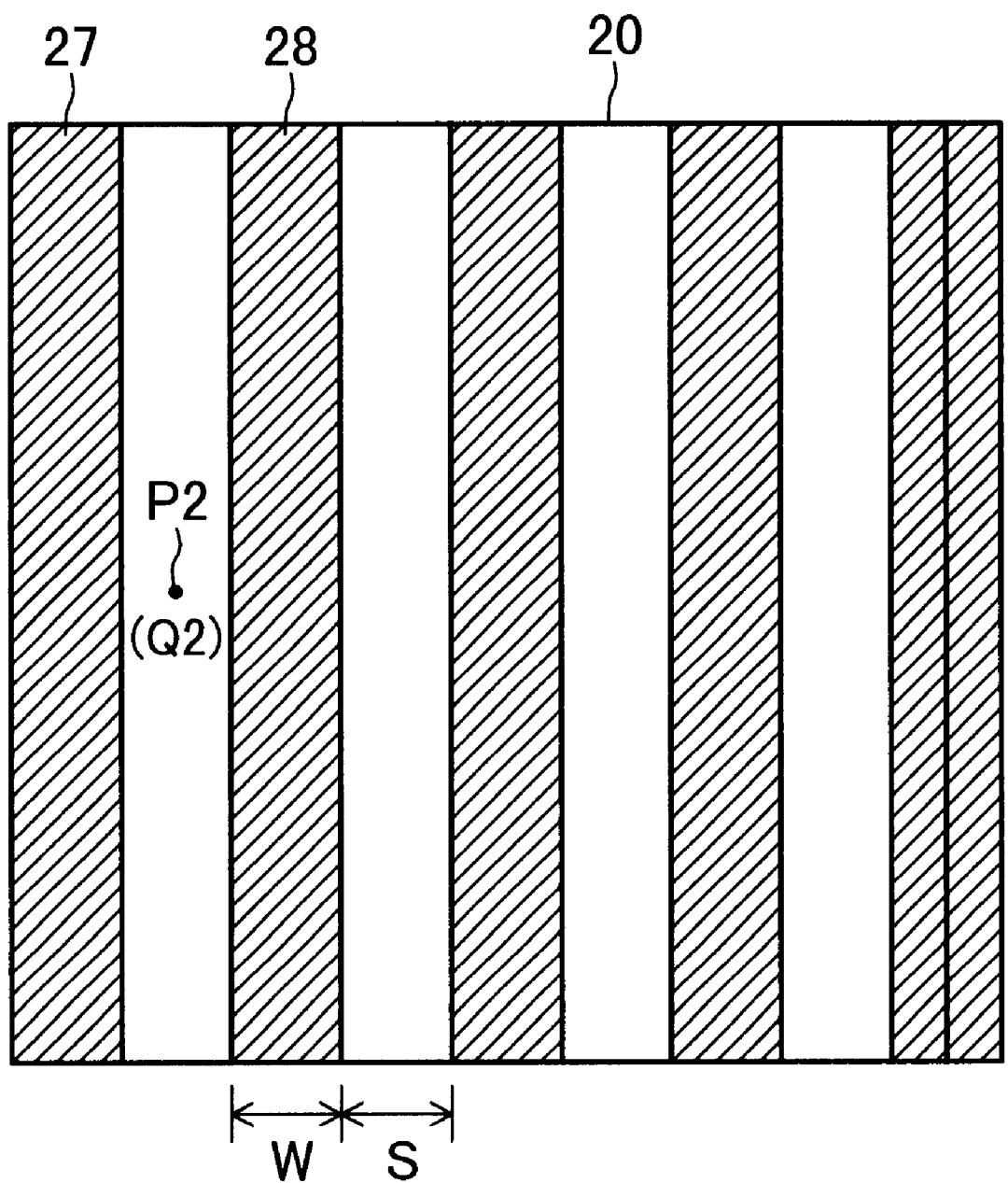
FIG. 37 is an illustration for a large rectangular pattern/lattice pattern conversion method of an eighth embodiment of the present invention.

FIG. 37 shows a case where the large-rectangular pattern 20 is converted to a L/S pattern. Lines as pattern subshapes applied with hatching are each an electron transmission region and part of a line is outside of the large rectangular pattern 20. The L/S pattern is arranged such that a side of a pattern subshape 27 of the large rectangular pattern 20 is in contact with the side 204 of the large rectangular pattern 20. Corresponding to the above equation (30), the following equation is established:

$$W/(W+S)=\alpha_p \tag{32}$$

A position P2 of FIG. 37 corresponds to the position P1 of FIG. 32(A). A forward scattering intensity at the position Q2 on a sensitive substrate corresponding to the position P2 can be calculated approximately, for example, only using an electron beam passing through the pattern features 27 and 28 on both sides of the position P2. In this case, in correspondence with the above equation (31), the following equation is established.

$$2 \times F_f((W+S)/2,0: W,H)=F_f \min \times \alpha_p \tag{33}$$

Figure 38:
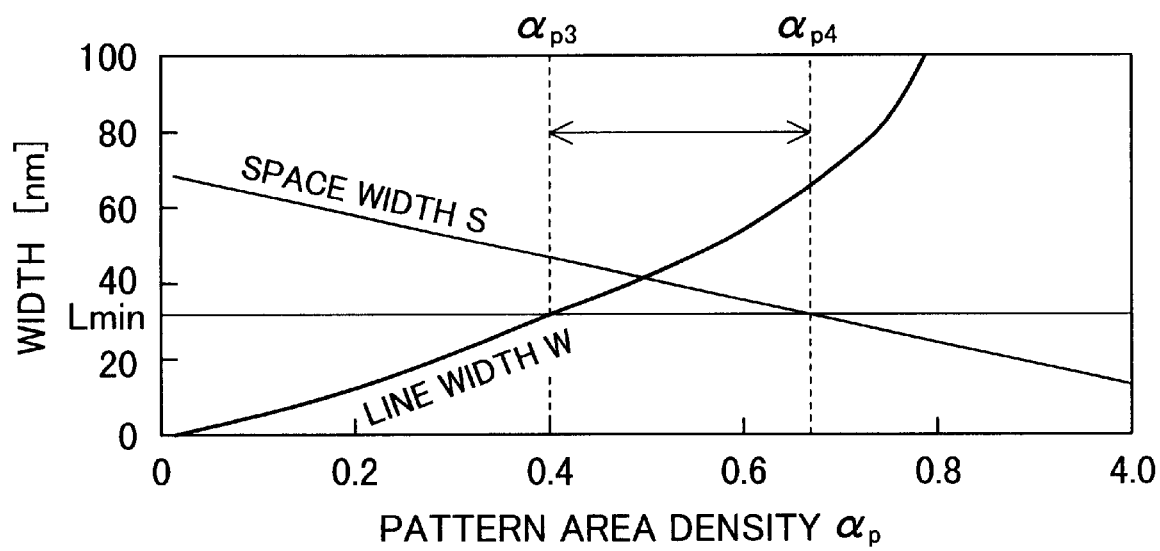
FIG. 38 is a graph showing a pattern subshape width W and a space width S with respect to a pattern area density $\alpha_p$ in a case where a lattice pattern is a line and space pattern, a forward scattering radius $\beta_{f=3}$ nm and a forward scattering intensity reduction ratio $F_f$min=0.7.

Values of a pattern subshape width W and a space width S between subshapes are determined by solving the simultaneous equations (32) and (33) with two unknowns, with a given pattern area density $\alpha_p$ and a given forward scattering intensity reduction ratio $F_f$min. FIG. 38 shows calculation results of numerical values of a pattern subshape width W and a space width S between subshapes with respect to a given pattern area density $\alpha_p$ in a case where $\beta_f$=30 nm and $F_f$min=0.7.

In order to secure a necessary accuracy of a mask pattern, allowable lower limits Lmin of a pattern subshape width W and a space width S between subshapes are set to, for example, each 30 nm. In this case, a pattern area density $\alpha_p$ at which W>Lmin and S>Lmin is in the range of $\alpha_{p3} < \alpha_p < \alpha_{p4}$, that is, $0.41 < \alpha_p < 0.68$. If a pattern area density $\alpha_p$ is in the range, an L/S pattern can be used as a lattice pattern for reduction in exposure dose and the pattern subshape width W and the space width S between subshapes can be determined as described above.

Then, description will be given of a boundary processing for a converted L/S pattern.

Figure 39A:
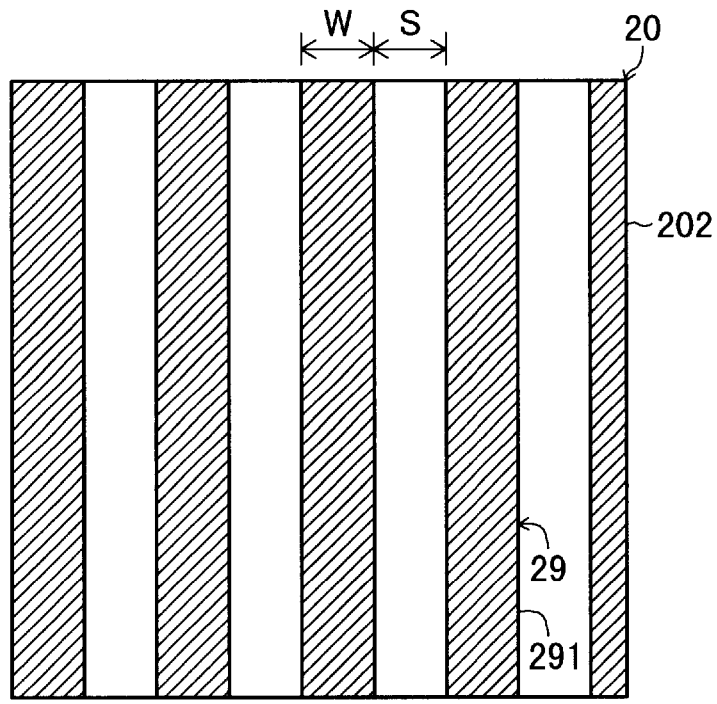
FIGS. 39(A) and 39(B) are illustrations for a boundary processing on the lattice pattern of FIG. 37.

In order to improve a pattern edge accuracy, pattern portions outside the large rectangular pattern 20 in FIG. 37 are deleted, and a pattern as shown in FIG. 39(A) is obtained. If pattern subshapes each partly deleted is formed on a mask substrate, a pattern accuracy decreases, and therefore they are perfectly deleted. By the deletion, a transferred pattern size is reduced than desired. Therefore, a pattern subshape 29 having a side 291, which face a side 202 of the large rectangular pattern 20 and are at a distance longer than a space width S from the side 202, is expanded such that the side 291 reaches the side 202 moving in parallel to form a rectangle and to thus convert the pattern feature 29 to a pattern feature 29A shown in FIG. 39(B).

With such a boundary processing applied, accuracy of a transferred pattern can be improved compared with the L/S pattern of FIG. 37, on which no boundary processing is performed.

Figure 39B:
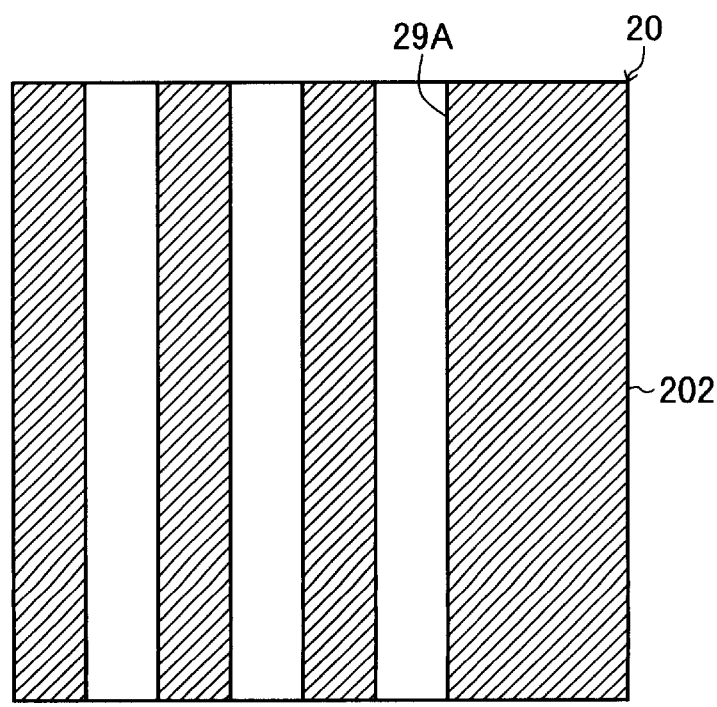
Figure 40A:
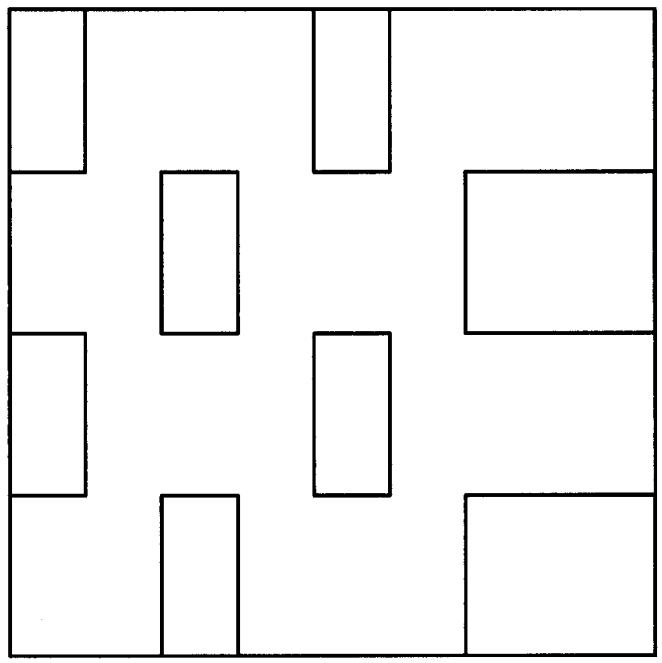
FIGS. 40(A) and 40(B) are diagrams showing one embodiment of respective two complementary patterns obtained by dividing the line and space pattern of FIG. 39(B) into the two complementary patterns.
Figure 40B:
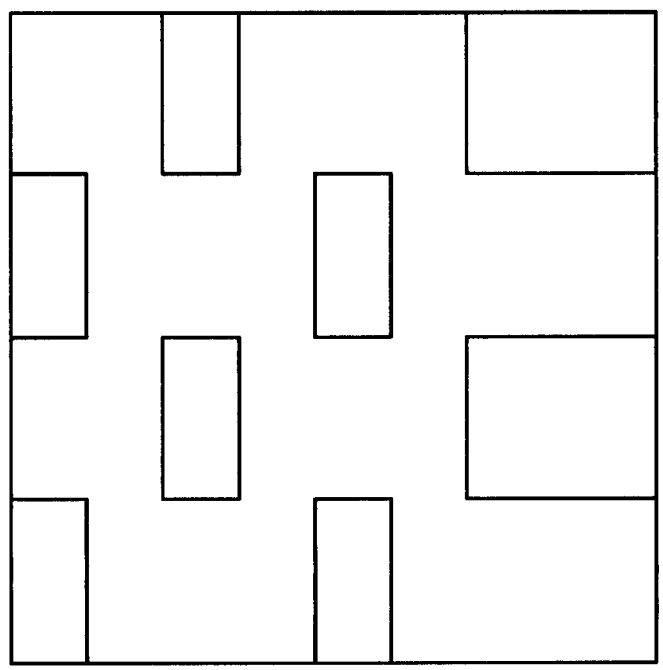

FIGS. 40(A) and 40(B) show respectively two complementary patterns, as one embodiment, obtained by dividing the line and space pattern of FIG. 39(B).

Ninth Embodiment

Since the obtained range of a pattern area density $\alpha_p$ of FIG. 33 and that of FIG. 38 are overlapped in a narrow region, determining which of a matrix pattern and an L/S pattern is used for given values of a pattern area density $\alpha_p$ and a forward scattering intensity reduction ratio $F_f$min allows the large rectangular pattern 20 to be converted to a lattice pattern for a wide range of pattern area density $\alpha_p$.

Figure 41:
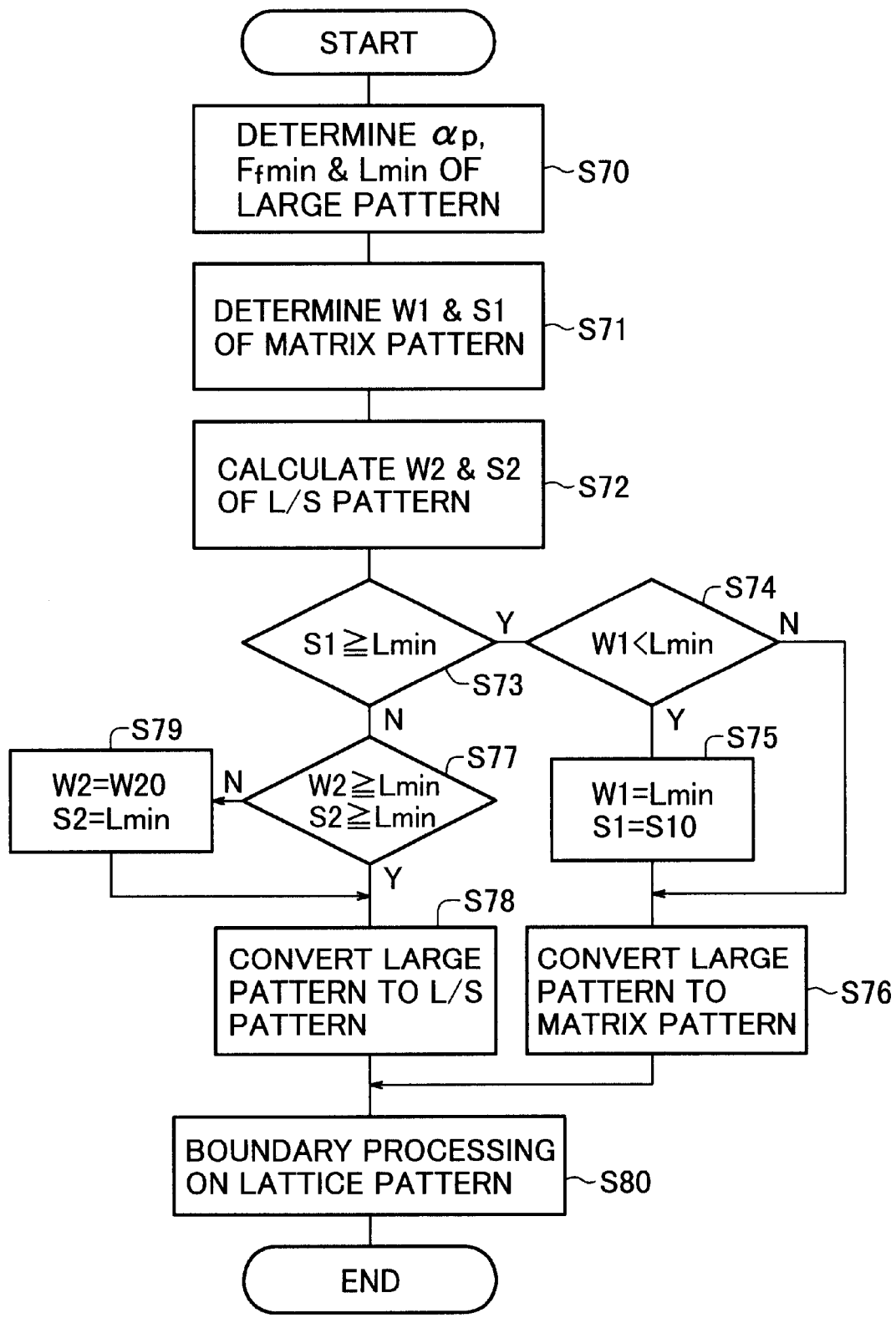
FIG. 41 is a flow chart showing a large rectangular pattern/lattice pattern conversion method of a ninth embodiment of the present invention.

FIG. 41 is a flow chart showing the determination method for such a lattice pattern according to the ninth embodiment of the present invention.

Below, the large rectangular pattern 20 is, for example, one of rectangular patterns partitioned by solid lines shown in FIG. 26(B) inside the hatched region and the processing of FIG. 41 is performed on each of the inside rectangular patterns.

(S70) A pattern area density $\alpha_p$ of the large rectangular pattern 20 is determined as in the above fifth embodiment and further, a forward scattering intensity reduction ratio $F_f$min is determined as described in the above seventh embodiment.

(S71) W=W1 and S=S1 in a case where the lattice pattern is a matrix pattern are determined as is in the above seventh embodiment.

(S72) W=W2 and S=S2 in a case where the lattice pattern is an L/S pattern are determined as is in the above eighth embodiment.

(S73) If S1≧Lmin, the process advances to step S74, but if not, the process advances to step S77.

(S74) If W1<Lmin, the process advances to step S75, but if not the process advances to step S76.

(S75) W1 is set to be equal to the allowable maximum value Lmin and "S1=S10" is adopted, where S10 is obtained by solving the simultaneous equations:

$$\alpha_p = L\min^2/(S10+L\min)^2$$

$$E(Q1: L\min, S10)=F_f\min \times \alpha_p$$

where a function E(Q: W, S) is a forward scattering intensity at a position Q obtained by surface-integrating a forward scattering term of an energy intensity distribution function and for example, equal to the function $F_f$ of the above equation 20. The position Q1 is that of FIG. 32.

(S76) The large rectangular pattern is converted to a matrix pattern having W=W1 and S=S1 and the process advances to step S80.

(S77) If W2≧Lmin and S2≧Lmin, the process advances to step S78, but if not, the process advances to S79.

(S79) S2 is set to the allowable maximum value Lmin and "W2=W10" is adopted. The process advances to step S78, where W20 is obtained by solving the simultaneous equations:

$$\alpha_p = W20/(L\min+W20)^2$$

$$E(Q2: W20, L\min) = F_f\min \times \alpha_p$$

where the position Q2 is that of FIG. 37.

(S78) The large rectangular pattern is converted to a matrix pattern having W=W2 and S=S2 and the process advances to step S78.

(S80) The above boundary processing is performed on the converted lattice pattern.

Note that in the third embodiment, if W1, S1, W2 and S2 are all larger than Lmin, the large rectangular pattern is converted to a matrix pattern, but in this case, the large rectangular pattern may be converted to an L/S pattern, and also the following configuration is possible. That is, if a value of W1−Lmin+S1−Lmin is larger than a value of W2−Lmin+S2−Lmin, the process advances to step S76, but if not, the process advances to step S78. Furthermore, a configuration nay be adopted that if W1, S1, W2 and S2 are all smaller than Lmin, the process returns to step S70 to alter a value of a forward scattering intensity reduction ratio $F_f\min$ in a possible range and to perform the procedure from step S71 of FIG. 41.

Tenth Embodiment

Figure 42A:
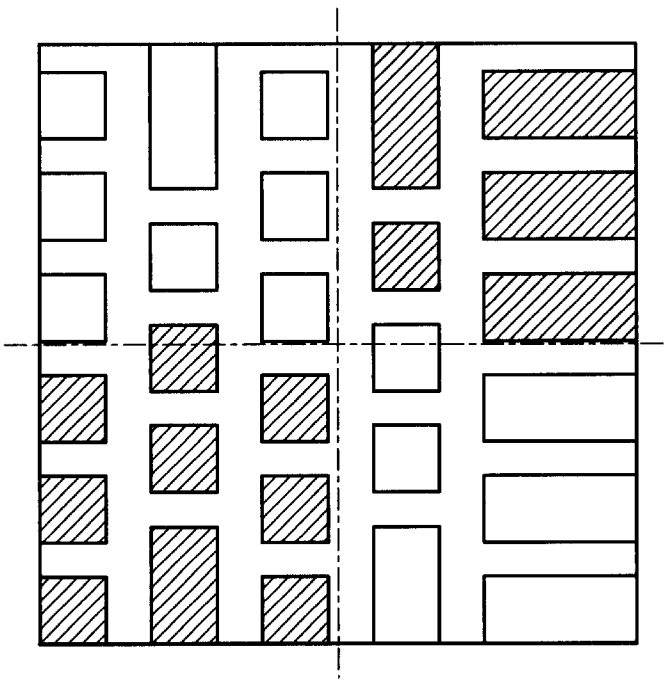
FIGS. 42(A) and 42(B) are illustrations showing another complementary pattern division method for respective lattice patterns of FIGS. 35 and 39(B)
Figure 42B:
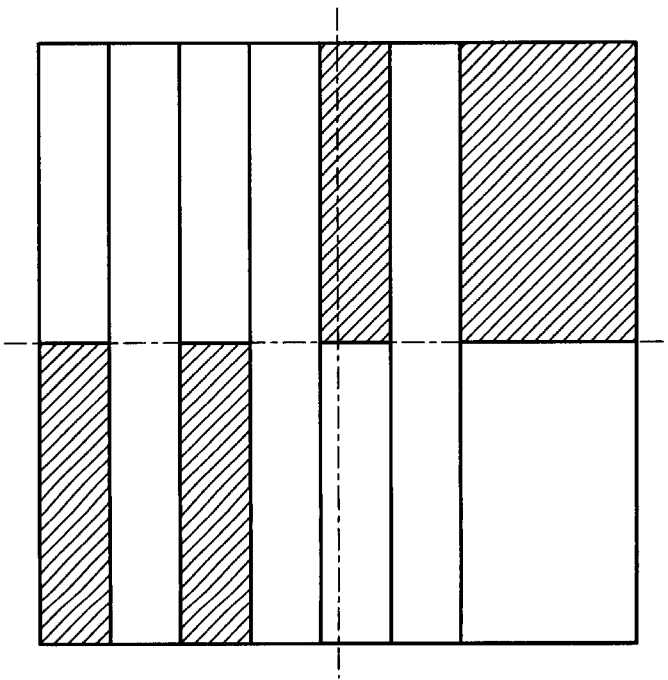

FIGS. 42(A) and 42(B) show another complementary pattern division method for lattice patterns of FIGS. 35 and 39(B), respectively.

In this method, a lattice pattern is divided into 4 parts as shown with chain lines, and adjacent divided regions are assumed to have subpatterns complementary to each other. A pattern subshape shared by adjacent regions is handled as a subpattern subshape belonging to a divided region which occupies relatively large portion of the area of the shared pattern subshape. Thereby, a pattern including a hatched pattern subshape group and a pattern including a not hatched pattern subshape group are formed as patterns complementary to each other.

In an exposure operation, when one of masks complementary to each other is switched to the other, a relative deviation in position occurs. However, when division is performed by such a method, a positional deviation occurs only with respect to the chain line in FIGS. 42(A) and 42(B), thereby reducing exposure shortage caused by increase in distance between pattern subshapes due to a positional deviation.

Eleventh Embodiment

Figure 43:
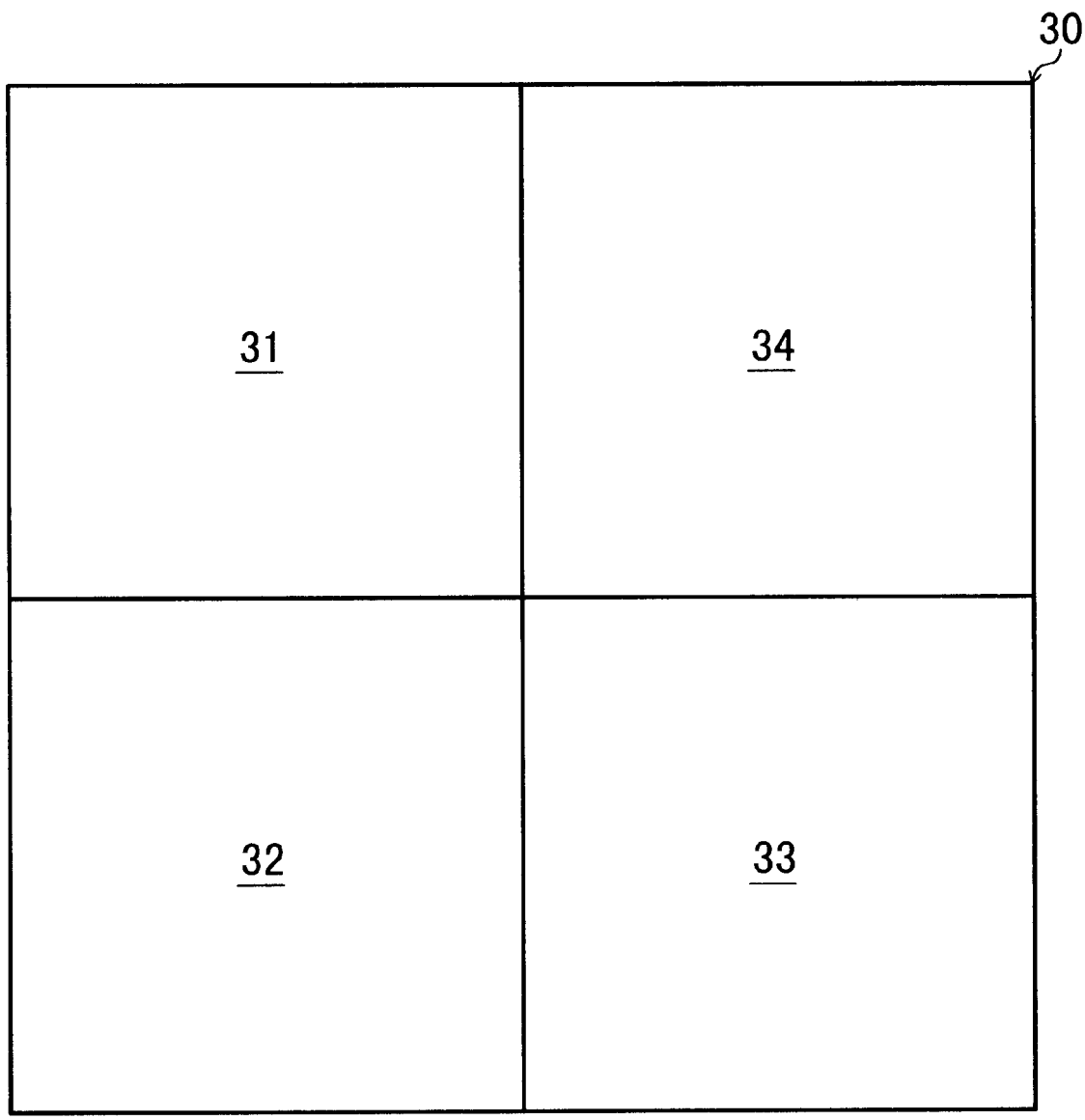
FIG. 43 is a diagram showing a large rectangular pattern divided before conversion to a lattice pattern of an eleventh embodiment of the present invention.
Figure 44:
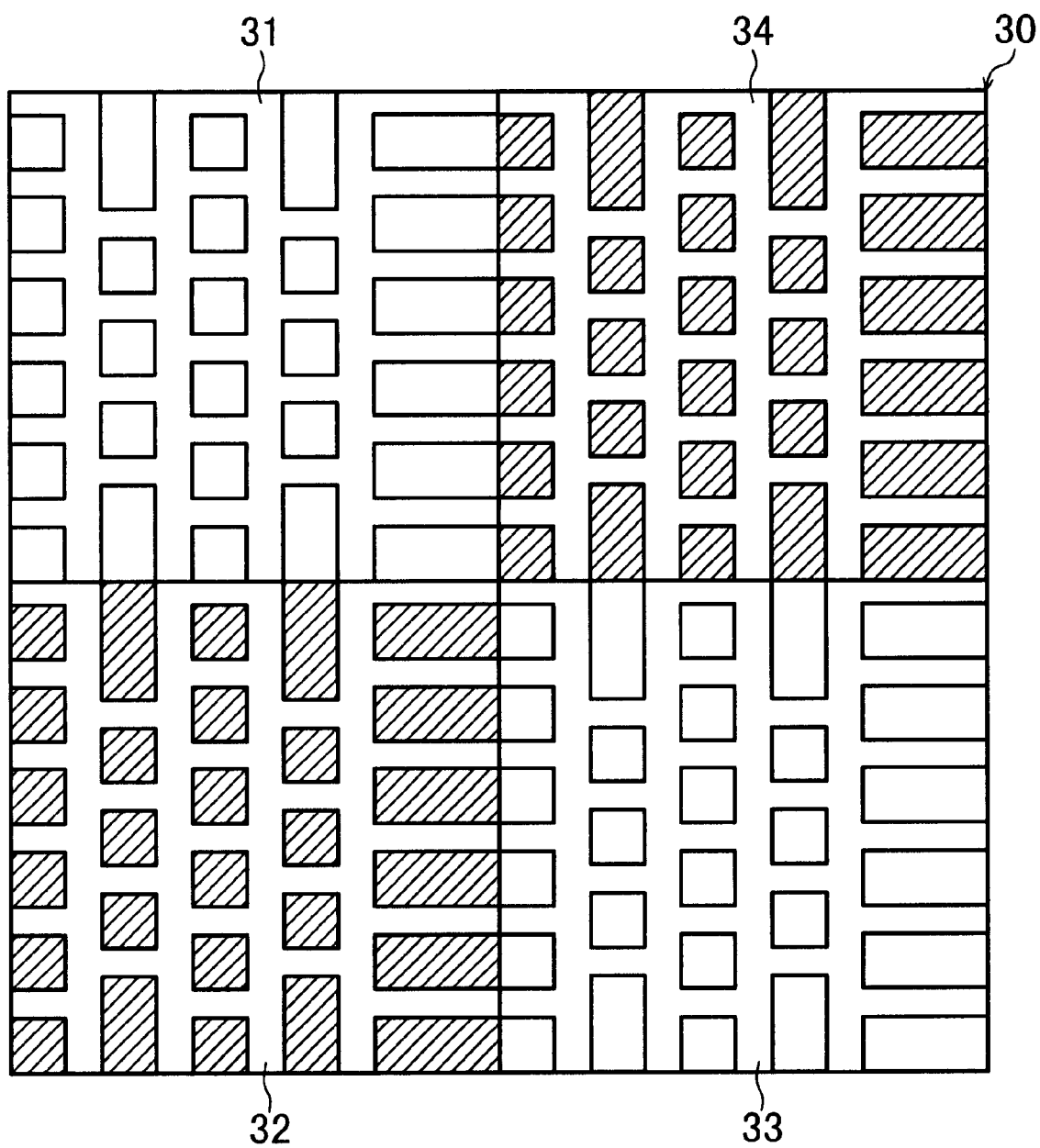
FIG. 44 is an illustration for a method for converting the large rectangular pattern of FIG. 43 to a matrix pattern to perform a boundary processing and a complementary pattern division method.
Figure 45:
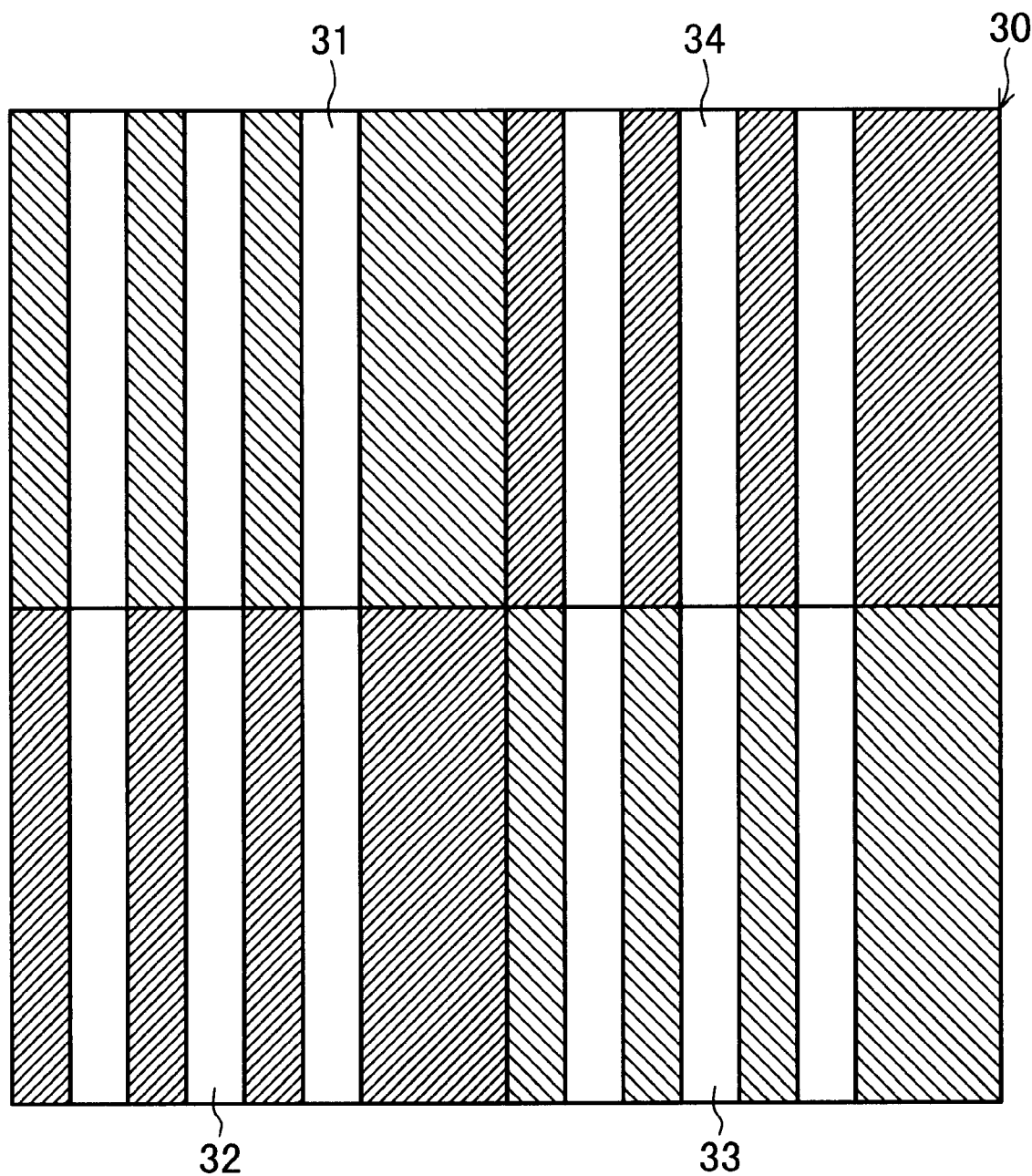
FIG. 45 is an illustration for a method for converting the large rectangular pattern of FIG. 43 to a line and space pattern to perform a boundary processing and a complementary pattern division method.

In the eleventh embodiment of the present invention, as shown in FIG. 43, a large rectangular pattern 30 is divided into regions 31 to 34 prior to conversion to a lattice pattern. The large rectangular pattern 30 is, for example, the entire region inside the hatched region of FIG. 26(B). Similarly to the ninth embodiment, a pattern area density $\alpha_p$ is obtained in each of the regions 31 to 34 to convert the regions to a matrix pattern as shown in FIG. 44 or to a L/S pattern as shown in FIG. 45. At this time, adjacent division regions are made to be subpatterns complementary to each other. That is, a pattern of a pattern subshape group included in the regions 32 and 34 and a pattern of a pattern subshape group included in the regions 32 and 33 are made to be patterns complementary to each others. In FIG. 44, patterns complementary to each other are differentiated from each other by hatching and on the other hand, in FIG. 44 by the direction of hatching lines According to this eleventh embodiment, since a boundary processing is performed on a lattice pattern of each of the division patterns, pattern subshapes at both sides of a parting line are connected to each other. Therefore when masks complementary to each other are switched therebetween in an exposure operation, it is difficult to bring about exposure shortage due to increase in space width even if a relative deviation in position occurs.

Figure 50:
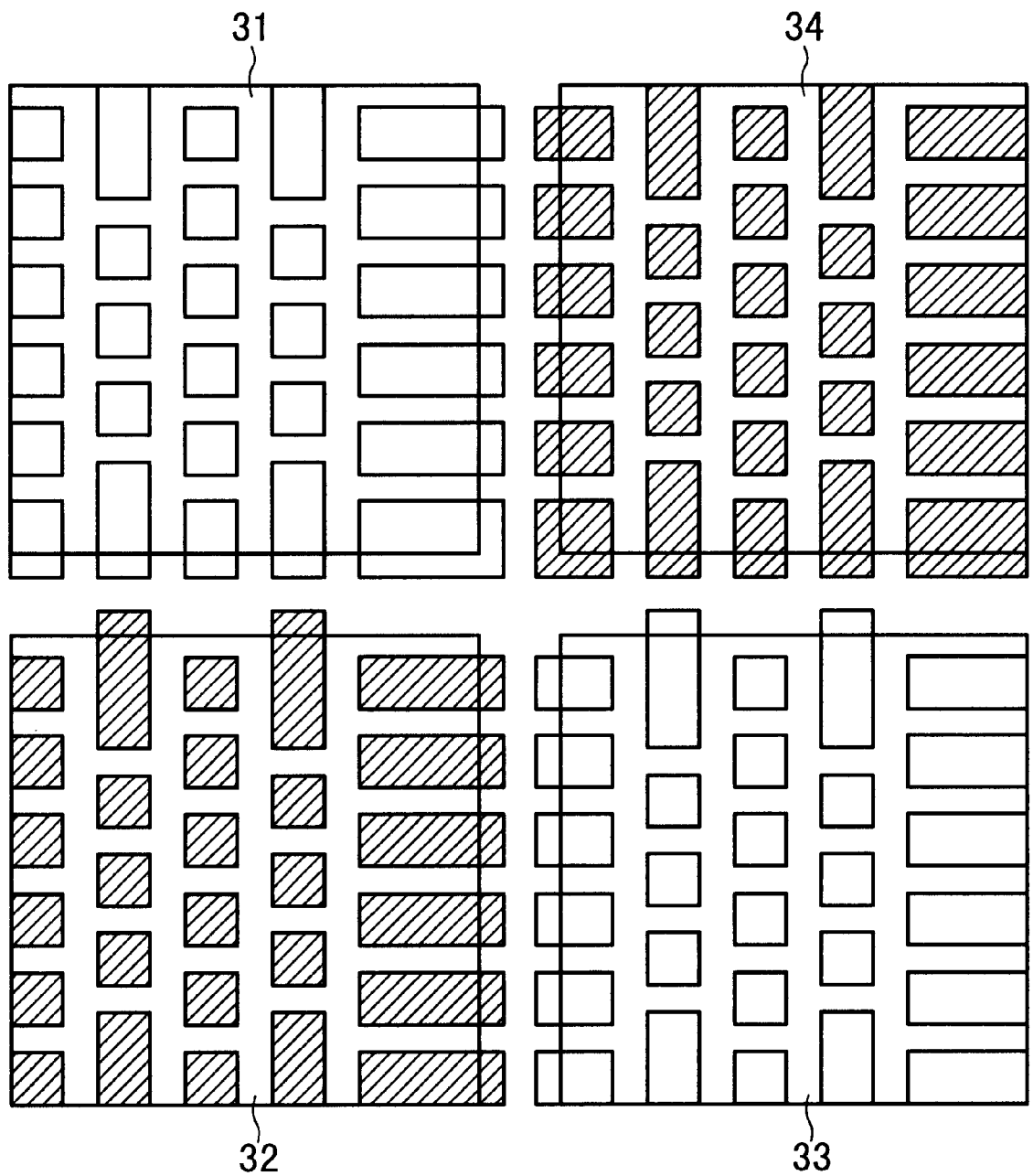
FIG. 50 is an illustration showing an embodiment modification of FIG. 44.
Figure 51A:
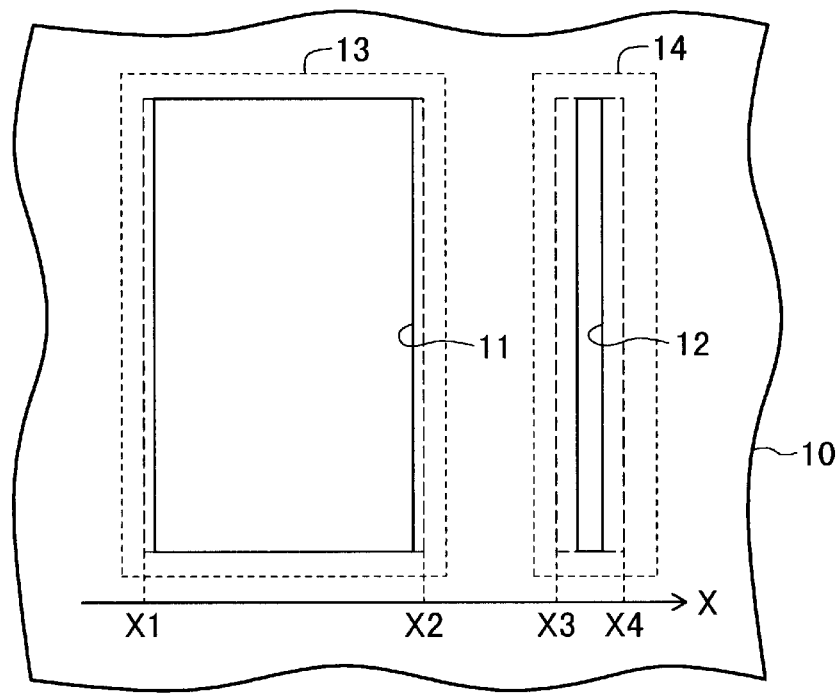
FIGS. 51(A) and 51(B) are illustrations of prior are proximity effect correction method of individual exposure.
Figure 51B:
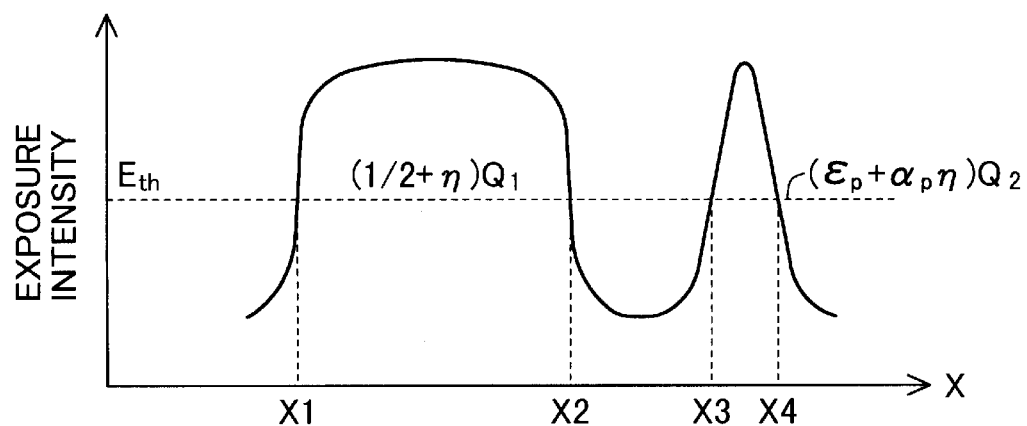
Figure 52A:
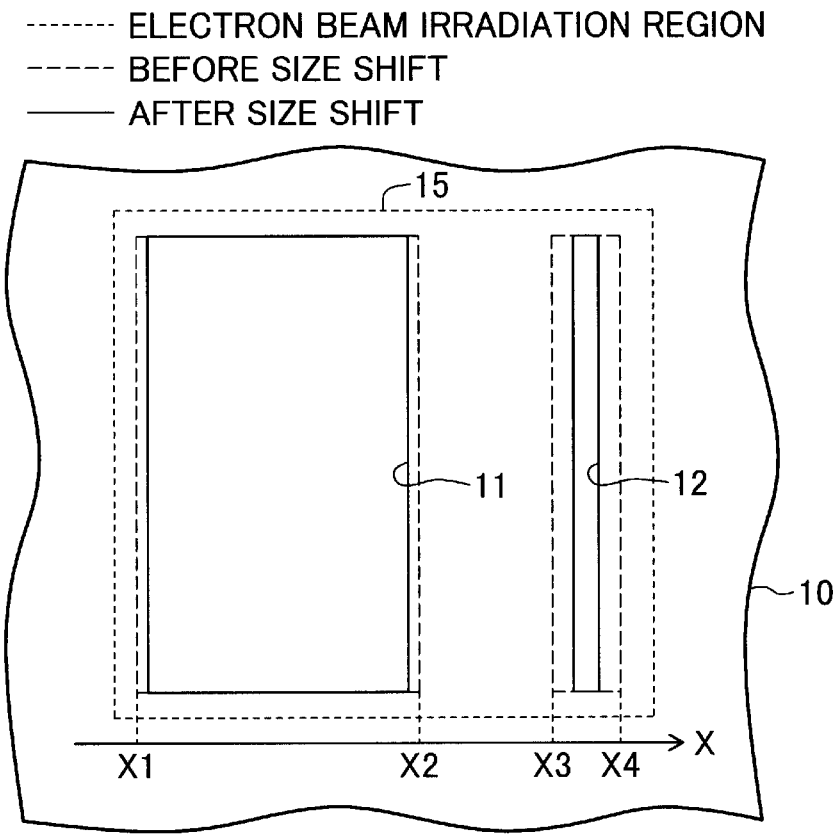
FIGS. 52(A) and 52(B) are illustrations of prior are proximity effect correction method of block exposure.
Figure 52B:
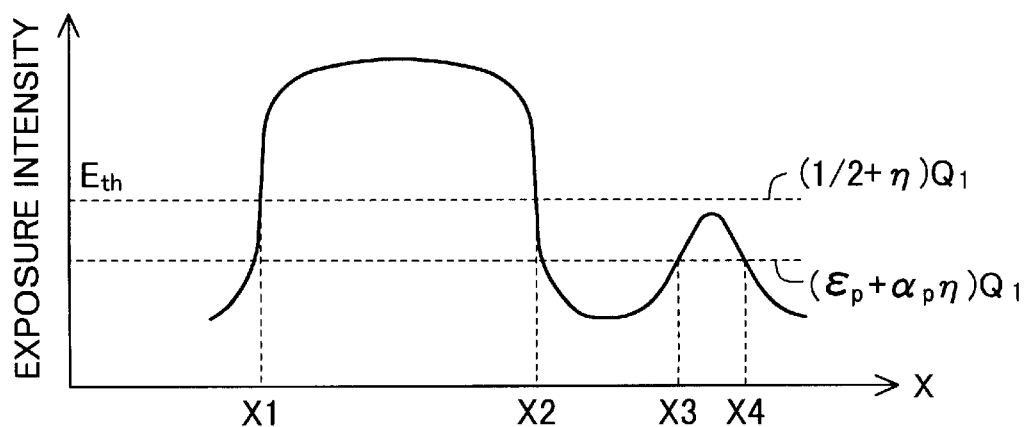
Figure 53:
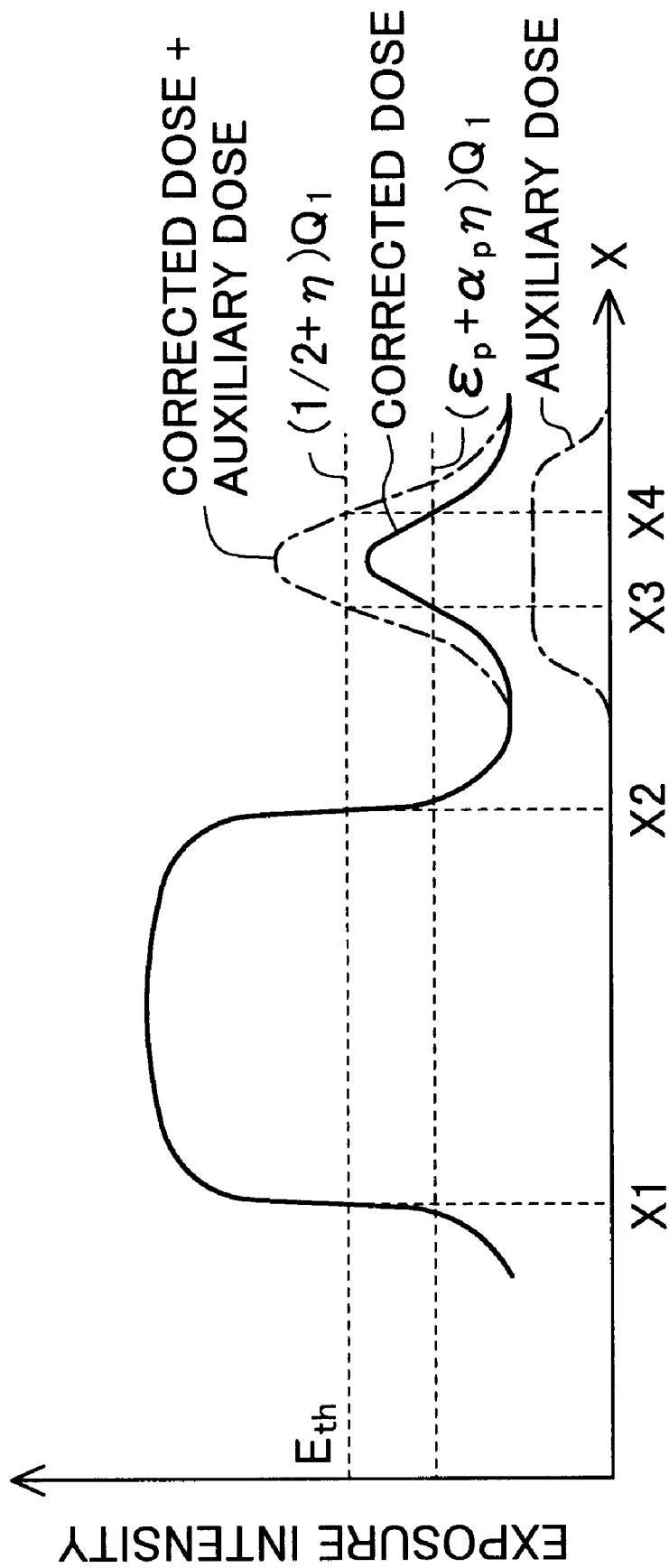
FIG. 53 is a schematic diagram showing enabling developing of a narrow line pattern by adding auxiliary exposure to the exposure intensity distribution of FIG. 52(B).

In a case where shortage of exposure occurs since the deviation in position is large even if a boundary processing is applied, in order to solve this problem, a side of each of pattern subshapes having a side in contact with a boundary line at which the regions 31 and 34 are adjacent to each other is moved in parallel outwardly beyond said boundary line so as to expand each of the pattern subshapes as shown in FIG. 50. In FIG. 50, regions 31 to 34 are separately shown in order to avoid difficulty in understanding due to overlapping of pattern subshapes in the vicinity of the boundaries.

Twelfth Embodiment

Figure 46:
FIG. 46 is a table showing a large rectangular pattern divided before conversion to a lattice pattern of a twelfth embodiment of the present invention, together with pattern area densities.

In the twelfth embodiment of the present invention, as shown in FIG. 46, prior to conversion to a lattice pattern, a large rectangular pattern 40 is divided into plural regions, for example regions of 4 rows and 7 columns, having generally different pattern area densities $\alpha_p$, and the large rectangular pattern 40 is further divided into two kinds of regions complementary to each other. For instance, an odd-numbered region and an even-numbered region are set complementary to each other. Then, the divided regions are converted to a lattice pattern according to the ninth embodiment.

Figure 47A:
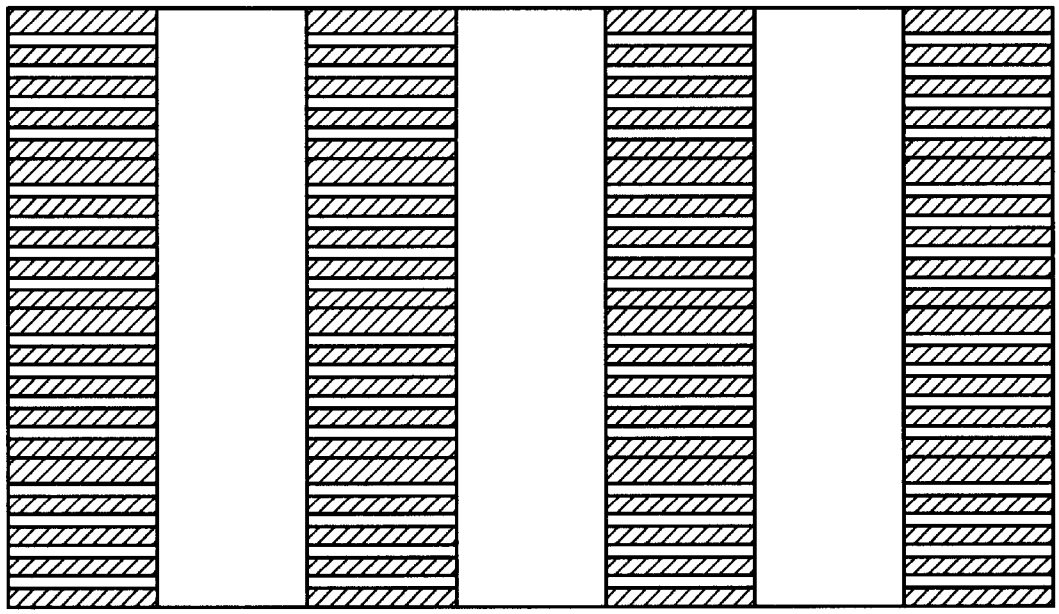
FIGS. 47(A) and 47(B) are illustrations for a complementary pattern division method for the large rectangular pattern of FIG. 46 converted to a line and space pattern and then subjected to a boundary processing, with pattern area densities $\alpha_{p11}$ to $\alpha_{p47}$ having the same value, shown in FIG. 46.
Figure 47B:
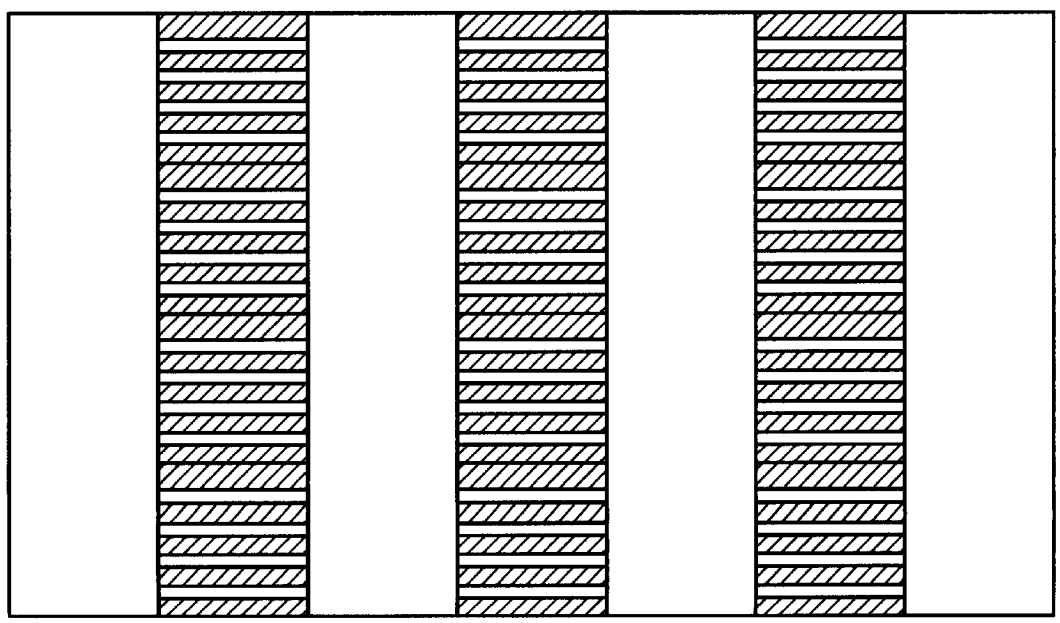
Figure 48A:
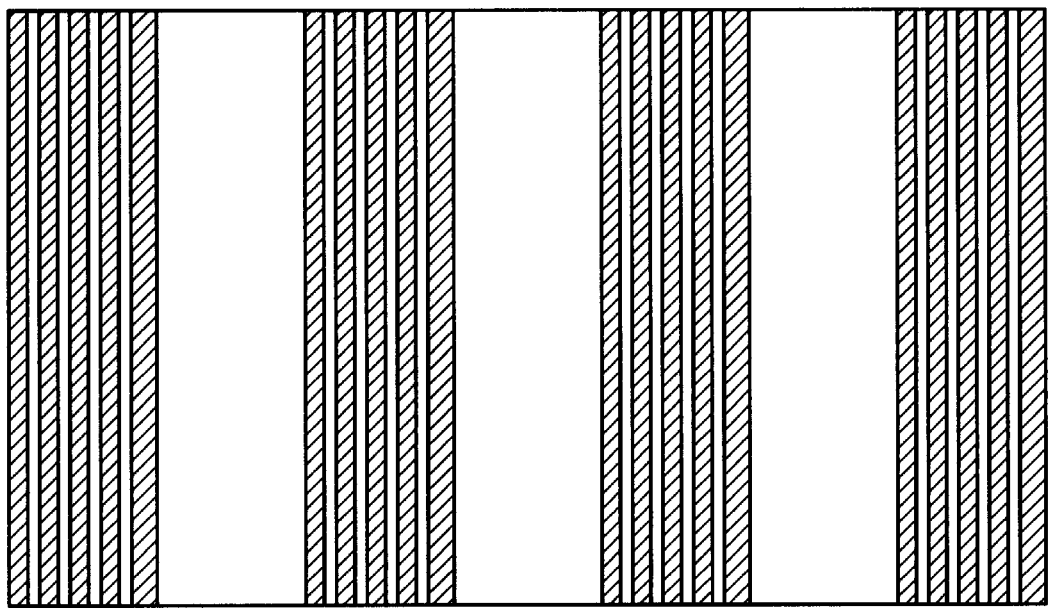
FIGS. 48(A) and 48(B) are illustrations for a complementary pattern division method, compared with FIGS. 47(A) and 47(B)
Figure 48B:
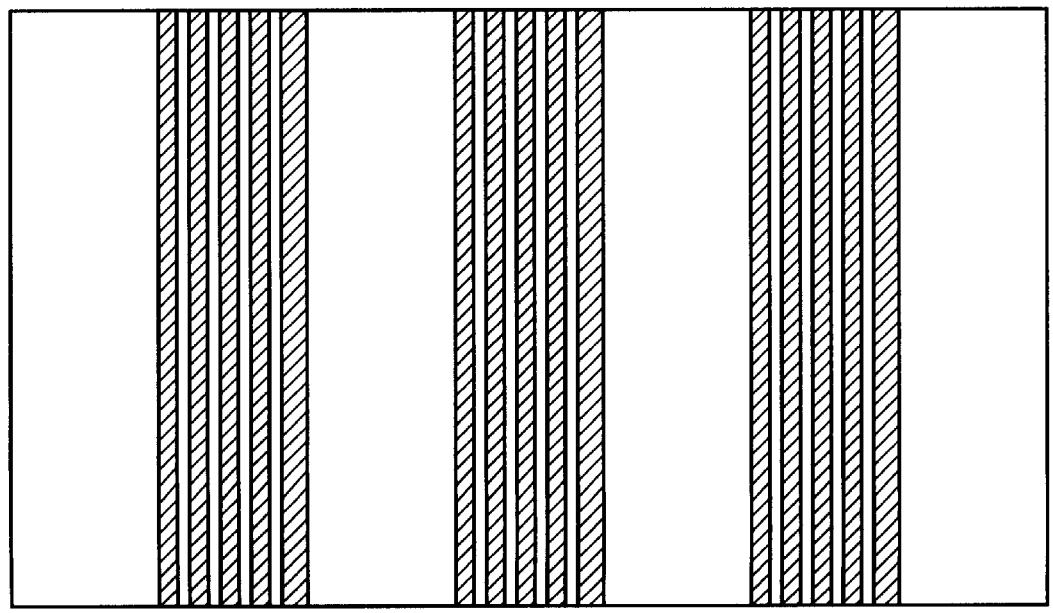

FIGS. 47(A) and 47(B) show complementary patterns whose pattern area densities $\alpha_{p11}$ to $\alpha_{p47}$ have the same value and which are converted to L/S patterns. A length direction of a L/S pattern is set to a row direction and thereby a line length becomes shorter than in a case where the length direction set to a column direction as shown in FIGS. 48(A) and 48(B), in result that a strength of a mask is increased to enable extending the lifetime of the mask.

Note that a size of a division region of FIG. 46 is set to be the same order as the size of a unit region of a mesh arrangement in which a pattern area density $\alpha_p$ is calculated, or a pattern area density $\alpha_p$ of each division region is calculated in a mesh arrangement constituted of unit regions of the same order as the size of each division region.

Thirteenth Embodiment

In the thirteenth embodiment of the present invention, description will be given of a method in which simpler equations are used instead of the above equations (31) and (33) to simplify simultaneous equations and determine a pattern subshape width W and a space width S with ease.

Figure 49:
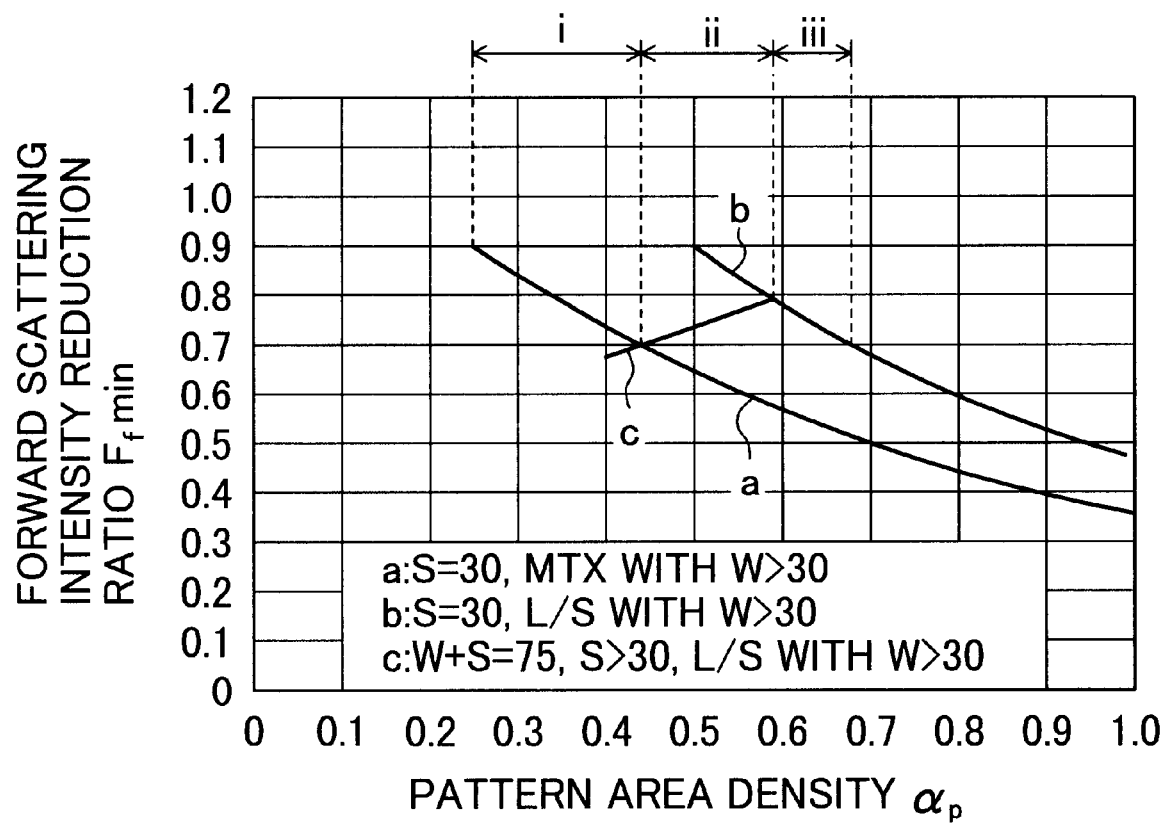
FIG. 49 is a graph showing numerical value calculation results of a pattern area density $\alpha_p$ with respect to a forward scattering intensity reduction ratio $F_f$min for describing a large rectangular pattern/lattice pattern conversion method of a thirteenth embodiment of the present invention.

FIG. 49 shows calculation results of numerical values of a pattern area density $\alpha_p$ with respect to a forward scattering intensity reduction ratio $F_f\min$ in each of the following three cases where $\beta_f$=30 nm. It is assumed that the allowable minimum values Lmin of W and S are each 30 nm.

(a) A matrix pattern (MTX) meeting a condition that W>30 nm at S=30 nm.

(b) An L/S pattern meeting a condition that W>30 nm at S=30 nm.

(c) An L/S pattern meeting a condition that W>30 nm and S>30 nm at a pitch W+S=75 nm.

In a case of (a), a pattern subshape width W is obtained by substituting values of a space width S and a pattern area density $\alpha_p$ into the above equation (30); in a case of (b), a pattern subshape width W is obtained by substituting values of a space width S and a pattern area density $\alpha_p$ into the above equation (32); and in a case of (c), a pattern subshape width W and a space width S is obtained using the equation of W+S=75, a value of a pattern area density $\alpha_p$ and the above equation (32).

For instance, in order to satisfy a relation $F_f$min>0.7, a large pattern is converted to the following lattice patterns according to the value of a pattern area density $\alpha_p$ as shown in FIG. 49:

(i) the matrix pattern (a) if $0.25<\alpha_p<0.44$,
(ii) the L/S pattern (b) if $0.44<\alpha_p<0.59$, and
(iii) the L/S pattern (c) if $0.6<\alpha_p<0.68$.

Although preferred embodiments of the present invention has been described, it is to be understood that the invention is not limited thereto and that various changes and modifications may be made without departing from the spirit and scope of the invention.

For instance, although only influences of three and two pattern subshapes located adjacent to a point of interest are considered in the respective above equations (31) and (33), generally a forward scattering intensity is calculated over a circle area, as an integration surface, of a radius $2\beta_f$ with a point of interest as a center.

In the ninth and seventh embodiments, in a case where $\alpha_p<0.25$, a pattern having an allowable minimum value 0.25 of a pattern area density $\alpha_p$ is used, and in a case where $\alpha_p>0.68$, a pattern of "$\alpha_p=1$" is used, that is, no conversion to a lattice pattern is performed. Limit values of each of ranges of a pattern area density $\alpha_p$ in the third and seventh embodiments are determined according to a value of $\beta_f$ and a lower limit value of a forward scattering reduction ratio, $F_f$min.

In each of (a) and (b) of the thirteenth embodiment, W and S may be interchanged therebetween.

An energy intensity distribution function is not limited to the above double Gaussian equation, but its approximation can be made by using a triple Gaussian equation having a third term including a fitting coefficient g for increasing a degree of coincidence with actual measurement and a secondary electron scattering ratio $\eta'$, or by using a polynomial. Especially in the second and third embodiments, the step of size shift may incorporate a term spreading over a range wider than the forward scattering and narrower than backscattering, which is included in the triple Gaussian equation.

Further, a length of a side of a square of a mesh arrangement is not necessary to be 1/(an integer) times a length of a block exposure pattern.

Note that in the following claims, the term "substantially" means inclusion of all methods or configurations which substantially bring about the same result as the described method even if it has different processing. For example, "substantially" in claim 15 means that the method includes different one substantially bring about the same result even if it does not have the step of forming a pattern of figure-related logic product.

What is claimed is:

1. A charged particle beam exposure method with performing proximity effect correction by adjusting widths of patterns included in a block pattern, formed on a mask, for being repeatedly used and for collectively exposing, and by calculating a corrected exposure dose, said method comprising the steps of:

(a) determining a reference forward scattering intensity on the basis of a forward scattering intensity distribution of a pattern having a minimum design width included in said block pattern;

(b) adjusting each pattern width in said block pattern such that a width of a forward scattering intensity distribution at said reference forward scattering intensity becomes equal to a corresponding design width; and (c) determining said corrected exposure dose such that, in regard to each pattern in said block pattern, a value obtained by multiplying a sum of said reference forward scattering intensity and a backscattering intensity by said corrected exposure dose becomes substantially equal to each other.

2. The charged particle beam exposure method of claim 1, wherein in said step (a), said reference forward scattering intensity is determined as equal to such a slice level that, in regard to said pattern having said minimum design width, by adjusting a width of said forward scattering intensity distribution at said slice level that is a predetermined percentage with respect to a peak value of said forward scattering intensity distribution becomes equal to a design width of said pattern.

3. The charged particle beam exposure method of claim 2, wherein said predetermined percentage in said step (a) is a value in the range of 30 to 70%.

4. The charged particle beam exposure method of claim 3, wherein said predetermined percentage in said step (a) is 50%.

5. The charged particle beam exposure method of claim 2, wherein in said step (a), in a case where said adjusted pattern width is less than a predetermined minimum value, the pattern width is determined to be equal to said predetermined minimum value, and said reference forward scattering intensity is determined as equal to such a slice level that a width of said forward scattering intensity distribution at said slice level becomes equal to said minimum design width.

6. The charged particle beam exposure method of claim 1, wherein in said step (a), said reference forward scattering intensity is determined as equal to such a slice level that in regard to said pattern having said minimum design width, a width of said forward scattering intensity distribution at said slice level becomes equal to this design width.

7. The charged particle beam exposure method of claim 1, wherein in said step (a), said reference forward scattering intensity is determined for each block pattern.

8. The charged particle beam exposure method of claim 1, wherein said step (c) comprises the steps of:

dividing a layout plane of patterns whose widths have been adjusted in said step (b) into squares in mesh to determine a pattern area density of each of said squares;

performing smoothing on said pattern area densities to determine an effective pattern area density; and determining said backscattering intensity as a value proportional to said effective pattern area density.

9. The charged particle beam exposure method of claim 8, wherein in said step (c), a size of each of said squares in mesh is less than a size of said block pattern, and when one shot exposure through said block pattern causes a shortage of exposure intensity, an auxiliary exposure dose for supplementing said shortage is determined in regard to each square associated with said shortage.

10. The charged particle beam exposure method of claim 1, wherein in said step (c), said corrected exposure dose Qcp is determined such that $Qcp(\epsilon_p+\alpha_p'\cdot\eta)=Eth$ holds, where $\epsilon_p$ is said reference forward scattering intensity, Eth is a threshold value for pattern developing, η is a backscattering coefficient, and $\alpha_p'$ is an effective pattern area density.

11. The charged particle beam exposure method of claim 1, wherein said step (b) comprises the steps of:
setting fixed sample points each being at a middle point on each side of each pattern in said block pattern; and
in regard to each of said fixed sample points, to adjust said pattern width, shifting a side corresponding to said fixed sample point in a direction perpendicular thereto such that an intensity of said forward scattering intensity distribution at said fixed sample point becomes equal to said reference forward scattering intensity.

12. The charged particle beam exposure method of claim 1, wherein said step (b) comprises the steps of:
dividing at least one pattern in said block pattern into plurality of rectangles;
setting fixed sample points each being at a middle point on a side, which is in contact with a boundary of said at least one pattern, of ones of said rectangles; and
in regard to each of said fixed sample points, to adjust said pattern width, shifting a side corresponding to said fixed sample point in a direction perpendicular thereto such that an intensity of said forward scattering intensity distribution at said fixed sample point becomes equal to said reference forward scattering intensity.

13. A charged particle beam exposure method with performing proximity effect correction by adjusting widths of a plurality of patterns of a mask for collectively exposing by a charged particle projection method, said method comprising the steps of:
(a) selecting a representative pattern from said plurality of patterns to determine a reference exposure intensity Eth on the basis of said representative pattern;
(b) determining a backscattering intensity distribution $F_b$ of said plurality of patterns; and
(c) adjusting a pattern width W of each pattern such that a width of a forward scattering intensity distribution at a slice level (Eth–$F_b$) becomes equal to a design width W0i.

14. The charged particle beam exposure method of claim 13, further comprising the step of:
(d) in regard to a region where a shortage of exposure intensity arises, determining an auxiliary exposure dose for supplementing said shortage.

15. The charged particle beam exposure method of claim 14, further comprising the step of, in between said steps (b) and (c) or between said steps (c) and (d):
(e) converting at least part of a pattern to a lattice pattern according to a backscattering intensity.

16. The charged particle beam exposure method of claim 15, wherein in said step (e), said conversion is performed according to a value of said backscattering intensity relative to said reference exposure intensity.

17. The charged particle beam exposure method of claim 13, wherein in said step (a), a rectangular pattern having a minimum design width is selected as said representative pattern.

18. The charged particle beam exposure method of claim 13, wherein in said step (a), an isolated rectangular pattern having a minimum design width W0 is selected as said representative pattern, and by adjusting a slice level of a forward scattering intensity distribution of said representative pattern such that a width of said distribution at said slice level becomes a design width W0, said slice level is determined as said reference exposure intensity Eth.

19. The charged particle beam exposure method of claim 18, wherein in said step (a), said slice level is equal to a value in a range of 30 to 70% of a peak value of said forward scattering intensity distribution.

20. The charged particle beam exposure method of claim 14, wherein said step (b) comprises the steps of:
dividing a pattern layout plane on said mask into squares in mesh;
determining a pattern area density of each of said squares;
performing smoothing on said pattern area densities to determine an effective pattern area density; and
determining said backscattering intensity as a value proportional to said effective pattern area density;
wherein in said step (d), said auxiliary exposure dose is determined in units of said squares in mesh.

21. The charged particle beam exposure method of claim 13, wherein said step (c) comprises the steps of:
setting fixed sample points each being at a middle point on each side of at least one pattern; and
in regard to each of said fixed sample points, to adjust said pattern width, shifting a side corresponding to said fixed sample point in a direction perpendicular thereto such that an intensity of said forward scattering intensity distribution at said fixed sample point becomes equal to said reference forward scattering intensity.

22. The charged particle beam exposure method of claim 13, wherein said step (c) comprises the steps of:
(c1) dividing at least one pattern into plurality of rectangles;
(c2) setting fixed sample points each being at a middle point on a side, which is in contact with a boundary of said at least one pattern, of ones of said rectangles; and
(c3) in regard to each of said fixed sample points, to adjust said pattern width, shifting a side corresponding to said fixed sample point in a direction perpendicular thereto such that an intensity of said forward scattering intensity distribution at said fixed sample point becomes equal to said reference forward scattering intensity.

23. The charged particle beam exposure method of claim 22, wherein in said step (cl), ones of said rectangles along a periphery of said at least one pattern have the same size to each other and one of said rectangles inside said at least one pattern has a larger size than said same size.

24. The charged particle beam exposure method of claim 22, further comprising the step of, in between said steps (c1) and (d):
(e) converting one of said divided rectangles, four sides thereof are all in contact with sides of other ones of said divided rectangles, to a lattice pattern.

25. The charged particle beam exposure method of claim 24, wherein in said step (e), said conversion is performed only when a backscattering intensity at a point on a boundary of said one of said divided rectangles exceeds a predetermined percentage of said reference exposure intensity.

26. The charged particle beam exposure method of claim 13, wherein in said step (c), said forward scattering intensity distribution depends on a beam blur δ, a relationship between said charged particle beam blur and an exposure position is determined in advance, and said charged particle beam blur is determined according to an exposure position on the basis of said relationship.

27. The charged particle beam exposure method of claim 13, further comprising the steps of:
(e) forming said patterns having adjusted widths on a first mask blank to fabricate a main exposure mask for collective exposure; and (f) forming a lattice pattern having a pattern area density proportional to an auxiliary exposure dose on a second mask blank on the basis of an exposure dose determined in said step (d) to fabricate an auxiliary exposure mask for collective exposure.

28. A charged particle beam exposure method in which a plurality of patterns are collectively exposed by a charged particle projection method, comprising the steps of:
   (a) irradiating a main exposure mask on which said plurality of patterns are formed with a charged particle beam to collectively expose a sensitive substrate; and
   (b) irradiating an auxiliary exposure mask on which a pattern for performing auxiliary exposure in a region falling short of exposure intensity after said collective exposure is formed with a charged particle beam to collectively expose said sensitive substrate.

29. The charged particle beam exposure method of claim 28, wherein in said step (b), said sensitive substrate is irradiated with said charged particle beam which is out of focus.

30. A rectangle-to-lattice data conversion method for a charged particle beam exposure mask pattern that, when a rectangular pattern or a rectangle of part thereof is actually or imaginarily formed as a first rectangular pattern on a sensitive substrate by charged particle beam exposure, converts a second rectangular pattern on a mask. corresponding to said first rectangular pattern to a lattice pattern including plural pattern subshapes in order to reduce an exposure dose, wherein if a width of a pattern subshape is W, a space between pattern subshapes is S, an area density of a lattice pattern is $\alpha_p$, the minimum value of a forward scattering intensity in the first rectangular pattern is $F_f \min \times \alpha_p$ and a position assuming the minimum value is P, the method comprises the steps of:
   (a) obtaining a function D(W,S) representing said area density $\alpha_p$ on the basis of a geometric relation of said lattice pattern, and obtaining a function E(P: W, S) representing a forward scattering intensity at said position P by surface-integration of a forward scattering term of an energy intensity distribution function; and
   (b) obtaining said pattern subshape width W and said space width S satisfying relations D(W, S)=$\alpha_p$ and E(P: W, S)=$F_f \min \times \alpha_p$, given both of an area density $\alpha_p$ and a forward scattering intensity reduction ratio $F_f \min$.

31. The rectangle-to-lattice data conversion method according to claim 30, further comprising the step of:
   (c) adopting said values of said pattern subshape width W and said space width S as parameters to determine said lattice pattern in a case where said values of said pattern subshape width W and said space width S are larger than a given allowable lower limit.

32. The rectangle-to-lattice conversion method according to claim 30, further comprising the step of:
   (c) determining a shape of said pattern subshape such that said values of said pattern subshape width W and said space width S are larger than a given lower limit.

33. The rectangle-to-lattice data conversion method according to claim 32, wherein said pattern subshape is a square having a side of W in length or a line having a length in a length direction equal to the length of a side of said lattice pattern.

34. The rectangle-to-lattice data conversion method according to claim 30, wherein said pattern subshape is a square having a side of W in length, and in said step (b), said relation D(W, S)=$\alpha_p$ is expressed as $W^2/(W+S)^2=\alpha_p$; and
   if coordinates of a position in a X-Y coordinate system having the X axis and Y axis parallel to respective sides of said square with the center of said square as the origin are (X, Y), and a forward scattering intensity at a position (X, Y) on said sensitive substrate in a case where said charged particle beam passes through only one rectangle having two adjacent sides of W and H, respectively, in length is expressed by a function $F_f(X, Y; W, H)$, said relation E(P: W, S)=$F_f \min \times \alpha_p$ is given as follows:

$2 \times F_f(W+S)/2, (W+S)/2: W,W)+F_f((W+S)/2,0: W,W)=F_f \min \times \alpha_p$.

35. The rectangle-to-lattice data conversion method according to claim 30, wherein said pattern subshape is a line having a length in a length direction equal to the length H of a side of said lattice pattern, and in said step (b), said relation D(W, S)=$\alpha_p$ is expressed as $W/(W+S)=\alpha_p$; and if coordinates of a position in a X-Y coordinate system having the X axis and Y parallel to respective sides of said line with the center of said line as the origin are (X, Y), and a forward scattering intensity at a position (X, Y) on said sensitive substrate in a case where said charged particle beam passes through only one rectangle having two adjacent sides of W and H, respectively, in length is expressed by a function $F_f(X, Y; W, H)$, said relation E(P: W, S)=$F_f \min \times \alpha_p$ is given as follows:

$2 \times F_f((W+S)/2,0: W,H)=F_f \min \times \alpha_p$.

36. The rectangle-to-lattice data conversion method according to claim 30, wherein said first rectangular pattern imaginarily formed on said sensitive substrate as one of plural rectangular division regions obtained by dividing a rectangular pattern actually formed on said sensitive substrate.

37. A rectangle-to-lattice data conversion method that, when a rectangular pattern or a rectangle of part thereof is actually or imaginarily formed as a first rectangular pattern on a sensitive substrate by charged particle beam exposure, converts a second rectangular pattern on a mask corresponding to said first rectangular patter to a lattice pattern including plural pattern subshapes in order to reduce an exposure dose, wherein if a width of a pattern subshape is W, a space width between pattern subshapes is S, an area density of said lattice pattern is $\alpha_p$ the minimum value of a forward scattering intensity in said first rectangular pattern is $F_f \min \times \alpha_p$ and a position assuming the minimum value is P, the method comprises the steps of:
   (a) obtaining a function D(W, S) representing said area density $\alpha_p$ on the basis of a geometric relation of said lattice pattern, and obtaining a function E(P: W, S) representing a forward scattering intensity at said position P by surface-integration of a forward scattering term of an energy intensity distribution function;
   (b) determining values of said pattern subshape width W and said space width S on the basis of said function D(W, S)=$\alpha_p$, and values of said pattern subshape width W and said space width S or a value of a relation formula of S and W, given all of an area density $\alpha_p$, an allowable lower limit $F_f \min$ of a forward scattering intensity reduction ratio $F_f \min$, a common allowable lower limit value Lmin of both said pattern subshape width W and said space width S, and the values of said pattern subshape width W and said space width S or the value of the relation formula of S and W; and
   (c) adopting the values of said pattern subshape width W and said space width S as parameters to determine said lattice pattern in a case where a condition is satisfied that W≧Lmin, S≧Lmin and E(P: W, S)=$F_f$min×$α_p$.

38. The rectangle-to-lattice conversion method according to claim 37, further comprising the step of:
(d) substantially performing a boundary processing in which a pattern is formed that is a figure-related logical product of said lattice pattern and said second rectangular pattern, and a pattern subshape in said logical product pattern, which is in contact with a side of said second rectangular pattern and is smaller in size than a pattern subshape in the central portion, is connected to its adjacent pattern subshape into one body.

39. The rectangle-to-lattice conversion method according to claim 37, further comprising the step of:
(d) substantially performing a boundary processing in which a pattern subshape, which is included in said lattice pattern and has a part protruding outside said second rectangular pattern, is deleted, and after the deletion, a pattern subshape, which is included in said second rectangular pattern and has a side B facing a side A of said second rectangular pattern wherein a distance between said side B and said side A is longer than said space width S, is expanded such that said side B reaches said side A moving in parallel to form a subshape.

40. The rectangle-to-lattice data conversion method according to one of claim 37, further comprising the step of:
(e) of dividing said lattice pattern into first and second complementary patterns which are complementary to each other in order to form said first pattern using two masks complementary to each other.

41. The rectangle-to-lattice data conversion method according to claim 40, wherein in said step (e), said lattice pattern is divided into plural regions of plural rows and plural columns and said first and second complementary patterns are determined such that adjacent division regions belongs to said first and second complementary patterns, respectively.

42. A rectangle-to-lattice data conversion method for a charged particle beam exposure mask pattern that, when a rectangular pattern or a rectangle of part thereof is actually or imaginarily formed as a first rectangular pattern on a sensitive substrate by charged particle beam exposure, converts a second rectangular pattern on a mask corresponding to said first rectangular pattern to a first lattice pattern in order to reduce an exposure dose, comprising the steps of:
(a) dividing said second rectangular pattern into plural rectangular regions;
(b) grouping said plural rectangular regions such that adjacent rectangular regions are included into first and second complementary patterns, respectively, complementary to each other in order to form said first lattice pattern using two masks complementary to each other;
(c) converting each of said plural rectangular regions to a second lattice pattern; and
(d) performing a boundary processing on each of said second lattice patterns such that at least one side of each peripheral subshape thereof is in contact with a side of a rectangular region corresponding to each of the second lattice patterns.

43. The rectangle-to-lattice data conversion method according to claim 42, wherein in said step (c), said second lattice pattern is a line and space pattern having lines parallel to a shorter side of said rectangular region.

44. The rectangle-to-lattice data conversion method according to claim 42, wherein in said step (d), a boundary processing is substantially performed in which a pattern is formed that is a figure-related logical product of said lattice pattern and a rectangular pattern corresponding to said second lattice pattern, and a pattern subshape in said logical product pattern, which is in contact with a side of said second rectangular pattern and is smaller in size than a pattern subshape in the central portion, is connected to its adjacent pattern subshape into one body.

45. The rectangle-to-lattice data conversion method according to claim 42, wherein in said step (d), a boundary processing is substantially performed in which pattern subshape, which is included in said second lattice pattern and has a part protruding outside a rectangular region corresponding to said second lattice pattern, is deleted and after the deletion, a pattern subshape, which is included in said rectangular region and has a side B facing a side A of said rectangular region wherein a distance between said side B and said side A is longer than a space width S between pattern subshapes in the central portion of said second lattice pattern, is expanded such that said side B reaches said side A moving in parallel to form a subshape.

46. The rectangle-to-lattice data conversion method according to claim 45, wherein in said step (d), a boundary processing is substantially performed in which pattern subshape, which is included in said plural rectangular regions and has a side in coincidence with a boundary line on both sides of which rectangular regions are adjacent to each other, is moved in parallel outwardly beyond said boundary line so as to be an extended pattern subshape.

47. A charged particle beam exposure method, wherein a mask is fabricated using a rectangle-to-lattice data conversion method according to claim 46, and a sensitive substrate is irradiated with a charged particle beam through the mask.

* * * * *